(12) United States Patent
Luan et al.

(10) Patent No.: US 10,957,868 B2
(45) Date of Patent: Mar. 23, 2021

(54) ELECTRON INJECTION BASED VERTICAL LIGHT EMITTING TRANSISTORS AND METHODS OF MAKING

(71) Applicant: Atom H2O, LLC, Escondido, CA (US)

(72) Inventors: Xinning Luan, Escondido, CA (US); Jiang Liu, Escondido, CA (US); Huaping Li, Los Angeles, CA (US)

(73) Assignee: Atom H2O, LLC, Escondido, CA (US)

( * ) Notice: Subject to any disclaimer, the term of this patent is extended or adjusted under 35 U.S.C. 154(b) by 16 days.

(21) Appl. No.: 15/780,949

(22) PCT Filed: Dec. 1, 2016

(86) PCT No.: PCT/US2016/064449
§ 371 (c)(1),
(2) Date: Jun. 1, 2018

(87) PCT Pub. No.: WO2017/096058
PCT Pub. Date: Jun. 8, 2017

(65) Prior Publication Data
US 2018/0358568 A1    Dec. 13, 2018

Related U.S. Application Data

(60) Provisional application No. 62/351,381, filed on Jun. 17, 2016, provisional application No. 62/261,581, filed on Dec. 1, 2015.

(51) Int. Cl.
*H01L 29/08* (2006.01)
*H01L 31/0232* (2014.01)
(Continued)

(52) U.S. Cl.
CPC .............. *H01L 51/057* (2013.01); *G09F 9/30* (2013.01); *G09F 9/33* (2013.01); *H01L 25/167* (2013.01);
(Continued)

(58) Field of Classification Search
CPC ............ H01L 27/3244; H01L 51/0023; H01L 51/102; H01L 51/5225; H01L 51/5296;
(Continued)

(56) References Cited

U.S. PATENT DOCUMENTS 5,180,690 A    1/1993    Czubatyj et al.
6,682,863 B2    1/2004    Rivers et al.
(Continued)

FOREIGN PATENT DOCUMENTS

CN    108885967 A    11/2018
CN    110892532 A    3/2020
(Continued)

OTHER PUBLICATIONS

Dlott, "Thinking big (and small) about energetic materials", Materials Science and Technology, Apr. 2006, vol. 22, No. 4, pp. 463-473, doi:10.1179/174328406X83987.
(Continued)

*Primary Examiner* — Alonzo Chambliss
(74) *Attorney, Agent, or Firm* — KPPB LLP

(57) ABSTRACT

Gated organic light-emitting diodes or vertical light emitting transistors are disclosed based on the modulation of charge carrier injection from electrodes into light-emitting materials by applying external gate potential. This gate modulation were achieved in two disclosed methods: 1) a porous electrode allowing mobile ions to stabilize electrochemically doped semiconducting materials that can form ohmic contact with electrodes: 2) an electrode with gate-tunable work function such as Al:LiF composite electrodes.

25 Claims, 47 Drawing Sheets

(51) Int. Cl.

| | |
|---|---|
| H01L 51/40 | (2006.01) |
| H01L 51/05 | (2006.01) |
| H01L 51/52 | (2006.01) |
| G09F 9/33 | (2006.01) |
| G09F 9/30 | (2006.01) |
| H01L 29/732 | (2006.01) |
| H01L 29/78 | (2006.01) |
| H01L 25/16 | (2006.01) |
| H01L 27/32 | (2006.01) |
| H01L 51/00 | (2006.01) |
| H01L 51/10 | (2006.01) |

(52) U.S. Cl.
CPC ........ *H01L 27/3244* (2013.01); *H01L 29/732* (2013.01); *H01L 29/7827* (2013.01); *H01L 51/0023* (2013.01); *H01L 51/055* (2013.01); *H01L 51/102* (2013.01); *H01L 51/5225* (2013.01); *H01L 51/5296* (2013.01)

(58) Field of Classification Search
CPC ............... H01L 27/7371; H01L 25/167; H01L 29/7827; G09F 9/30; G09F 9/33
See application file for complete search history.

(56) References Cited

U.S. PATENT DOCUMENTS

| | | |
|---|---|---|
| 6,919,681 B2 | 7/2005 | Cok et al. |
| 7,064,372 B2 | 6/2006 | Duan et al. |
| 7,253,041 B2 | 8/2007 | Gan et al. |
| 7,537,975 B2 | 5/2009 | Moon et al. |
| 7,907,226 B2 | 3/2011 | Yang et al. |
| 7,932,511 B2 | 4/2011 | Duan et al. |
| 8,232,561 B2 | 7/2012 | Rinzler et al. |
| 8,246,928 B1 | 8/2012 | Rao et al. |
| 8,512,668 B2 | 8/2013 | Tanaka et al. |
| 8,715,607 B2 | 5/2014 | Liu et al. |
| 8,940,562 B1 | 1/2015 | Li |
| 9,070,775 B2 | 6/2015 | Chaji et al. |
| 9,445,421 B2 | 9/2016 | Levine et al. |
| 9,455,421 B2 * | 9/2016 | Li ........................ H01L 51/5296 |
| 9,487,002 B2 | 11/2016 | Rogers et al. |
| 9,748,439 B2 | 8/2017 | Li et al. |
| 10,418,595 B2 | 9/2019 | Li |
| 10,497,888 B2 * | 12/2019 | Kleemann ............. H01L 51/057 |
| 10,541,374 B2 | 1/2020 | Li |
| 10,665,796 B2 | 5/2020 | Li |
| 2004/0252113 A1 | 12/2004 | Vicentini et al. |
| 2005/0221016 A1 | 10/2005 | Glatkowski et al. |
| 2006/0063460 A1 | 3/2006 | Seo |
| 2006/0081844 A1 | 4/2006 | Hirosue et al. |
| 2006/0110862 A1 | 5/2006 | Gan et al. |
| 2006/0145144 A1 | 7/2006 | Lee et al. |
| 2006/0261433 A1 | 11/2006 | Manohara et al. |
| 2007/0026646 A1 | 2/2007 | Chae |
| 2007/0246784 A1 | 10/2007 | Kang et al. |
| 2008/0008643 A1 | 1/2008 | Landi et al. |
| 2008/0023066 A1 | 1/2008 | Hecht et al. |
| 2008/0143906 A1 | 6/2008 | Allemand et al. |
| 2008/0217588 A1 | 9/2008 | Arnold et al. |
| 2008/0286447 A1 | 11/2008 | Alden et al. |
| 2009/0008634 A1 | 1/2009 | Tessler et al. |
| 2009/0050879 A1 | 2/2009 | Yamaga et al. |
| 2010/0103089 A1 | 4/2010 | Yoshida et al. |
| 2010/0145062 A1 | 6/2010 | Li et al. |
| 2011/0012125 A1 | 1/2011 | Nicholas et al. |
| 2011/0036403 A1 | 2/2011 | Yoon et al. |
| 2011/0223095 A1 | 9/2011 | Harvey et al. |
| 2011/0233512 A1 * | 9/2011 | Yang ..................... B82Y 10/00 257/9 |
| 2011/0285951 A1 | 11/2011 | Yoon et al. |
| 2012/0062109 A1 | 3/2012 | Berry et al. |
| 2012/0104328 A1 | 5/2012 | Park et al. |
| 2012/0256175 A1 | 10/2012 | Rinzler et al. |
| 2012/0280213 A1 | 11/2012 | Gau et al. |
| 2013/0069043 A1 | 3/2013 | Friend et al. |
| 2013/0105770 A1 | 5/2013 | Pschenitzka |
| 2013/0108793 A1 | 5/2013 | Sivarajan et al. |
| 2014/0209997 A1 | 7/2014 | Qian et al. |
| 2014/0217409 A1 | 8/2014 | Chaji et al. |
| 2014/0273379 A1 | 9/2014 | Tsai et al. |
| 2015/0102288 A1 | 4/2015 | Hersam et al. |
| 2015/0155430 A1 | 6/2015 | Li |
| 2015/0202662 A1 | 7/2015 | Li |
| 2015/0279919 A1 | 10/2015 | Zhou et al. |
| 2015/0340631 A1 | 11/2015 | Rinzler et al. |
| 2016/0043152 A1 | 2/2016 | Tian et al. |
| 2016/0126293 A1 | 5/2016 | Li et al. |
| 2016/0137854 A1 | 5/2016 | Heintz et al. |
| 2016/0190170 A1 * | 6/2016 | Yamazaki ......... G02F 1/133305 438/23 |
| 2016/0280547 A1 | 9/2016 | Liu et al. |
| 2016/0359144 A1 * | 12/2016 | Li ...................... H01L 51/5296 |
| 2016/0380217 A1 | 12/2016 | Afzali-Ardakani et al. |
| 2017/0194581 A1 | 7/2017 | Li |
| 2017/0213963 A1 | 7/2017 | Cain et al. |
| 2018/0148337 A1 | 5/2018 | Walsh et al. |
| 2018/0323387 A1 | 11/2018 | Li |
| 2018/0323388 A1 | 11/2018 | Li |
| 2018/0323406 A1 | 11/2018 | Li |
| 2019/0081259 A1 | 3/2019 | Mao |
| 2020/0067025 A1 | 2/2020 | Li |
| 2020/0127201 A1 | 4/2020 | Li |
| 2020/0203644 A1 | 6/2020 | Li |

FOREIGN PATENT DOCUMENTS

| | | |
|---|---|---|
| CN | 111149232 A | 5/2020 |
| GB | 2562921 A | 11/2018 |
| KR | 10-2020-0005583 A | 1/2020 |
| KR | 10-2020-0024771 A | 3/2020 |
| TW | 201734155 A | 10/2017 |
| WO | 2014208896 A1 | 12/2014 |
| WO | 2015077629 A1 | 5/2015 |
| WO | 2017096058 A1 | 6/2017 |
| WO | 2017120214 A1 | 7/2017 |
| WO | 2018204870 A1 | 11/2018 |
| WO | 2018208284 A1 | 11/2018 |

OTHER PUBLICATIONS

Drandova et al., "SiN capacitors and ESD", CS Mantech Conference, Apr. 24-27, 2006, pp. 83-86.

Dreizin, "Metal-based reactive nanomaterials", Progress in Energy and Combustion Science, Apr. 2009, vol. 35, pp. 141-167, doi:10.1016/j.pecs.2008.09.001.

Dresselhaus et al., "Raman spectroscopy on isolated single wall carbon nanotubes", Carbon, 2002, vol. 40, pp. 2043-2061.

Friend et al., "Electroluminescence in conjugated polymers", Nature, Jan. 14, 1999, vol. 397, pp. 121-128.

Gao et al., "Complementary Logic Gate Arrays Based on Carbon Nanotube Network Transistors", Small, 2013, vol. 9, No. 6, pp. 813-819.

Ghosh et al., "Advanced sorting of single-walled carbon nanotubes by nonlinear density-gradient ultracentrifugation", Nature Nanotechnology, Jun. 2010, vol. 5, pp. 443-450.

Gu et al., "Design of flat panel displays based on organic light emitting devices", IEEE Journal of Selected Optics in Quantum Electronics, Jan./Feb. 1998, vol. 4, pp. 83-99.

Gundlach et al., "Pentacene Organic Thin-Film Transistors—Molecular Ordering and Mobility", IEEE Electron Device Letters, Mar. 1997, vol. 18, No. 3, pp. 87-89.

Ha et al., "Highly Uniform and Stable n-Type Carbon Nanotube Transistors by Using Positively Charged Silicon Nitride Thin Films", Nano Letters, 2015, vol. 15, pp. 392-397, published Dec. 1, 2014.

Hennrich et al., "Length-Sorted, Large-Diameter, Polyfluorene-Wrapped Semiconducting Single-Walled Carbon Nanotubes for High-Density, Short-Channel Transistors", ACS Nano, Jan. 2015, vol. 10, No. 2, pp. 1888-1895, doi: 10.1021/acsnano.5b05572.

(56) References Cited

OTHER PUBLICATIONS

Ho et al., "Molecular-scale interface engineering for polymer light-emitting diodes", Nature, Mar. 30, 2000, vol. 404, No. 6777, pp. 481-484.
Hone et al., "Thermal properties of carbon nanotubes and nanotube-based materials", Applied Physics A, Mar. 2002, vol. 74, pp. 339-343.
Hoven et al., "Electron injection into organic semiconductor devices from high work function cathodes", Proceedings of the National Academy of Sciences of the United States of America, Sep. 2, 2008, vol. 105, No. 35, pp. 12730-12735.
Hoven et al., "Ion motion in conjugated polyelectrolyte electron transporting layers", Journal of the American Chemical Society, Oct. 2007, vol. 129, No. 36, pp. 10976-10977, doi: 10.1021/ja072612q.
Hsu et al., "Control of Efficiency, Brightness, and Recombination Zone in Light0Emitting Field Effect Transistors", Advanced Materials, Jan. 25, 2012, vol. 24, pp. 1171-1175, doi: 10.1002/adma.201103513.
Iechi et al., "Vertical type organic light emitting device using thin-film ZnO electrode", Synthetic Metals, 2005, vol. 154, pp. 149-152.
Isert et al., "The effect of encapsulated nanosized catalysts on the combustion of composite solid propellants", Combustion and Flame, 2015, Published Online Dec. 23, 2014, vol. 162, pp. 1821-1828.
Javey et al., "Ballistic carbon nanotube field-effect transistors", Nature, Aug. 7, 2003, vol. 424 , pp. 654-657.
Javey et al., "High-K dielectrics for advanced carbon-nanotube transistors and logic gates", Nature Materials, Dec. 2002, vol. 1, pp. 241-245, published online Nov. 17, 2002.
Javey et al., "Self-aligned ballistic molecular transistors and electrically parallel nanotube arrays", Nano Letters, May 24, 2004, vol. 4, No. 7, pp. 1319-1322.
Keplinger et al., "Stretchable, Transparent, Ionic Conductors", Science, Aug. 30, 2013, vol. 341, No. 6149, pp. 984-987, doi: 10.1126/science.1240228.
Kim et al., "Electrical contacts to carbon nanotubes down to 1 nm in diameter", Applied Physics Letters, 2005, vol. 87, pp. 173101-1-173101-3.
Kim et al., "Polymer gate dielectric surface viscoelasticity modulates pentacene transistor performance", Science, Oct. 5, 2007, vol. 318, pp. 76-80.
Kimura et al., "Low-temperature polysilicon thin-film transistor driving with integrated driver for high resolution light emitting polymer display", IEEE Transactions on Electron Devices, Dec. 1999, vol. 46, Issue 12, pp. 2282-2288.
Kudo, "Organic light emitting transistors", Current Applied Physics, 2005, First Published Jun. 7, 2004, vol. 5, pp. 337-340, doi: 10.1016/j.cap.2003.11.095, 2005, 337-340.
Li et al., "Electronically Pure Single-Chirality Semiconducting Single-Walled Carbon Nanotube for Large-Scale Electronic Devices", ACS Applied Materials & Interfaces. Aug. 5, 2016. vol. 8, No. 32, pp. 20527-20533.
Li et al., "Molecular Design, Device Function and Surface Potential of Zwitterionic Electron Injection Layers", Journal of the American Chemical Society, Mar. 17, 2009, vol. 131, No. 25, pp. 8903-8912, doi: 10.1021/ja9018836.
Li et al., "Polyfluorinated electrolyte for fully printed carbon nanotube electronics", Advanced Functional Materials, Aug. 3, 2016, vol. 26, No. 38, pp. 6914-6920, doi: 10.1002/adfm.201601605.
Li et al., "Silicon nitride gate dielectric for top-gated carbon nanotube field effect transistors", Journal of Vacuum Science & Technology B 22, Nov./Dec. 2004, pp. 3112-3114.
Li et al., "The Effect of Interface States on Single-Walled Carbon Nanotube Transistors", ECS Journal of Solid State Science and Technology, Aug. 5, 2016, vol. 5, pp. M93-M98, doi: 10.1149/2.0271609jss.

Liang et al., "Elastomeric polymer light-emitting devices and displays", Nature Photonics, Oct. 2013, Published Online Sep. 22, 2013, vol. 7, pp. 817-824,doi: 10.1038/NPHOTON.2013.242.
Lin et al., "A novel LTPS-TFT pixel circuit compensating for TFT threshold-voltage shift and OLED degradation for AMOLED", IEEE Electron Device Letters, Feb. 2007, vol. 28, No. 2, pp. 129-131.
Lin et al., "Ambipolar-to-Unipolar Conversion of Carbon Nanotube Transistors by Gate Structure Engineering", Nano Letters, Mar. 12, 2004, vol. 4, No. 5, pp. 947-950.
Lin et al., "The Impact of Scaling-Down Oxide Thickness on Poly-Si Thin-Film Transistors' I-V Characteristics", IEEE electron device letters, Apr. 1994, vol. 15, No. 4, pp. 138-139.
Liu et al., "Large-scale single-chirality separation of single-walled carbon nanotubes by simple gel chromatography", Nature Communications, May 10, 2011, vol. 2, No. 309, pp. 1-8.
Logdlund et al., "Theoretical-studies of the interaction between aluminum and poly(pphenylenevinylene) and derivatives", The Journal of Chemical Physics, Sep. 1, 1994, vol. 101, pp. 4357-4364, doi: 10.1063/1.467486.
Maehashi et al., "Electrical characterization of carbon nanotube field-effect transistors with SiN x passivation films deposited by catalytic chemical vapor deposition", Applied Physics Letters, 2008, vol. 92, pp. 183111-1-183111-3; doi:10.1063/1.2920206.
Matyba et al., "The dynamic organic p-n junction", Nature Materials, Aug. 2009, Published Online Jun. 21, 2009, vol. 8, No. 8, pp. 672-676, doi: 10.1038/NMAT2478.
McCarthy et al., "Low-Voltage, Low-Power, Organic Light-Emitting Transistors for Active Matrix Displays", Science, Apr. 29, 2011, vol. 332, Issue 6029, pp. 570-573, doi: 10.1126/science.1203052.
Meda et al., "Nano-aluminum as energetic material for rocket propellants", Materials Science and Engineering C, Sep. 2007, vol. 27, Issues 5-8, pp. 1393-1396, doi: doi:10.1016/j.msec.2006.09.030.
Meda et al., "Nano-composites for rocket solid propellants", Composites Science and Technology, Apr. 2005, vol. 65, Issue 5, pp. 769-773.
Muccini, "A bright future for organic field-effect transistors", Nature Materials, Aug. 2006, vol. 5, No. 8, pp. 605-613.
Nakamura et al., "Improvement of Metal-Insulator-Semiconductor-Type Organic Light-Emitting Transistors", Japanese Journal of Applied Physics, Mar. 21, 2008, vol. 47, No. 3, pp. 1889-1893, doi: 10.1143/JJAP.47.1889.
Noh et al., "Ultra-thin polymer gate dielectrics for top-gate polymer field-effect transistors", Organic Electronics, 2009, Published Online Nov. 12, 2008, vol. 10, No. 1, pp. 174-180, doi: 10.1016/j.orgel.2008.10.021.
Smits et al., "Response of Fe powder, purified and as-produced HiPco single-walled carbon nanotubes to flash exposure", Materials Science and Engineering, 2003, A358, pp. 384-389.
Definition of "form," Merriam Webster Online, Retrieved from the Internet on Feb. 20, 2016.
International Preliminary Report on Patentability for International Application PCT/US2014/066926, dated May 24, 2016, dated Jun. 6, 2016, 12 Pgs.
International Preliminary Report on Patentability for International Application PCT/US2017/012161, dated Jul. 10, 2018, dated Jul. 19, 2018, 11 Pgs.
International Search Report and Written Opinion for International Application No. PCT/US2016/064449, completed Mar. 17, 2017, dated Apr. 4, 2017, 17 Pgs.
International Search Report and Written Opinion for International Application No. PCT/US2017/012161, Search completed Feb. 24, 2017, dated May 5, 2017, 38 Pgs.
International Search Report and Written Opinion for International Application No. PCT/US2017/031619, Search completed Jul. 11, 2017, dated Aug. 14, 2017, 15 Pgs.
International Search Report and Written Opinion for International Application No. PCT/US2018/031230, Search completed Jul. 16, 2018, dated Aug. 1, 2018, 13 Pgs.

(56) References Cited

OTHER PUBLICATIONS

International Search Report and Written Opinion for International Application PCT/US2014/066926, Report Completed Feb. 2, 2015, dated Mar. 3, 2015, 14 pgs.
"Global Flat Panel Displays Market to Reach US$110 Billion by 2017", Global Industry Analysts, Inc., Mar. 15, 2012, 3 pgs.
"Large AMOLED gets a cost edge over LCD", Sector Report Display, Korea Investment & Securities Co., Ltd. Aug. 16, 2011, 32 pgs.
"LCD TV Growth Improving, As Plasma and CRT TV Disappear", NPD DisplaySearch, Apr. 16, 2014, 2 pgs.
"Oxide TFT Production Forecast to Overtake LTPS in 2016", NPD DisplaySearch, Sep. 10, 2013, 4 pgs.
"Spin coating", Wkipedia, Oct. 23, 2015; Retrieved on Jul. 11, 2017, 2 pgs.
Almudever et al., "Variability and reliability of CNFET technology: impact of manufacturing imperfections", Microelectronics Reliability, Feb. 1, 2015, vol. 55, No. 2, pp. 358-366.
Aradhya et al., "Electrothermal Bonding of Carbon Nanotubes to Glass", Journal of the Electrochemical Society, Jul. 22, 2008, vol. 155, No. 9, pp. K161-K165.
Armstrong et al., "Enhanced Propellant Combustion with Nanoparticles", Nano Letters, Jan. 9, 2003, vol. 3, No. 2, pp. 253-255, doi: 10.1021/nl025905k.
Arnold et al., "Sorting carbon nanotubes by electric structure using density differentiation", Nature Nanotechnology, Oct. 2006, vol. 3, pp. 60-65.
Bachilo et al., "Structure-assigned optical spectra of single-walled carbon nanotubes", Science, Dec. 20, 2002, vol. 298, pp. 2361-2366, doi: 10.1126/science.1078727.
Ben-Sasson et al., "Patterned electrode vertical field effect transistor fabricated using block copolymer nanotemplates", Applied Physics Letters, Nov. 2009, vol. 95, pp. 213301-1-213301-3.
Bhat et al., "Electroluminescence in ion-gel gated conjugated polymer field-effect transistors", Chemistry of Materials, Oct. 7, 2012, vol. 24, pp. 4060-4067, doi: 10.1021/cm301610w.
Bonhommeau et al., "Raman spectroscopic investigation of individual single-walled carbon nanotubes helically wrapped by ionic, semiconducting polymers", Journal of Physical Chemistry C, Jun. 20, 2013, vol. 117, pp. 14840-14849, doi: 10.1021/jp4037606.
Braga et al., "High-Transconductance Organic Thin-Film Electrochemical Transistors for Driving Low-Voltage Red-Green-Blue Active Matrix Organic Light-Emitting Devices", Advanced Functional Materials, Feb. 14, 2012, vol. 22, pp. 1623-1631, doi: 10.1002/adfm.201102075.
Briseno et al., "Patterning Organic Single-Crystal Transistor Arrays", Nature, Dec. 14, 2006, vol. 444, pp. 913-917.
Bronikowski et al., "Gas-phase production of carbon single-walled nanotubes from carbon monoxide via the HiPco process: a parametric study", J Vac. Sci. Technol. A., May 2, 2001, vol. 19, pp. 1800-1805.
Brousseau et al., "Nanometric Aluminum in Explosives", Propellants, Explosives, Pyrotechnics, Feb. 27, 2002, vol. 27, pp. 300-306.
Cao et al., "Improved quantum efficiency for electroluminescence in semiconducting polymers", Nature, Feb. 4, 1999, vol. 397, pp. 414-417.
Cao et al., "Medium-scale carbon nanotube thin-film integrated circuits on flexible plastic substrate", Nature, Jul. 24, 2008, vol. 454, pp. 495-500.
Capelli et al., "Organic light-emitting transistors with an efficiency that outperforms the equivalent light-emitting diodes", Nature Materials, Jun. 2010, vol. 9, pp. 496-503, published online May 2, 2010.
Chaban et al., "Buckybomb: Reactive Molecular Dynamics Simulation", Journal of Physics Chemistry Letters, Feb. 24, 2015, vol. 6, pp. 913-917, DOI: 10.1021/ acs.jpclett.5b00120.
Chang et al., "Improved Electrical Performance of MILC Poly-Si TFTs Using CF4 Plasma by Etching Surface of Channel", IEEE Electron Device Letters, Feb. 2009, vol. 30, No. 2, pp. 130-132.
Cherenack et al., "Amorphous-silicon thin-film transistors fabricated at 300°C on a free-standing foil substrate of clear plastic", IEEE Electron Device Letters, Nov. 2007, vol. 28, No. 11, pp. 1004-1006.
Chiang et al., "Purification and Characterization of Single-Wall Carbon Nanotubes (SWNTs) Obtained from the Gas-Phase Decomposition of CO (HiPco Process)", J. Phys. Chem. B, Aug. 10, 2001, vol. 105, pp. 8297-8301, doi:10.1021/jp0114891.
Cho et al., "Printable ion-gel gate dielectrics for low-voltage polymer thin-film transistors on plastic", Nature Materials, Nov. 2008, Published Online Oct. 19, 2008, vol. 7, pp. 900-906, doi: 10.1038/nmat2291.
Chortos et al., "Investigating Limiting Factors in Stretchable All-Carbon Transistors for Reliable Stretchable Electronics", ACS Nano, Jul. 26, 2017, vol. 11, pp. 7925-7937, doi: 10.1021/acsnano.7b02458.
Chortos et al., "Mechanically Durable and Highly Stretchable Transistors Employing Carbon Nanotube Semiconductor and Electrodes", Advanced Materials, 2016, Published Online Jul. 14, 2015, vol. 28, pp. 4441-4448, doi: 10.1002/adma.201501828.
Dai et al., "Solution-processed, high-performance light-emitting diodes based on quantum dots", Nature, Nov. 6, 2014, vol. 515, 96-99.
De Volder et al., "Carbon nanotubes: present and future commercial applications", Science, Feb. 1, 2013, vol. 339, pp. 535-539.
Nomura et al., "Room-temperature fabrication of transparent flexible thin-film transistors using amorphous oxide semiconductors", Nature, Nov. 25, 2004, vol. 432, pp. 488-492.
O'Connell et al., "Band gap fluorescence from individual single-walled carbon nanotubes", Science, Jul. 26, 2002, vol. 297, pp. 593-596.
Oh et al., "Vertical Type Organic Transistor Using C60 and its Application for OLET", Molecular Crystals and Liquid Crystals, Dec. 21, 2006, vol. 458, No. 1, pp. 247-254, doi: 10.1080/15421400600932439.
Panzer et al., "Low-voltage operation of a pentacene field-effect transistor with a polymer electrolyte gate dielectric", Applied Physics Letters, Feb. 28, 2005, vol. 86, pp. 103503-1-103503-3.
Park et al., "Enhanced luminescence in top-gate-type organic light-emitting transistors", Applied Physics Letters, Aug. 16, 2004, vol. 85, No. 7, pp. 1280-1282.
Park et al., "Flexible full color organic light emitting diode display on polyimide plastic substrate driven by amorphous indium gallium zinc oxide thin-film transistors", Applied Physics Letters, Jul. 6, 2009, vol. 95, No. 1, pp. 013503-1-013503-3, doi: 10.1063/1.3159832.
Park et al., "High-resolution electrohydrodynamic jet printing", Nature Materials, Oct. 2007, vol. 6, pp. 782-789, doi: 10.1038/nmat1974, published online Aug. 5, 2007.
Pei et al., "Polymer Light-Emitting Electrochemical Cells", Science, Aug. 25, 1995, vol. 269, No. 5227, pp. 1086-1088.
Perebeinos et al., "Schottky-to-Ohmic Crossover in Carbon Nanotube Transistor Contacts", Physical Review Letters, week ending Dec. 4, 2013, vol. 111, pp. 236802-1-236802-5, plus supplemental material.
Pivkina et al., "Nanomaterials for Heterogeneous Combustion", Propellants, Explosives, Pyrotechnics, Feb. 26, 2004, vol. 29, No. 1, pp. 39-48; DOI: 10.1002/prep.200400025.
Powell, "The Physics of Amorphous-Silicon Thin-Film Transistors", IEEE Transactions on Electron Devices, Dec. 1989, vol. 36, No. 12, pp. 2753-2763.
Rossi, "Two Decades of Research on Nano-Energetic Materials", Propellants Explos. Pyrotech., Jun. 11, 2014, vol. 39, pp. 323-327. DOI: 10.1002/prep.201480151.
Rouhi et al., "Fundamental limits on the mobility of nanotube-based semiconducting inks", Advanced Materials, 2011, Published Online Oct. 26, 2010, vol. 23, pp. 94-99, doi: 10.1002/adma.201003281.
Rouhi et al., "High performance semiconducting nanotube inks: progress and prospects", ACS Nano, Oct. 4, 2011, vol. 5, No. 11, 8471-8487, doi: 10.1021/nn201828y.
Rutherglen et al., "Nanotube electronics for radiofrequency applications", Nature Nanotechnology, Dec. 2009, vol. 4, pp. 811-819, published online Nov. 29, 2009.

(56) References Cited

OTHER PUBLICATIONS

Sabourin et al., "Functionalized Graphene Sheet Colloids for Enhanced Fuel/ Propellant Combustion", ACS Nano, Nov. 19, 2009, vol. 3, No. 12, pp. 3945-3954, doi: 10.1021/nn901006w.

Schoppler et al., "Molar extinction coefficient of single-wall carbon nanotubes", Journal of Physical Chemistry C, Jun. 22, 2011, vol. 115, pp. 14682-14686, doi: 10.1021/jp205289h.

Seo et al., "Improved High-Efficiency Organic Solar Cells via Incorporation of a Conjugated Polyelectrolyte Interlayer", Journal of the American Chemical Society, May 10, 2011, vol. 133, pp. 8416-8419, doi: /10.1021/ja2037673.

Seo et al., "Improved Injection in n-Type Organic Transistors with Conjugated Polyelectrolytes", Journal of the American Chemical Society, Oct. 4, 2009, vol. 131, pp. 18220-18221.

Seo et al., "Solution-Processed Organic Light-Emitting Transistors Incorporating Conjugated Polyelectrolytes", Advanced Functional Materials, Jul. 18, 2011, vol. 21, pp. 3667-3672, doi: 10.1002/adfm.201100682.

Shao et al., "Long-lifetime polymer light-emitting electrochemical cells", Advanced Materials, 2007, vol. 19, pp. 365-370.

Shulaker et al., "Carbon nanotube computer", Nature, Sep. 26, 2013, vol. 501, pp. 526-530, doi: 10.1038/nature12502.

Sirringhaus et al., "Integrated Optoelectronic Devices Based on Conjugated Polymers", Science, Jun. 12, 1998, vol. 280, No. 5370, pp. 1741-1744, doi: 10.1126/science.280.5370.1741.

Slinker et al., "Direct measurement of the electric-field distribution in a light-emitting electrochemical cell", Nature Materials, Nov. 2007, Published Online Sep. 30, 2007, vol. 6, No. 11, pp. 894-899, doi: 10.1038/nmat2021.

Swensen et al., "Light emission from an ambipolar semiconducting polymer field-effect transistor", Applied Physics Letters, Dec. 15, 2005, vol. 87, pp. 253511-1-253511-3.

Sze et al., "Physics of Semiconductor Devices", Third Edition, Wiley, Toronto, 1985, 763 pgs. (presented in five parts).

Takahashi et al., "Carbon nanotube active-matrix backplanes for conformal electronics and sensors", Nano Letters, Nov. 3, 2011, vol. 11, pp. 5408-5413, doi: 10.1021/nl203117h.

Tang et al., "Organic electroluminescent diodes", Applied Physics Letters, Sep. 21, 1987, vol. 51, No. 12, pp. 913-915, doi: 10.1063/1.98799.

Tans et al., "Room-temperature transistor based on a single carbon nanotube", Nature, May 7, 1998, vol. 393, pp. 49-52.

Wang et al., "Wafer-scale fabrication of separated carbon nanotube thin-film transistors for display applications", Nano Letters, Sep. 30, 2009, vol. 9, No. 12, pp. 4285-4291, doi: 10.1021/nl902522f.

Wu et al., "Top-down patterning and self-assembly for regular arrays of semiconducting single-walled carbon nanotubes", Advanced Materials, Jul. 22, 2014, vol. 26, pp. 6151-6156, doi: 10.1002/adma.201401108.

Xia et al., "Printed Sub-2 V Gel-Electrolyte-Gated Polymer Transistors and Circuits", Advanced Functional Materials, Jan. 11, 2010, vol. 20, pp. 587-594, doi: 10.1002/adfm.200901845.

Xu et al., "Vertical organic light emitting transistor", Applied Physics Letters, Aug. 30, 2007, vol. 91, 092991-1-092991-3, doi: 10.1063/1.2778751.

Yamauchi et al., "Fabrication of Vertical Organic Light-Emitting Transistor Using ZnO Thin Film", Japanese Journal of Applied Physics, Apr. 24, 2007, vol. 46, No. 4B, pp. 2678-2682, doi: 10.1143/JJAP.46.2678.

Yan et al., "A high-mobility electron-transporting polymer for printed transistors", Nature, Jan. 21, 2009, vol. 457, doi: 10.1038/nature07727, 10 pgs.

Yang et al., "Control of Cationic Conjugated Polymer Performance in Light Emitting Diodes by Choice of Counterion", Journal of the American Chemical Society, May 27, 2006, vol. 128, pp. 14422-14423, doi: 10.1021/ja063723c.

Young, "When Can I Get My AMOLED TV", Information Display, 2010, vol. 10, pp. 24-29.

Zaumseil et al., "Spatial control of the recombination zone in an ambipolar light-emitting organic transistor", Nature materials, Jan. 2006, vol. 5, pp. 69-74.

Zhang et al., "Self-Enhanced Catalytic Activities of Functionalized Graphene Sheets in the Combustion of Nitromethane: Molecular Dynamic Simulations by Molecular Reactive Force Field", ACS Applied Materials & Interfaces, Jul. 23, 2014, vol. 6, pp. 12235-12244. doi: 10.1021/am501562m.

Zou et al., "Carbon nanotube driver circuit for 6x6 organic light emitting diode display", Scientific Reports, Jun. 29, 2015, vol. 5, No. 11755, pp. 1-9.

International Preliminary Report on Patentability for International Application PCT/US2017/031619, Report dated Nov. 12, 2019, dated Nov. 21, 2019, 08 Pgs.

International Preliminary Report on Patentability for International Application PCT/US2018/031230, Report dated Nov. 5, 2019, dated Nov. 14, 2019, 08 Pgs.

* cited by examiner

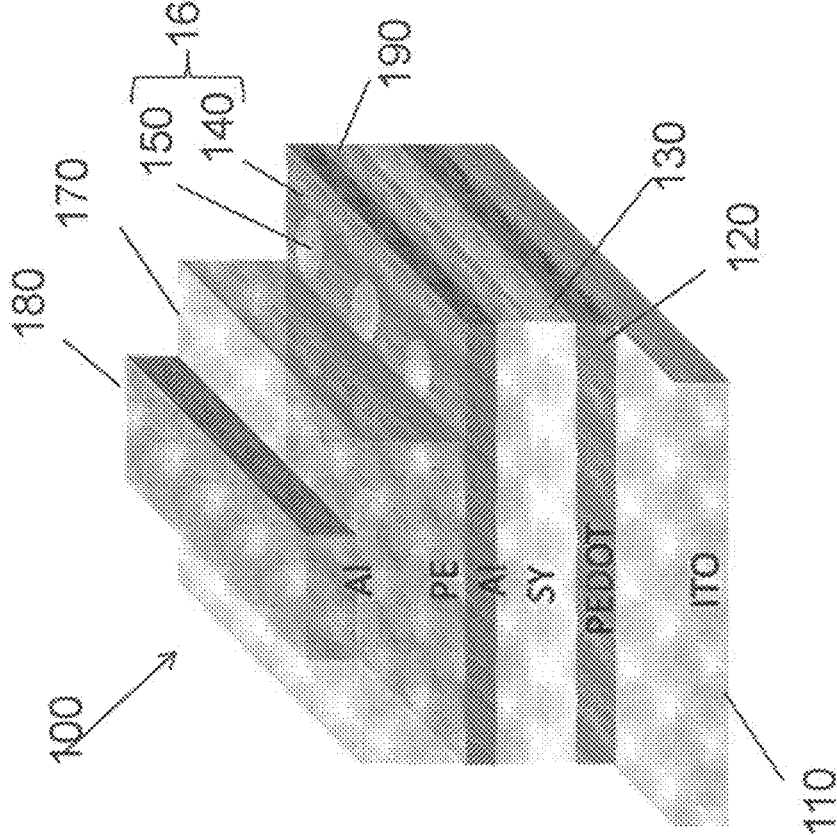
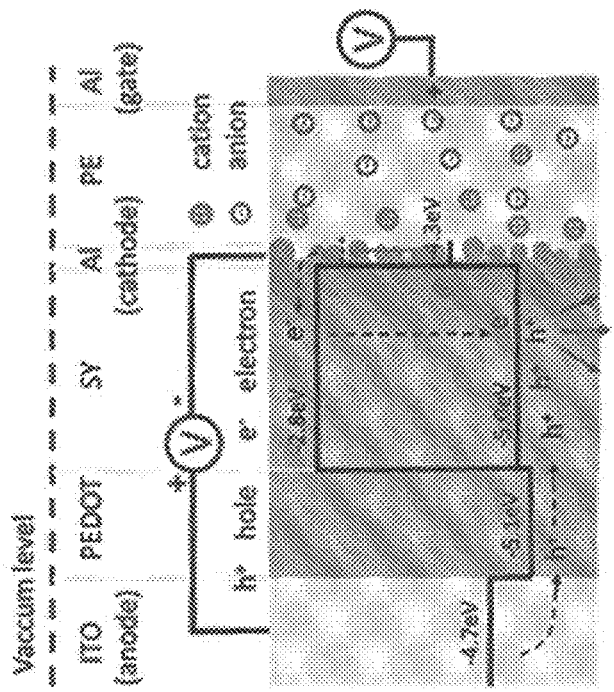
Fig. 1A
Fig. 1B

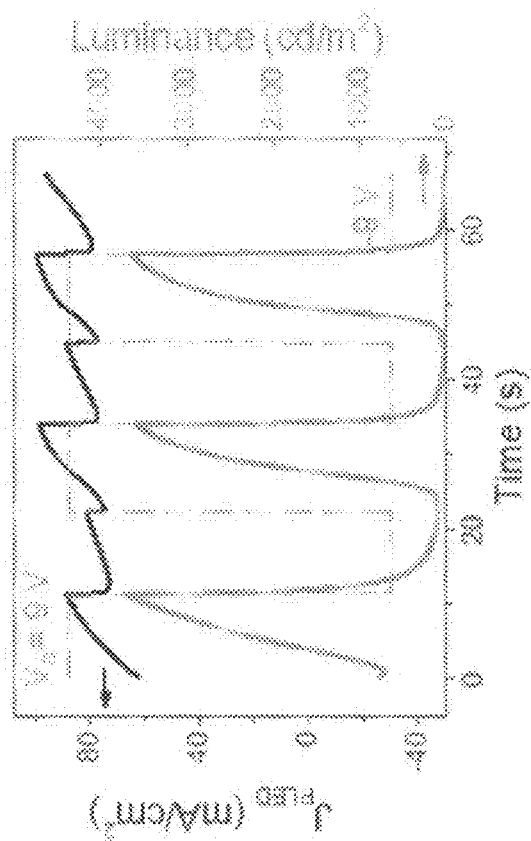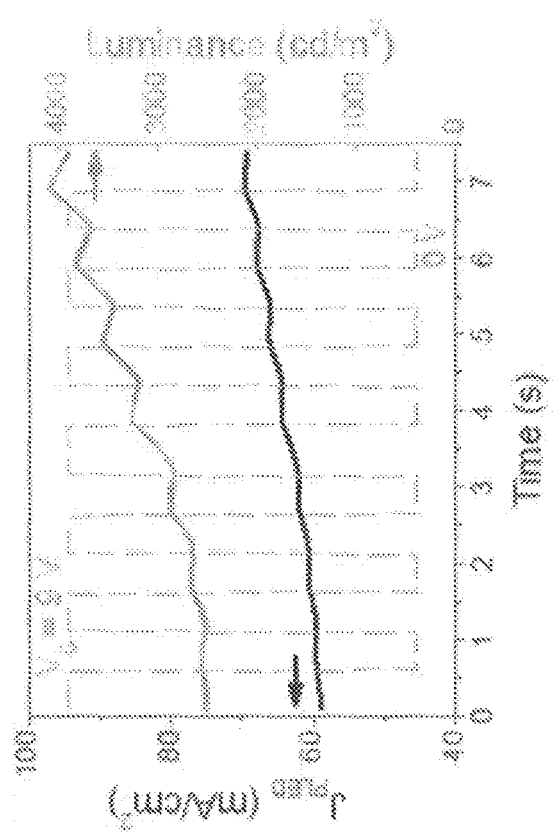
FIG. 5A
FIG. 5B

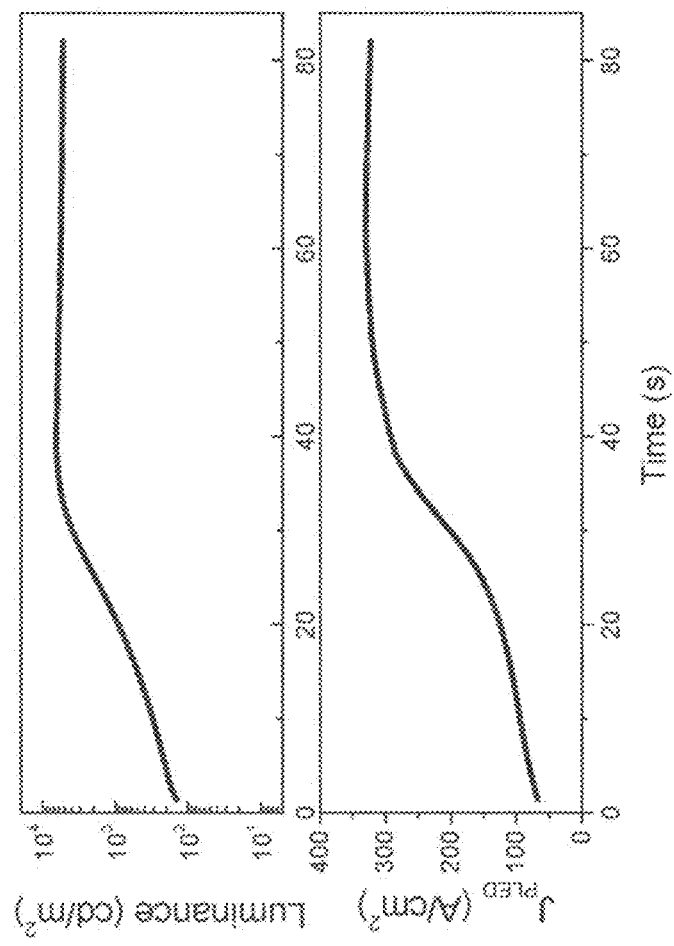

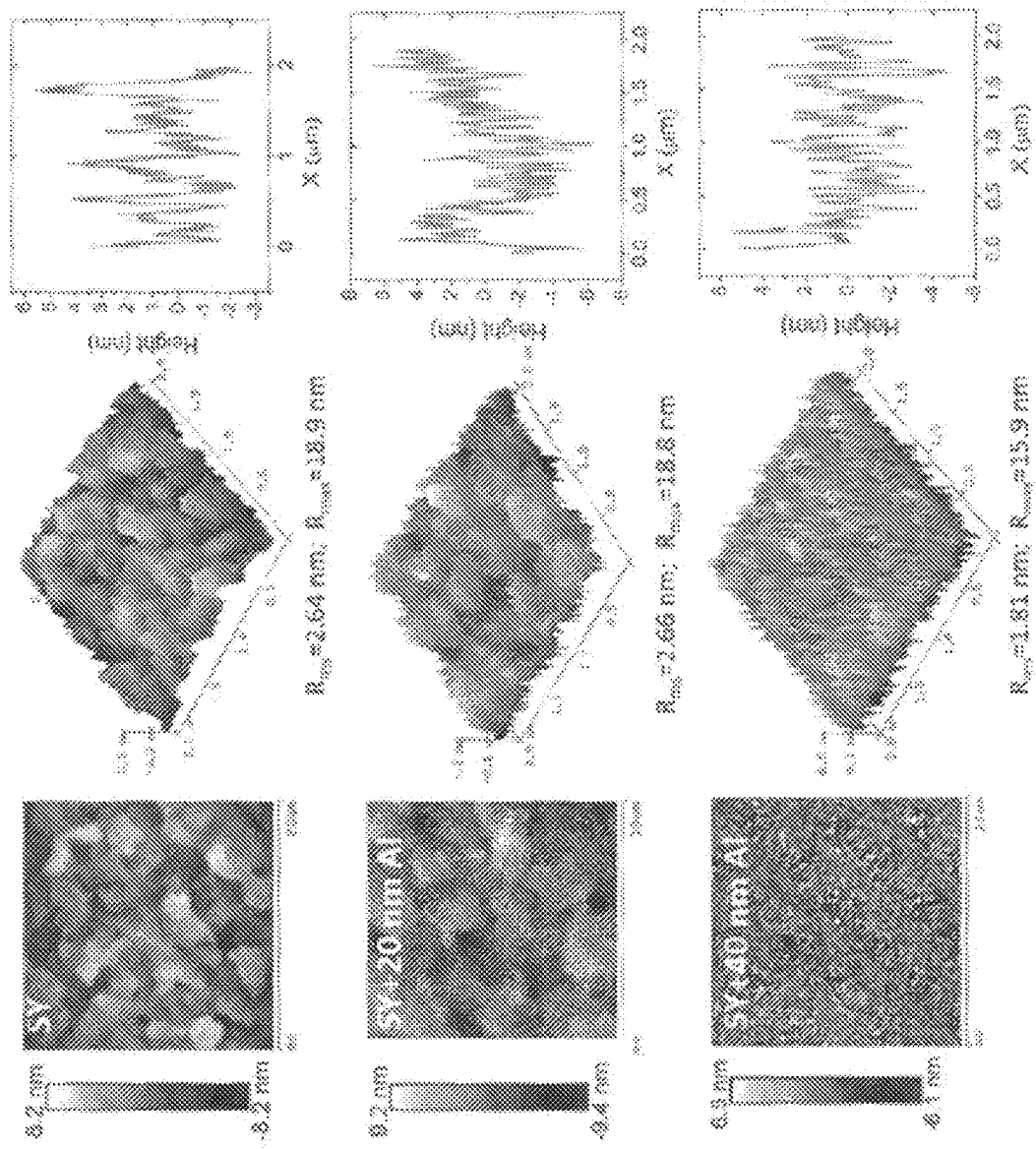

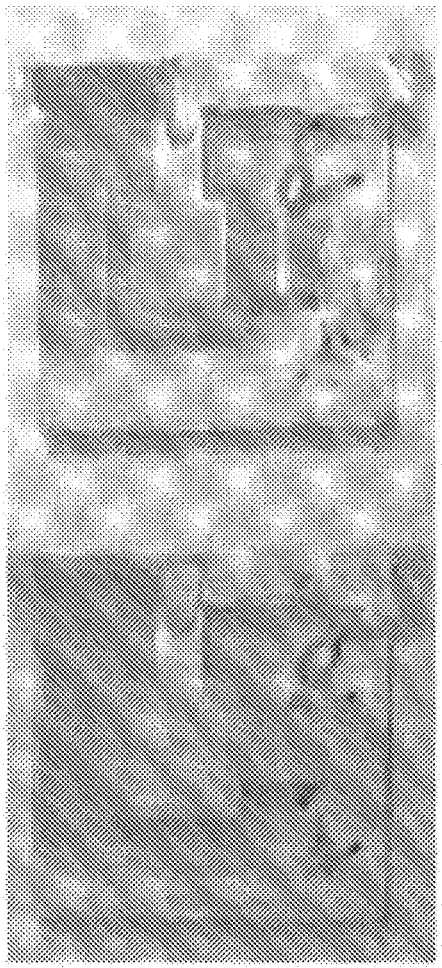
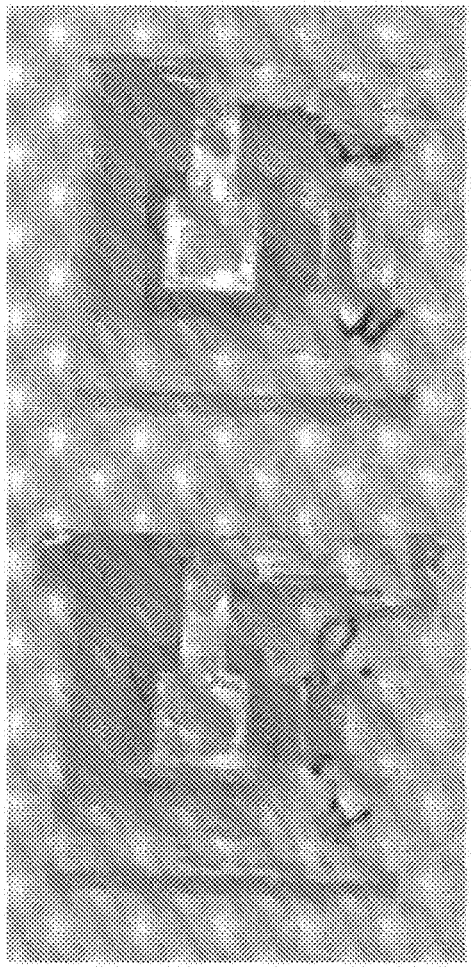
Fig. 9A
Fig. 9B

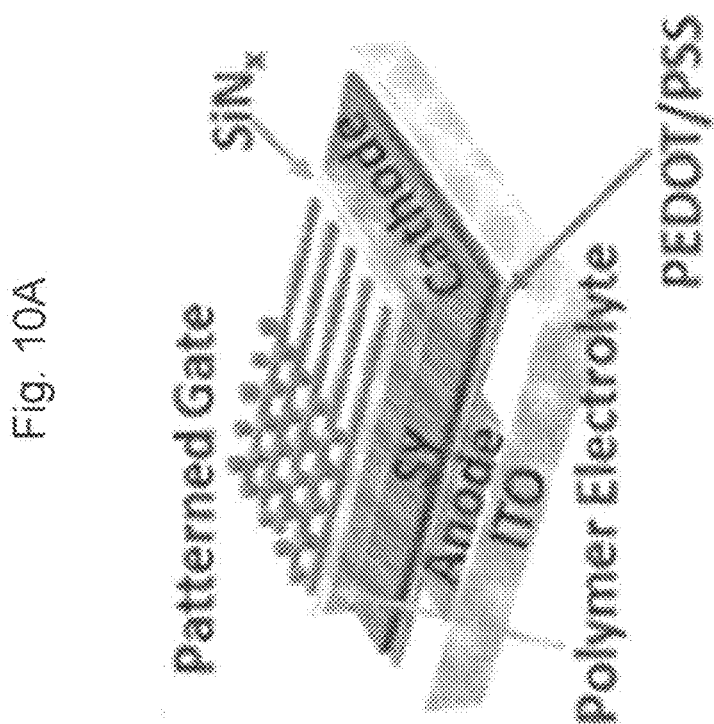

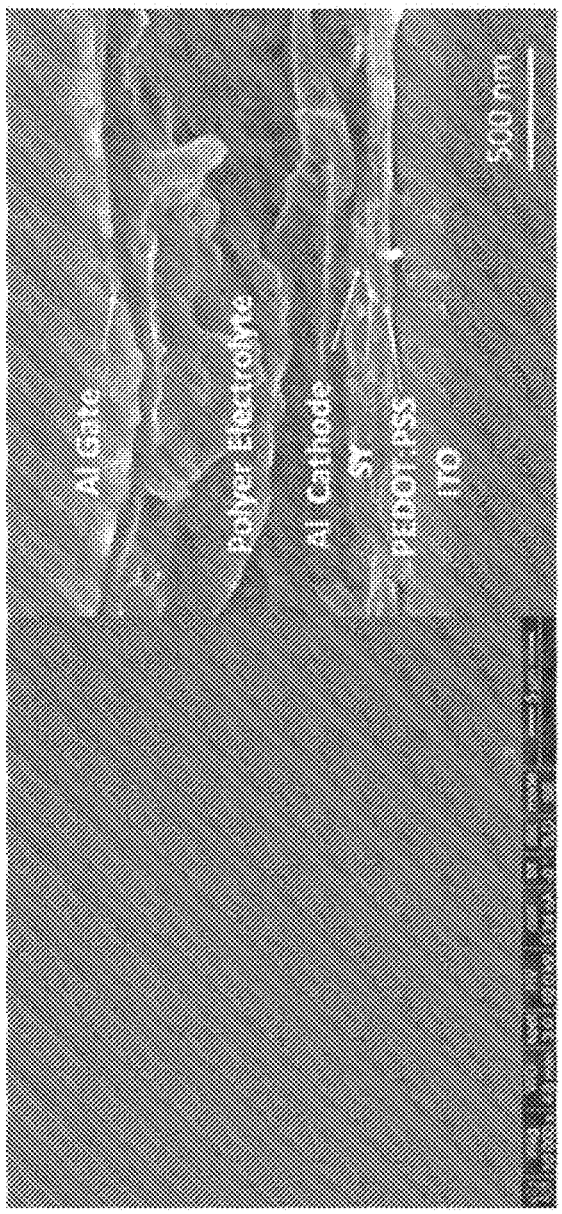

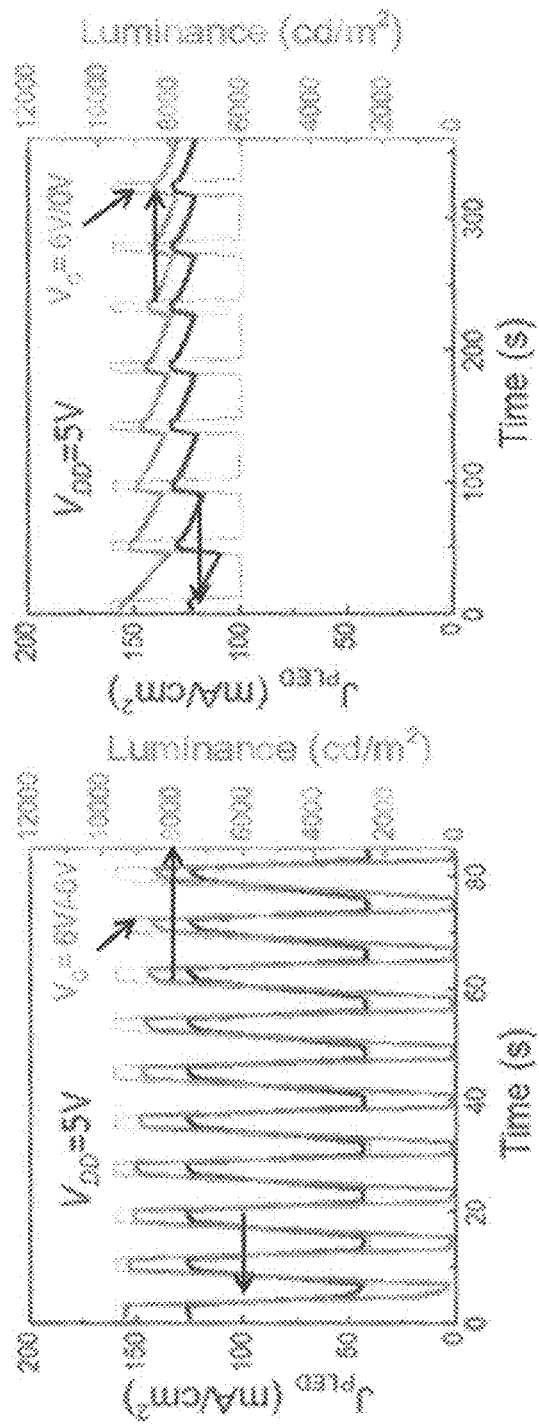

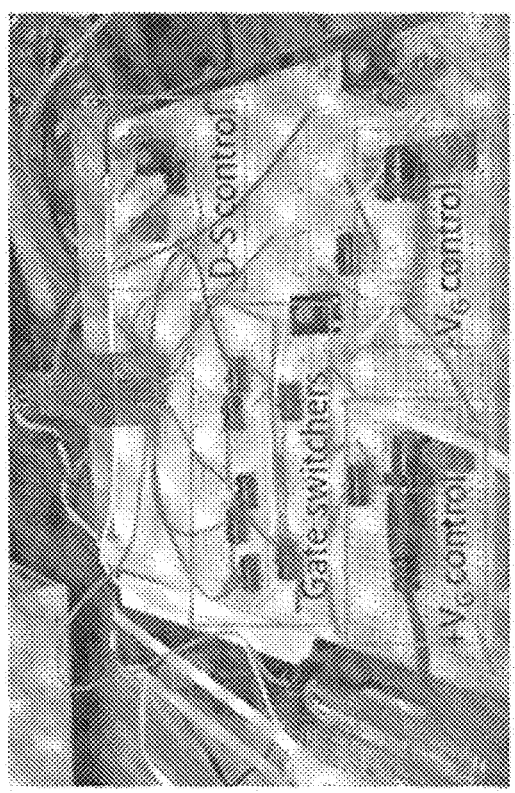
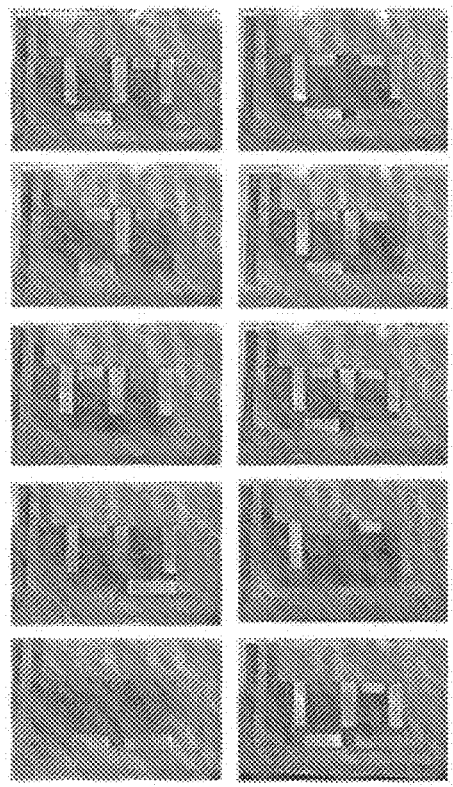
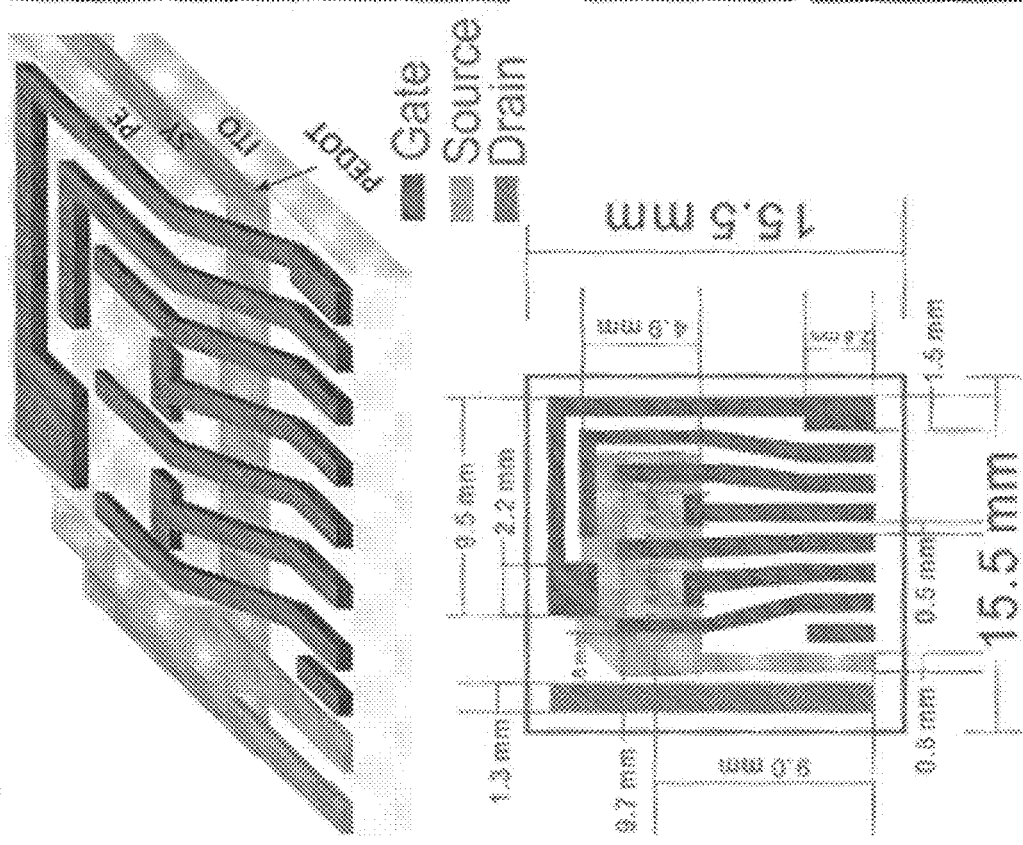
Fig. 20A
Fig. 20B
Fig. 20C
Fig. 20D

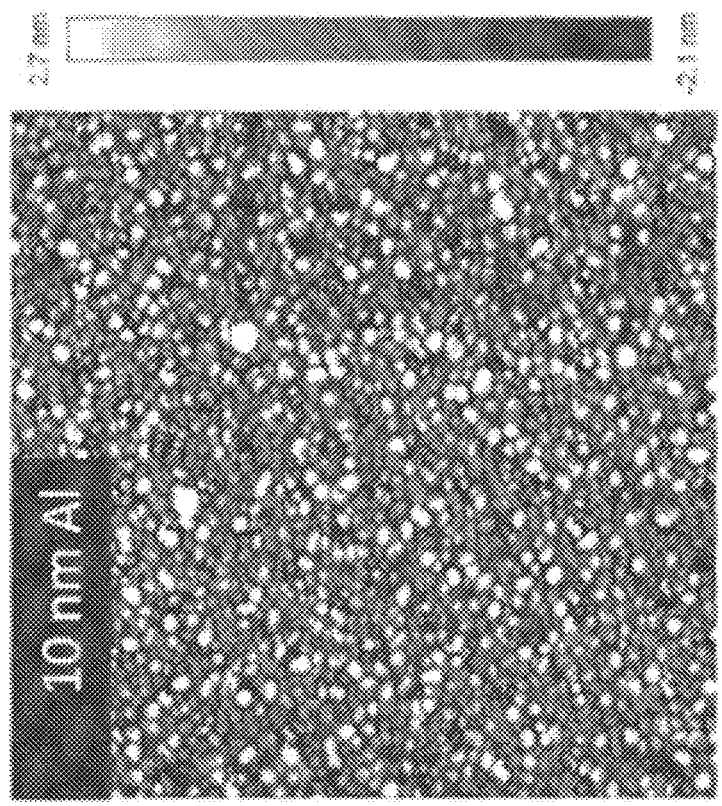

ELECTRON INJECTION BASED VERTICAL LIGHT EMITTING TRANSISTORS AND METHODS OF MAKING

RELATED APPLICATIONS

This application is a U.S. national stage application of PCT Application No. PCT/US2016/064449, filed Dec. 1, 2016, which claims the benefit of priority under 35 119(e) to U.S. Provisional Application No. 62/261,581, filed Dec. 1, 2015, and U.S. Provisional Application No. 62/351,381, filed Jun. 17, 2016, the disclosures of which are herein incorporated by reference in their entireties.

FIELD OF THE INVENTION

The subject matter disclosed in this application generally relates to devices, structures, materials, and methods for vertical light emitting transistors and active matrix displays.

BACKGROUND

Organic electronics such as organic light-emitting diodes (OLEDs), organic solar cells, and organic field effect transistors have recently become attractive due to their advantages in light-weight, flexibility, low-cost production and solution process feasibility. Developments in materials, device architectures, and device processing have led to the integration of OLEDs into lighting and display consumer markets. However, despite these developments, OLEDs still suffer from inefficient system architectures and fabrication challenges.

For example, prior art methods for operating OLEDs use one or more external transistors to control the current density input of the OLED; then the current density input can directly drive the OLED. Prior art methods allow the current through the OLED, by controlling the external transistor, e.g., by turning a thin film transistor (TFT) on or off, which then controls the current density of the OLED. In addition, according to prior art methods for fabricating OLED device, first one or more TFTs are built and then the OLED devices are built directly on the TFT(s).

SUMMARY

According to some embodiments, the disclosed methods and devices address the problems of the prior art, e.g., external control of the light emitting device and fabrication challenges, by allowing direct control of the OLED. Specifically, the disclosed methods and devices can control the electron or hole injection from the OLED gate electrode, i.e., from outside the device, which enables controlling the electron and hole current balance inside the device. By controlling the electron and hole current density or current conversion efficiency, the disclosed devices and methods can increase the device efficiency, which subsequently increases the brightness of the device.

According to some embodiments, a light emitting device can include a porous electrode, e.g., a porous cathode, between an electrolyte layer and an organic semiconductor layer. The electrolyte material is in direct contact with the porous electrode and can interface (or interact) with the organic semiconductor layer through the porous cathode electrode. On application of a gate potential, the electrolyte provides mobile ions that can migrate into the organic semiconductor layer. The mobile ions thus can stabilize the electrochemically doped organic semiconductor by injecting carriers from electrodes, e.g., the reversible electrochemical reduction (n-doping) of the organic semiconducting layer in the proximity to cathode, leading to the enhanced electron injection, and increased electron current density.

According to some embodiments, a vertical light emitting transistor is provided with a porous cathode as a common electrode that allows ions within the polymer electrolyte to pass through. The vertical light emitting transistor can comprise an anode, a porous cathode, an electro-luminescent organic layer between the anode and porous cathode, a gate electrode, and a polymer electrolyte layer deposited between the porous cathode and the gate electrode. According to some embodiments, the disclosed devices allow electron and hole modulation through a porous cathode by way of applying appropriate gate bias. According to some embodiments, a light emitting transistor can have controllable light emission and enhanced external quantum efficiency.

According to other embodiments, a light emitting device can include a composite material electrode, e.g., an aluminum lithium fluoride (Al—LiF) between an electrolyte layer an an organic semiconductor layer. The composite material can be a mixture of a metal and an inorganic compound such as an alkali metal compound. The inorganic material is selected to be polarized on the metal layer by electrostatic field effects. In some embodiments, the work function of the composite material electrode can be modulated to facilitate electron injection in the organic semiconductor layer, in response to a voltage applied at a gate terminal. The composite material can be non-porous. In one or more embodiments, the electrolyte does not make contact with the organic semiconductor, and therefore there is no electrochemical doping in the organic material induced by the electrolyte.

According to other embodiments, a light emitting device can include graphene electrode, e.g., a single layer graphene between a dielectric layer and an organic semiconductor layer. The work function of graphene can be tuned by electrostatic field effect.

According to some embodiment, a vertical light emitting transistor (VOLET) can have a cathode comprising a mixture of conductive metal and alkali metal salts, and pores on the cathode by dissolving alkali metal with polymer electrolyte.

Specifically, the disclosed devices can control the current density, and subsequently the brightness of the device, by controlling an outside potential, e.g., the potential applied at the gate electrode, which controls the electron or hole injection inside the device. For example, by increasing the electron injection, the brightness of the light produced by the OLED increases. The characteristics of such a device correspond to a light emitting transistor (LET).

BRIEF DESCRIPTION OF THE DRAWINGS

Various objects, features, and advantages of the disclosed subject matter can be more fully appreciated with reference to the following detailed description of the disclosed subject matter when considered in connection with the following drawings.

FIG. 1A illustrates a three dimensional structure of an exemplary polymer electrolyte (PE) gated polymer light-emitting transistor (PLET), according to some embodiments.

FIG. 1B illustrates an exemplary PE gated PLET with a device energy diagram, according to some embodiments.

FIGS. 5A and 5B illustrate temporal responses of the current density ($J_{PLED}$) and the luminance (L) of an exemplary PE gated PLET, according to some embodiments.

FIGS. 6A and 6B illustrate temporal responses of the current density ($J_{PLED}$) and the luminance (L) (6B) of an exemplary PE gated PLET, according to some embodiments.

FIGS. 8A-8C illustrate atomic force microscope (AFM) images of (8A) a super yellow (SY) layer; and (8B) 20 nm and (8C) 40 nm Al layers deposited on top of a super yellow (SY) layer, according to some embodiments.

FIGS. 9A and 9B illustrate a photograph of PE (PMMA:PEO=1:1 in weight) gated PLEDs (9A) before and (9B) after device tests, showing that the PE was melted by the generated heat, according to some embodiments.

FIG. 10A illustrates a three dimensional structure of an exemplary PE gated PLET with patterned 5×5 matrix gate electrodes, according to some embodiments.

FIG. 13C illustrates a scanning electron microscope (SEM) image of an Al:LiF composite electrode showing the abscission of charging materials, according to some embodiments.

FIG. 13D illustrates a cross-sectional SEM image showing layers of an exemplary PED|PLED, according to some embodiments.

FIGS. 19C-D illustrate the temporal responses of the current density ($J_{PLED}$) and luminance (L) of an exemplary PEC|PLED, according to some embodiments.

FIG. 20A illustrates a three dimension structure of an exemplary PEC|PLED, according to some embodiments.

FIG. 20B illustrates a top view showing the electrodes dimension of a seven gate segment PLED display module, according to some embodiments.

FIG. 20C illustrates a photograph image of a prototype driving circuit board for the seven gate segment PLED display module of FIG. 20B, according to some embodiments.

FIG. 20D illustrates photographs of an exemplary active matrix PLED display displaying digital numbers from 0 to 9, according to some embodiments.

FIGS. 30A-30F illustrate AFM images for Al thin film deposited on glass with AL thickness being 5 nm, 10 nm, 15 nm, 20 nm, 25 nm and 30 nm, respectively.

DETAILED DESCRIPTION OF THE INVENTION

Figure 1D:
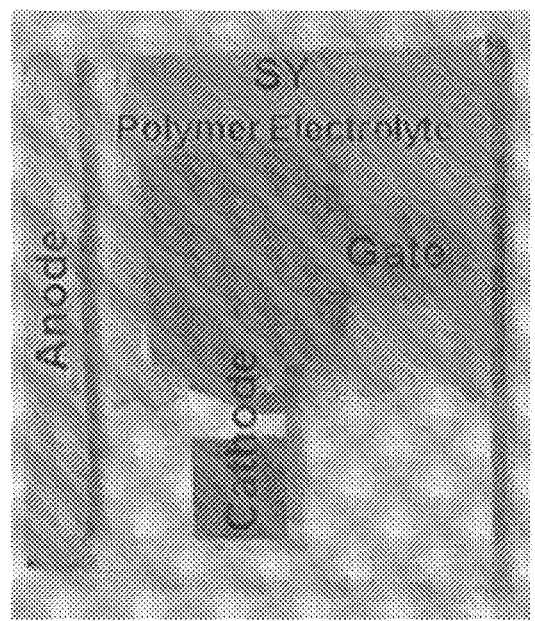
FIG. 1D illustrates a photograph of an exemplary PE gated PLET, according to some embodiments.

In the following description, numerous specific details are set forth regarding the systems and methods of the disclosed subject matter and the environment in which such systems and methods may operate, in order to provide a thorough understanding of the disclosed subject matter. It will be apparent to one skilled in the art, however, that the disclosed subject matter may be practiced without such specific details, and that certain features, which are well known in the art, are not described in detail in order to avoid complication of the disclosed subject matter. In addition, it will be understood that the embodiments described below are the only examples, and that it is contemplated that there are other systems and methods that are within the scope of the disclosed subject matter.

According to some embodiments, active matrix displays are provided by patterning gate electrode arrays on a polymer electrolyte coated polymer light emitting transistor (PLET). The disclosed PE gated PLET comprises a capacitor, an electrochemical transistor, and a light emitting diode. The PE gated PLET exhibits improved electron injection due to electrochemical n-doping in the cathode when a positive potential is applied at the gate electrode of the PE gated PLET. The electron/hole injection balance can be modulated by the gate electrode potential through the polymer electrolyte in contact with the active material of the PLET, which results in an increased electroluminescent brightness from <40 cd m-2 to 4000 cd m$^{-2}$ and external quantum efficiency from <0.02% to 2.3%.

According to some embodiments, low-cost and low-voltage active matrix displays are provided, having an optionally patterned gate electrode array on a polymer electrolyte (PE) coated polymer light emitting diode (PLED). Polymer light-emitting diodes (PLED use an electroluminescent conductive polymer that emits light when connected to an external voltage. Structurally, this monolithic integrated organic optoelectronics consists of a PE capacitor and a PLED by sharing a common electrode (PEC|PLED), such as an Al:LiF composite electrode. The monolithic integrated organic optoelectronics can provide tunable electron injection due to the perturbation of accumulated ions of Al:LiF composite electrode by PEC charging and discharging, characteristics associated with a polymer light-emitting transistor (PLET). The electron injection modulation by PE capacitor (PEC) results in improved optoelectronic performance, including an increase in the electroluminescent brightness from <100 cd m$^2$ to >8000 cd m$^{-2}$ and external quantum efficiency from <0.025 percent to 2.4 percent.

In one aspect, a vertical light emitting transistor includes an anode electrode; an active material layer; a porous material layer on tope of the active material layer forming a cathode electrode; a dielectric layer on top of the porous material layer; and a conductive layer on tope of the dielectric layer forming a gate electrode; wherein dielectric material transferred through the porous material layer causes electrochemical doping within the active material layer.

In one or more embodiments, the vertical light emitting transistor further includes at least one additional light emitting enhancement layer selected from the group consisting of electron injection dipole layers, transportation dipole layers, conjugate polyelectrolyte layers, and hole injection layers.

If any of the preceding embodiments, the additional light emitting enhancement layer is disposed between the anode and the active material layer.

If any of the preceding embodiments, the porous cathode includes an electrode material selected from graphene sheets, doped Si, ZTO, ITO, Au, Al, Cu, Ni, Mo, Cr, Ag, metal nanowires, metal plate, metal meshes, metal grids, holey copper, holey graphene, conductive polymers, and a low coverage network of a plurality of nanowires.

If any of the preceding embodiments, the porous cathode includes a porous aluminum.

If any of the preceding embodiments, the porous cathode has a porosity in the range of 0-80%.

If any of the preceding embodiments, the porous cathode further includes an alkali metal- or alkaline earth metal-containing material.

If any of the preceding embodiments, the active material layer is formed of a light emitting material selected from the group consisting of a crystalline semiconductor, a semiconductor nanowire, a quantum wall, an organometallic complex, a small organic conjugate molecule, porphyrin, pentacene, and a conjugate polymer.

If any of the preceding embodiments, the active material layer includes an organic semiconductor material.

If any of the preceding embodiments, the organic semiconductor material includes a poly(para-phenylenevinylene) (PPV) copolymer (Super Yellow (SY)).

If any of the preceding embodiments, the crystalline semiconductor is selected from GaN, GaP, GaAs, AlGaAs, GaAsP, AlGaInP, ZnSe, InGaN and AlN.

In any of the preceding embodiments, the semiconductor nanowire is selected from Si and GaAs.

In any of the preceding embodiments, the organometallic complex comprises an Ir organometallic complex.

In any of the preceding embodiments, the small organic conjugated molecule is selected from porphyrin and pentacene.

In any of the preceding embodiments, the conjugated polymer is selected from PPV, PVK, MEH-PPV, PPF, PFO and PPP, poly(9,9-dioctylfluorene) (F8), and a poly(para-phenylenevinylene) (PPV) copolymer (Super Yellow (SY)).

If any of the preceding embodiments, the dielectric material is selected from the group of oxides selected from $SiO_2$, Al$_2$O$_3$, HfO$_2$, ZrO$_2$, a nitride, Si$_3$N$_4$, an inorganic salts selected from LiF, CsF, BaTiO$_3$, and SrTiO$_3$, one or more a dielectric polymers selected from PMMA, Teflon, CYTOP, PEO and Nafion, and an ionic gel formed from the combination of a dielectric polymer and an ionic liquid.

In any of the preceding embodiments, the dielectric layer further includes an electrolyte salt.

In any of the preceding embodiments, the electrolyte salt comprises lithium triflate.

The vertical light emitting transistor of any of claim 1 through 16, wherein the dielectric layer includes alkali salts, ion conductor and material solidifier.

If any of the preceding embodiments, the material solidifier includes PMMA.

In any of the preceding embodiment, the light emitting device include a graphene electrode disposed between a dielectric layer and an organic semiconductor layer.

In another aspect, a method of forming a vertical light emitting transistor includes forming an anode electrode, forming an active material layer; forming a porous material layer on top of the active material layer forming a cathode electrode, forming a dielectric layer on top of the porous material layer; and forming a conductive layer on top of the dielectric layer forming a gate electrode; wherein dielectric material transferred through the porous material layer causes electrochemical doping within the active material layer.

In another aspect, s vertical light emitting device includes an anode electrode.

an active material layer; a composite material layer on top of the active material layer forming a cathode electrode; an dielectric layer on top of the composite material layer; and a conductive layer on top of the dielectric layer forming a gate electrode; wherein a work function of the composite material is modulated to facilitate injection of electrons from the composite material layer into the active material layer in response to a voltage applied at the gate electrode.

If any of the preceding embodiments, the vertical light emitting device further includes at least one additional light emitting enhancement layer selected from the group consisting of electron injection dipole layers, transportation dipole layers, conjugate polyelectrolyte layers, and hole injection layers.

In any of the preceding embodiments, the additional light emitting enhancement layer is disposed between the anode and the active material layer.

In any of the preceding embodiments, the cathode is non-porous.

In any of the preceding embodiments, the composite material layer comprises an electrode material selected from graphene sheets, doped Si, ZTO, ITO, Au, Al, Cu, Ni, Mo, Cr, Ag, metal nanowires, metal plate, metal meshes, metal grids, holey copper, holey graphene, conductive polymers, and a low coverage network of a plurality of nanowires.

In any of the preceding embodiments, the electrode material comprises aluminum.

If any of the preceding embodiments, the composite material layer comprises an inorganic material.

In any of the preceding embodiments, the inorganic material comprises an alkali metal- or alkaline earth metal-containing material.

In any of the preceding embodiments, the active material layer is formed of a light emitting material selected from the group consisting of a crystalline semiconductor, a semiconductor nanowire, a quantum wall, an organometallic complex, a small organic conjugate molecule, porphyrin, pentacene, and a conjugate polymer.

In any of the preceding embodiments, the active material layer comprises an organic semiconductor material.

In any of the preceding embodiments, the organic semiconductor material comprises a poly(para-phenylenevinylene) (PPV) copolymer (Super Yellow (SY)).

In any of the preceding embodiments, the crystalline semiconductor is selected from GaN, GaP, GaAs, AlGaAs, GaAsP, AlGaInP, ZnSe, InGaN and AlN.

In any of the preceding embodiments, the semiconductor nanowire is selected from Si and GaAs.

In any of the preceding embodiments, the organometallic complex comprises an Ir organometallic complex.

In any of the preceding embodiments, the small organic conjugated molecule is selected from porphyrin and pentacene.

In any of the preceding embodiments, the conjugated polymer is selected from PPV, PVK, MEH-PPV, PPF, PFO and PPP, poly(9,9-dioctylfluorene) (F8), and a poly(para-phenylenevinylene) (PPV) copolymer (Super Yellow (SY)).

In any of the preceding embodiments, the dielectric material is selected from the group of oxides selected from SiO$_2$, Al$_2$O$_3$, HfO$_2$, ZrO$_2$, a nitride, Si$_3$N$_4$, an inorganic salts selected from LiF, CsF, BaTiO$_3$, and SrTiO$_3$, one or more a dielectric polymers selected from PMMA, Teflon, CYTOP, PEO and Nafion, and an ionic gel formed from the combination of a dielectric polymer and an ionic liquid.

In any of the preceding embodiments, the dielectric layer further comprises an electrolyte salt.

In any of the preceding embodiments, the electrolyte salt comprises lithium triflate.

In any of the preceding embodiments, the dielectric layer comprises alkali salts, ion conductor and materials solidifier.

In any of the preceding embodiments, the materials solidifier comprises PMMA.

In another aspect, a method of forming the vertical light emitting device includes forming an anode electrode; forming an active material layer, forming a composite material layer on top of the active material layer forming a cathode electrode; forming an dielectric layer on top of the composite material layer; and forming a conductive layer on top of the dielectric layer forming a gate electrode; wherein a work function of the composite material is modulated to facilitate injection of electrons from the composite material layer into the active material layer in response to a voltage applied at the gate electrode.

In another aspect, a vertical light emitting transistor includes a light emitting cell comprised of a light emitting layer formed of at least one light emitting material, the light emitting layer having first and second sides in conductive relation to a conductive drain electrode and a conductive source electrode, at least one capacitor comprised of a dielectric layer formed of at least one dielectric material, the at least one dielectric layer having first and second sides in conductive relation to one of either the conductive source or drain electrodes, and a conductive gate electrode; and at least one substrate in supportive relation with each of said drain and gate electrodes; wherein the drain and source electrodes are the cathode and anode of the light emitting cell; and wherein at least the electrode disposed between the light emitting layer and the dielectric layer is a conductive porous electrode has sufficient open portions to exhibit a surface coverage of no greater than 50%, such that the dielectric layer makes direct contact with the light emitting layer through the open portions of the conductive porous electrode, wherein the light emitting cell and the capacitor are positioned and arranged to provide an electrochemical transistor.

In another aspect, a vertical light emitting device includes a light emitting cell comprised of a light emitting layer formed of at least one light emitting material, the light emitting layer having first and second sides in conductive relation to a conductive drain electrode and a conductive source electrode; at least one capacitor comprised of a dielectric layer formed of at least one dielectric material, the at least one dielectric layer having first and second sides in conductive relation to one of either the conductive source or drain electrodes, and a conductive gate electrode; and at least one substrate in supportive relation with each of said drain and gate electrodes; wherein the drain and source electrodes are the cathode and anode of the light emitting cell; and wherein at least the electrode disposed between the light emitting layer and the dielectric layer is a conductive composite material.

In another aspect, a light emitting display includes a plurality of light emitting transistors, each transistor having an anode electrode; an active material layer;
a porous material layer on top of the active material layer forming a cathode electrode; a dielectric layer on top of the porous material layer; and a conductive layer on top of the dielectric layer forming a gate electrode; wherein dielectric material transferred through the porous material layer causes electrochemical doping within the active material layer, wherein at least one of the active material layer and the gate electrode of the light emitting transistors is patterned to form the light emitting transistors, and wherein a work function of the composite material is modulated to facilitate injection of electrons from the composite material layer into the active material layer in response to a voltage applied at the gate electrode.

In another aspect, a light emitting display includes a plurality of light emitting transistors, each transistor having an anode electrode; a hole-injecting layer on top of the anode electrode, an active material layer on top of the hole-injecting layer; a composite material layer on top of the active material layer forming a cathode electrode; an dielectric layer on top of the composite material layer; and a conductive layer on top of the dielectric layer forming a gate electrode; wherein a work function of the composite material is modulated to facilitate injection of electrons from the composite material layer into the active material layer in response to a voltage applied at the gate electrode; wherein at least one of the active material layer and the gate electrode of the light emitting transistors is patterned to form the light emitting transistors.

In one or more embodiments, a light emitting device has the characteristics of a PE gated polymer light-emitting transistor and exhibits an electroluminescent brightness of greater than 4000 cd m$^{-2}$, such as >5000 cd m$^{-2}$ or >700 cd m$^{-2}$, or >8000 cd m$^{-2}$, or >9000 cd m$^{-2}$, or an electroluminescent brightness in a range bounded by any value stated herein.

In one or more embodiments, a light emitting device has the characteristics of a PE gated polymer light-emitting transistor and exhibits an external quantum efficiency of greater than 2.0% or greater than 2.1% or greater than 2.2 or greater than 2.3% or greater than 2.5% or greater than 2.6%, or an external quantum efficiency in a range bounded by any value stated herein.

In one or more embodiments, a light emitting device has the characteristics of a PE gated polymer light-emitting transistor and exhibits an electroluminescent brightness of greater than 8000 cd m$^{-2}$ and an external quantum efficiency of greater than 2.0%.

In one or more embodiments, a light emitting device has the characteristics of a PEC/PLED and exhibits an electroluminescent brightness of greater than 4000 cd m$^{-2}$, such as >5000 cd m$^{-2}$ or >700 cd m$^{-2}$, or >8000 cd m$^{-2}$, or >9000 cd m$^{-2}$, or up to 1000 cd m$^{-2}$ or an electroluminescent brightness in a range bounded by any value stated herein.

In one or more embodiments, a light emitting device has the characteristics of a PEC/PLED and exhibits an external quantum efficiency of greater than 2.0% or greater than 2.1% or greater than 2.2 or greater than 2.3% or greater than 2.5% or greater than 2.6%, or an external quantum efficiency in a range bounded by any value stated herein.

In one or more embodiments, a light emitting device has the characteristics of a PEC/PLED and exhibits an electroluminescent brightness of greater than 8000 cd m$^{-2}$ and an external quantum efficiency of greater than 2.0%.

Light-Emitting Devices with Porous Material Electrodes to Facilitate Electrochemical Doping According to some embodiments, a light emitting device can include a porous electrode, e.g., a porous cathode, between an electrolyte layer and an organic semiconductor layer. In operation, the electrolyte material passes through the porous electrode and makes contact with the organic semiconductor. The electrolyte that goes through the porous electrode can be injected into the organic semiconductor material and/or can remain at the interface between the organic semiconductor layer and the porous electrode layer. The electrolyte that is injected into the organic semiconductor can stabilize the electrochemically doped organic semiconductor. The electrolyte that remains at the interface can change the electron injection stability.

Figure 1C:
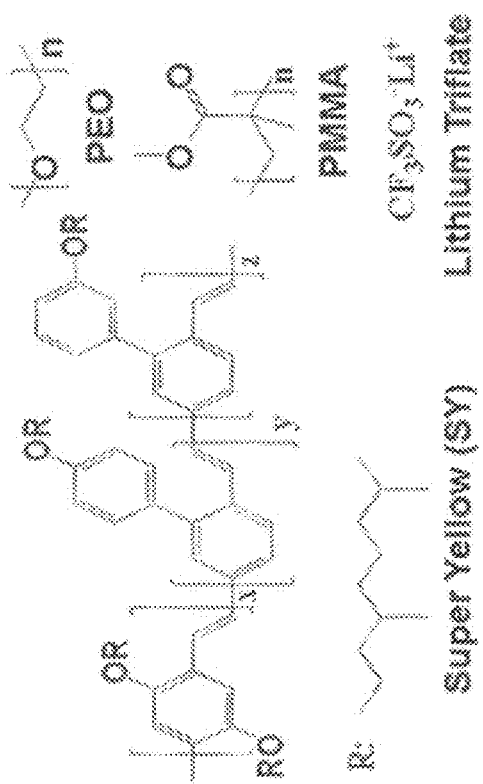
FIG. 1C illustrates the chemical structures of super yellow (SY), poly(ethylene oxide) (PEO), poly(methyl methacrylate) (PMMA), and lithium triflate.

For example, FIG. 1A shows a three dimensional structure of an exemplary light-emitting device, such as a PE gated PLET. The light-emitting device 100 comprises different layers of materials, for example, an anode electrode 110, for example, an indium thin oxide (ITO), an additional light emitting enhancement layer 120, such as a hole-injecting layer, for example, a polymer, such as, poly(3,4-ethylenedioxythiophene) (PEDOT), an active material 130, for example, an organic semiconductor, such as super yellow (SY), a porous electrode 140, such as aluminum (Al), which can be filled with a polarizable material 150, such as LiF, as together forming the cathode electrode 160. The light-emitting device can also comprise a dielectric layer 170, which can be a polymer electrolyte (PE), such as for example, (poly(methyl methacrylate), poly(ethylene oxide), and/or Lithium Triflate, PMMA/PEO/LiCF$_3$SO$_{3-}$), and a gate electrode 180, for example, a conductive material such as Al. Specifically, as shown in FIG. 1A, the active material super yellow (SY, a poly-(p-phenylene vinylene) derivative) can be deposited between a poly(3,4-ethylenedioxythiophene); polystyrene sulfonate (PEDOT:PSS) coated indium tin oxide (ITO) anode electrode and a thermal evaporated thin Al cathode electrode, to form a polymer light-emitting diode (PLED). FIG. 1C shows the chemical structure of Super Yellow (SY), (poly(methyl methacrylate) (PMMA), poly (ethylene oxide) (PEO), a Lithium Triflate used in the exemplary light-emitting device of FIG. 1A. FIG. 1D is a photograph of a PE gated PLET having the structure described in FIG. 1A. The devices can be bottom or top gated.

According to some embodiments, the current density and luminance of the PE gated PLET can be modulated by applying a gate potential through polymer electrolyte layer 170. As discussed above, the disclosed device comprises an electrode 180, a polymer electrolyte (PE) 170 and a PLED (elements 110-160), and has characteristics of a PE gated polymer light-emitting transistor (PE gated PLET). Polymer electrolytes have been investigated in organic light emitting electrochemical cells (LECs) to balance the reversible electrochemical oxidation and reduction of light emitting polymers like poly(2-methoxy,5-(2'-ethylhexoxy)-1,4-phenylenevinylene) (MEH-PPV) and super yellow (SY). Balancing the charges in the emissive layer of a polymer light emitting diode (PLED) has been reported to improve light output from the device. Charge balance optimization has been attempted previously by introducing hole transport layers, that carry the "opposite" of electrons, positive holes, using electron injection layers and tuning polymer blends to improve energy transfer. There is, however, always a trade-off between electronic and optical properties. In contrast to prior art light emitting electrochemical cells, in the disclosed PE gated PLET, the polymer electrolyte is located outside the polymer light emitting diode and interfaces (or interacts) with the SY through the porous cathode electrode 160. Therefore, the PE can assist in the reversible electrochemical oxidation or reduction of the active material (SY) at their interface. The electrochemically oxidized or reduced SY thus can enhance or lower the charge carrier injection, resulting in high or low current density, respectively. With the enhanced electron injection, the brightness of the devices can increase from <40 cd m$^{-2}$ to 4000 cd m$^{-2}$, with a corresponding external quantum efficiency (EQE) increase from <0.02% to 2.3%. This is because of the balanced electron and hole injection. The involvement of ion motion in electrochemical doping can lead to a slow dynamic response of the PE gated PLET, when the gate potential is applied or released.

FIG. 1B is a device energy diagram that illustrates the working principle of the PE gated PLET. A voltage is applied across the anode and the porous cathode. The mismatched energy levels between the conductance band of the light emitting layer and the Fermi level of metal electrode leads to large injection barrier, resulting in poor performance of lighting emitting diodes. By applying a potential on the gate electrode, cations can migrate into the light emitting layer to balance the n-doped light emitting layer which forms an ohmic contact with metal electrode. This significantly improves the electron injection to form an enhanced hole-electron injection balance for efficient electroluminescence.

In one or more embodiments, the anode can be a transparent anode to permit the observation of the emitted light. In one or more embodiments, the electrode material is selected from graphene sheets, doped Si, as fluorine doped tin oxide (FTO), zinc doped tin oxide (ZTO) or other dopes zinc oxides, ITO, thin metal films such as Au, Al, Cu, Ni, Mo, Cr, Ag, conductive polymers, and a low coverage network of a plurality of nanowires, such as carbon or silicon nanowires. Indium tin oxide (ITO) is commonly used as the transparent anode, as it is transparent to visible light and has a high work function which promotes injection of holes into the HOMO level of the active layer.

In one or more embodiments, the device can include at least one additional light emitting enhancement layer 120 selected from the group of electron injection dipole layers, transportation dipole layers, conjugate polyelectrolyte layers, and hole injection layers. In some embodiments, the layer is a the hole injecting layer, e.g., typically the hole injecting layer is a conducting polymer such as poly(3,4-ethylenedioxythiophene) (PEDOT). A typical conductive layer may consist of PEDOT, PSS, as the HOMO level of this material generally lies between the work function of ITO and the HOMO of other commonly used polymers, reducing the energy barriers for hole injection. However, any hole injection material can be used. Exemplary materials include conjugated polymers such as 1,3-Bis(triphenylsilyl)benzene, $N^4$, $N^{4'}$-bis[4-[bis(3-methylphenyl)amino]phenyl]-$N^4$,$N^{4'}$-diphenyl-[1,1'-biphenyl]-4,4'-diamine (DNTPD), polyaniline, 7,7,8,8-Tetracyanoquinodimethane (TCNQ), 2,3,5,6-tetrafluoro-7,7,8,8-tetracyanoquinodimethane (F4TCNQ), and tetracyanoethylene (TCNE)

The active material is the emissive layer in which recombination of the holes and electrons occur. In one or more embodiments, the active layer is formed of a light emitting material selected from the group consisting of a crystalline semiconductor selected from GaN, GaP, GaAs, AlGaAs, GaAsP, AlGaInP, ZnSe, InGaN and AlN, a semiconductor nanowire selected from Si and GaAs, a quantum wall, an organometallic complex, such as in iridium complex, a small organic conjugated molecule, such as porphyrin or pentacene, a conjugate polymer selected from poly(para-phenylenevinylene) (PPV), PVK, MEH-PPV, PPF, PFO and PPP, poly(9,9-dioctylfluorene) (F8), and a poly(para-phenylenevinylene) (PPV) copolymer (Super Yellow (SY)).

In one or more embodiments, the active layer is an organic semiconductor layer. The organic molecules of the active layer are electrically conductive as a result of delocalization of pi electrons caused by conjugation over part or all of the molecule. These materials have conductivity levels ranging from insulators to conductors, and are therefore considered organic semiconductors. Exemplary organic semiconductor layers include a conjugate polymer selected from poly(para-phenylenevinylene) (PPV), poly(9-vinylcarazole) PVK, poly[2-methoxy-5-(2-ethylhexyloxy)-1,4-phenylenevinylene] (MEH-PPV), PPF, polyfluorene (PFO) and poly(p-phenylene) (PPP), poly(9,9-dioctylfluorene) (F8), and a poly(para-phenylenevinylene) (PPV) copolymer (Super Yellow (SY)).

In one or more embodiments, the cathode is porous to allow the passage of ions from the polymer electrolyte (PE) layer. In one or more embodiments, the porous cathode comprises an electrode material selected from graphene sheets, doped Si, zin-doped tin oxide (ZTO), ITO, Au, Al, Cu, Ni, Mo, Cr, Ag, metal nanowires, metal plate, metal meshes, metal grids, holey copper, holey graphene, conductive polymers, and a low coverage network of a plurality of nanowires. In one or more embodiments, a light emitting device can include graphene electrode, e.g., a single layer graphene between a dielectric layer and an organic semiconductor layer. The work function of graphene can be tuned by electrostatic field effect. In one or more embodiments, the electrode thickness is greater than 10 nm, and can be 20 nm, 30 nm, 40 nm, 50 nm, 60 nm, 70 nm, 80 nm, 90 nm, 100 nm, 120 nm, 150 nm, 200 nm, 300 nm, 400 nm or as high as 50 nm. In one or more embodiments, the electrode can have a thickness range bounded by any thickness value provided herein. While not bound by any particular mode of operation, it is believed that increasing the electrode thickness increases conductivity, which can promote luminescence intensity. In one or more embodiments, a cathode with thickness of 20-40 nm can produce bright PLEDs with efficient gate modulation. In one or more embodiments, the metal in the cathode electrode can be, for example, Al, Ag, Au, Mg, Fe, Cu, Ca, and combinations thereof. A thin porous cathode layer can have a thickness, for example, in the range between 10 nm and 40 nm, can obtain enough pores with an average size of 0.1-5 nm to permit movement of ions.

The porous electrode material can optionally be filled with a polarizable material 150 that enhances the ability of the ions to pass through the porous cathode to interface with the active material. In one or more embodiments, the polarizable material 150 can be an alkali metal containing material, such as lithium fluoride (LiF) an aluminum lithium fluoride (Al:LiF), CsF, sodium fluoride (NaF), cesium fluoride (CsF), lithium bromide (LiBr), cesium bromide (CsBr), sodium bromide (NaBr), sodium chloride (NaCl), sodium chloride (LiI), cesium iodide (CsI), lithium triflate (LiC$_3$FSO$_3$), potassium triflate (KC$_3$FSO$_3$), cesium triflate (CsC$_3$FSO$_3$), Li$_2$CO$_3$, Cs$_2$CO$_3$, potassium carbonate (K$_2$CO$_3$), sodium carbonate (Na$_2$CO$_3$), LiF, CsF. The polarizable material can also be an alkaline earth metal containing materials such as BaTiO$_3$, and SrTiO$_3$. In some embodiments, the work function of the composite material electrode can be modulated to facilitate electron injection in the organic semiconductor layer, in response to a voltage applied at a gate terminal. In one or more embodiments, the inorganic compound can be selected to lower the work function of the electrode (relative to the metal alone). The polarizable material can also be included in the dielectric material to enhance its electrolyte properties, which can be the same or different.

In one or more embodiments, the dielectric material can be a metal oxide, metal nitride or a dielectric polymer. In one or more embodiments, the dielectric layer can be an ionic gel formed from the combination of a dielectric polymer and an ionic liquid. Suitable metal oxides include the group of oxides selected from SiO$_2$, Al$_2$O$_3$, HfO$_2$, ZrO$_2$. Suitable metal nitrides include a silicon nitride, such as Si$_3$N$_4$. One or more dielectric polymers can be selected from PMMA, polyethyleneimine, Teflon, CYTOP (amorphous fluoropolymer), PEO and Nafion Inorganic salts can be added to the dielectric such as lithium fluoride (LiF) an aluminum lithium fluoride (Al:LiF), CsF, sodium fluoride (NaF), cesium fluoride (CsF), lithium bromide (LiBr), cesium bromide (CsBr), sodium bromide (NaBr), sodium chloride (NaCl), sodium chloride (LiI), cesium iodide (CsI), lithium triflate (LiC$_3$FSO$_3$), potassium triflate (KC$_3$FSO$_3$), cesium triflate (CsC$_3$FSO$_3$), Li$_2$CO$_3$, Cs$_2$CO$_3$, potassium carbonate (K$_2$CO$_3$), sodium carbonate (Na$_2$CO$_3$), LiF, CsF. The inorganic material can also be an alkaline earth metal containing material such as BaTiO$_3$, and SrTiO$_3$ and can be the same or different from the polarizable material used in the porous cathode. In one or more embodiment, the inorganic salts can be soluble in the dielectric material and function as the electrolyte salt. Ions, e.g., alkali metal or alkaline earth metal cations, of the electrolytes salt can pass through the porous electrode to the active layer or active layer interface on application of a voltage. The cations can also stabilize electrochemical doping in the organic material.

In one or more embodiments, the gate electrode is a metal electrode, such as aluminum. In other embodiments, the electrode can be ITO. In one embodiment, the device is bottom gated and the gate electrode is ITO.

According to some embodiments, a layer of PE can be deposited on top of an Al cathode of the PLED. For example, a layer of PE can be deposited by spin coating a PE solution (poly(methyl methacrylate) (PMMA):poly(ethylene oxide) (PEO):lithium triflate in the weight ratio of 2:1:0.18) in ethyl acetate at speed of 1000 rpm for 60 seconds. According to some embodiments, an Al gate electrode can be evaporated on top of the disclosed PE coated PLED. According to some embodiments, the Al gate electrode can have a thickness of 100 nm. FIG. 1D is a photograph of a PE-gated PLET according to one or more embodiments.

In one or more embodiments, the PE-gated PLET device can include a plurality of gates, each of which are optionally individually addressable. The individually addressable gates can be used in a matrix display application. An aluminum island gated matrix display according to one or more embodiments is shown in FIGS. 10A-10G and its method of manufacture is shown in FIG. 11.

Figure 2A:
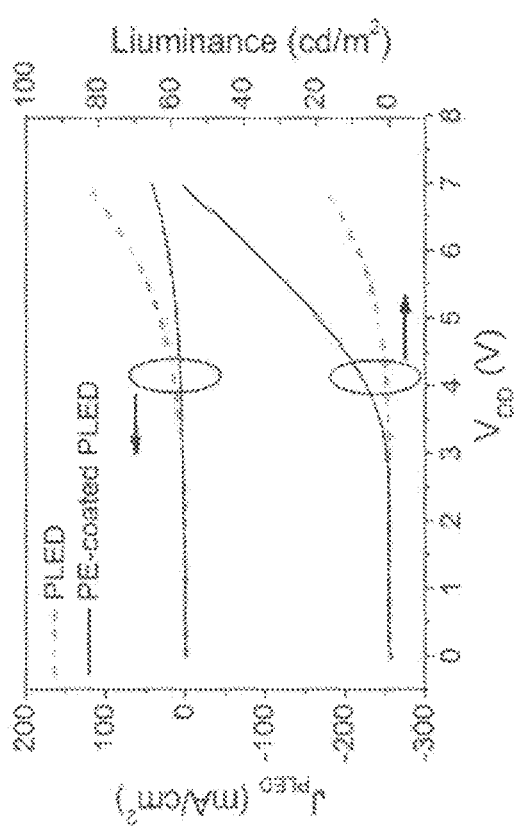
FIG. 2A illustrates a graph with current-luminance-voltage characteristics of an exemplary PE gated PLET, according to some embodiments.

FIG. 2A shows the current-luminance-voltage characteristics of a PLED (dashed line) and a PE-gated PLET (solid line). Current density is shown on the left vertical axis and luminescence is shown on the right vertical axis. The turn-on voltage for the uncoated PLED is shown about 6V with relatively low brightness and low efficiency in the measured voltage range. The low brightness and low efficiency is because of the large electron injection barrier, which results in an unbalanced electron-hole injection due to the mismatched energy levels between the SY low unoccupied molecular orbital (LUMO) and the aluminum work-function.

As illustrated in FIG. 2A, the current density of the PE coated PLET decreased by 50%, the turn-on voltage (VTO) shifted to 3.5 V with increased brightness up to 60 cd per m$^2$, and the current efficiency η increased about 10 times compared to the original PLED. The changed characteristics of the PLED after the PE coating indicates that the PE can penetrate through the porous Al cathode to form an interfacial layer between the SY active layer and the Al cathode. The increased luminance and decreased VTO resemble the characteristics of PLEDs improved by a conjugated polyelectrolyte (CPE) electron transportation layer where mobile ions were believed to migrate into the light emitting polymer (LEP) from the CPE interfacial layer for electrochemical n-doping under the operation potential.

Figure 2B:
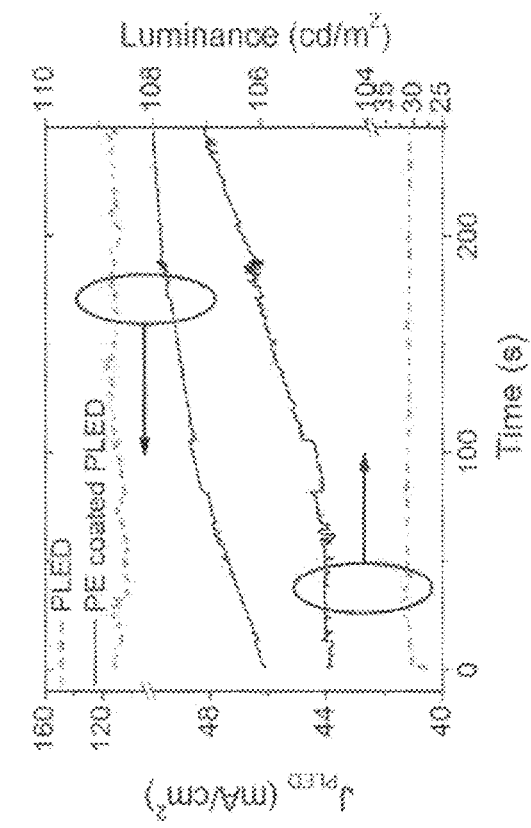
FIG. 2B illustrates a graph with current-luminance-voltage characteristics of an exemplary PE gated PLET, according to some embodiments.

FIG. 2B is a plot for the PLED (dashed line) and a PE-gated PLET (solid line) showing current density and luminescence response time. The similar ion motion from the interfacial PE layer to the adjacent SY active layer, as shown in FIG. 1B, was evidenced by slow time responses (~200 second) of the current and luminance, illustrated in FIG. 2B.

Figure 3:
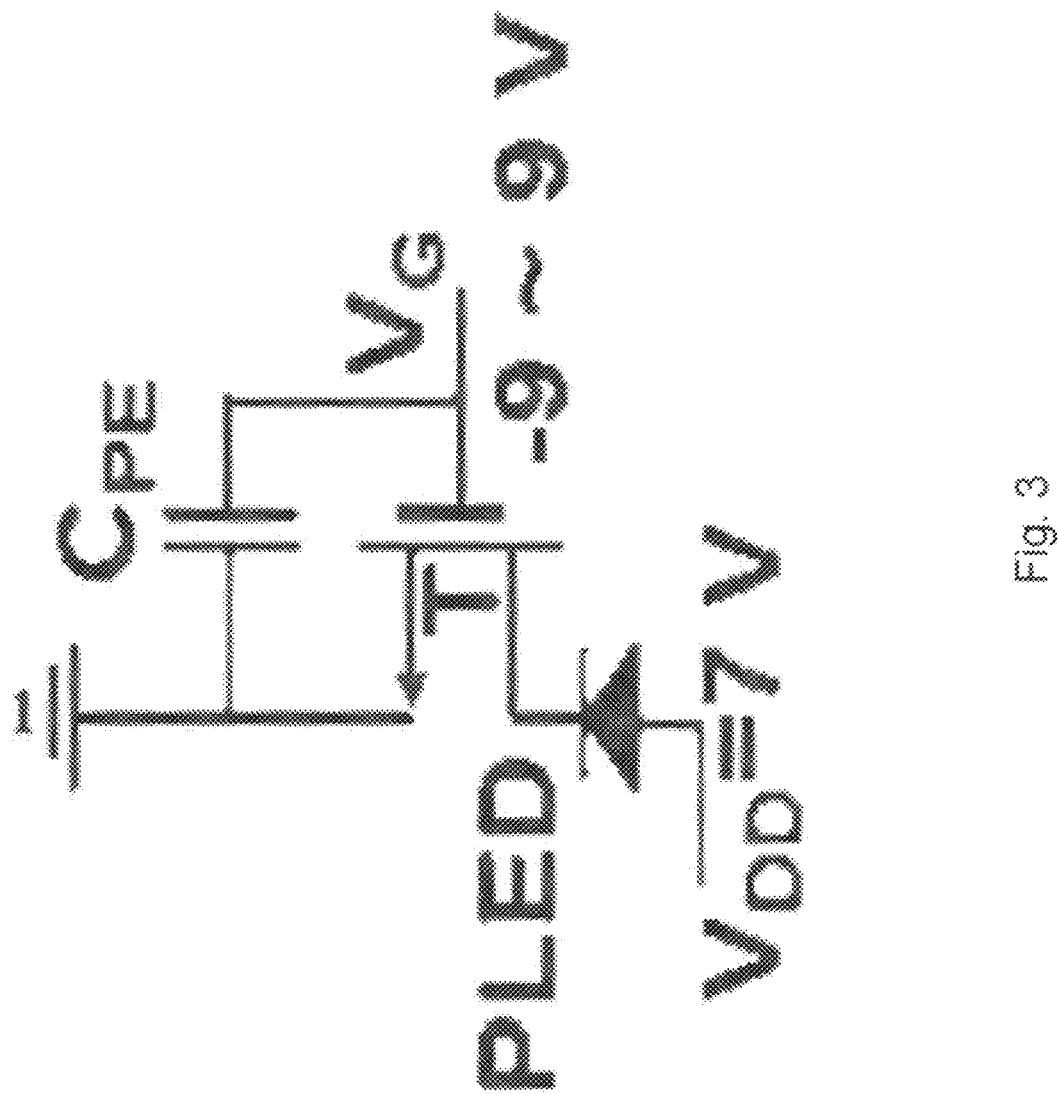
FIG. 3 illustrates an equivalent circuit diagram of an exemplary PE gated PLET, according to some embodiments.

The exemplary device shown in FIG. 1A was characterized in nitrogen filled glovebox using Keithley 4200 SCS (semiconductor characterization system). The equivalent circuit diagram of the device is shown in FIG. 3. The PE layer between Al gate electrode and the Al cathode electrode can form a capacitor $C_{PE}$ stacked on a conventional PLED. In parallel, the Al gate electrode, the PE, the Al cathode electrode, the SY, and the PEDOT:PSS coated ITO anode electrode can form a vertical PE gated SY polymer light-emitting transistor (PLET).

Figure 4A:
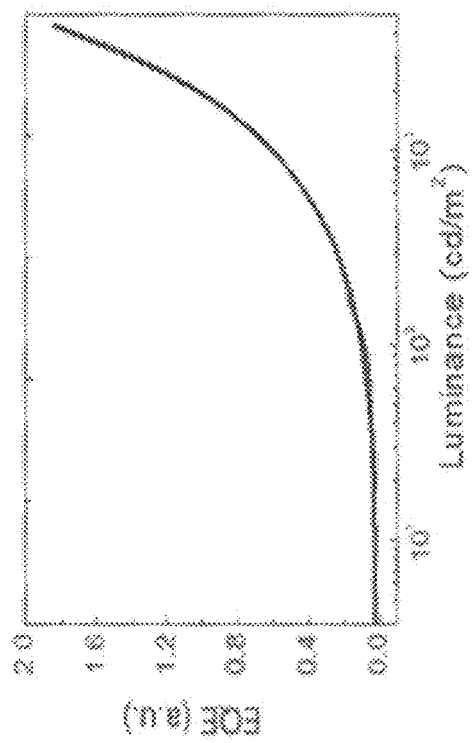
FIGS. 4A and 4C illustrate transfer characteristics of an exemplary PE gated PLET, according to some embodiments.

According to some embodiments, the transfer characteristics of the PE gated PLET were measured by setting the Al cathode electrode as source and the PEDOT:PSS coated ITO anode electrode as drain and applying voltage equal to $V_{DD}$=7V across the drain and source of the PE gated PLET. FIG. 4A shows a graph of the current density ($J_{PLED}$) and the luminance (L) versus the gate electron voltage ($V_G$) (arrows indicate against which axis each curve is plotted). These graphs show the gate dependence ($V_G$) of the light emission for the PE gated PLET. FIG. 5A shows the gate electrode current, which about 1000 times smaller than $J_{PLED}$.

Referring back to FIG. 4A, when the gate electrode voltage $V_G$ is swept from 0 V to 9 V, the capacitor $C_{PE}$ was charged ($Q=C_{PE} \cdot V_G$) by moving cations (Li+) towards the cathode electrode and anions (CF$_3$SO$^{3-}$) towards the gate electrode. The accumulated Li+ at the cathode electrode, which is determined by $V_G$, can be considered to balance the reversible electrochemical oxidation (n-doping) of the SY layer at the interface between the SY and the PE layer, leading to the enhanced electron injection, e.g., the increased electron current density, that contributes to the twofold increase of $J_{PLED}$. In contrast, the luminance (L) detected from the device exponentially increased from <40 cd m$^{-2}$ to >4000 cd m$^{-2}$ when the gate was swept from 0 V to 9 V. Therefore, the luminance (L) and current density ($J_{PLED}$) behave differently with varying gate electrode potential. This can be explained by the increasingly improved electron-hole balance within the device.

Reversely, the anions (CF$_3$SO$_3$—) were driven towards the cathode electrode as the gate electrode voltage $V_G$ changed from 0 V to −9 V. The gathered CF$_3$SO$_3$— stabilized reversibly electrochemical reduction (p-doping) of the SY layer at the interface between the SY layer and the PE layer. The p-doped SY layer can be metallic to form an ohmic contact with the cathode electrode for the hole current to drain out (the electron injection source was inversed into a hole drain under a negative gate potential). As shown in FIG. 4A, the current density ($J_{PLED}$) under a negative potential can be 2 times greater than that under positive potential with equivalent absolute value, because of the enhanced hole current density. Consequently no electroluminescence was detected because of the hole drain from the cathode electrode of the PLED under negative PE gating.

Figure 4B:
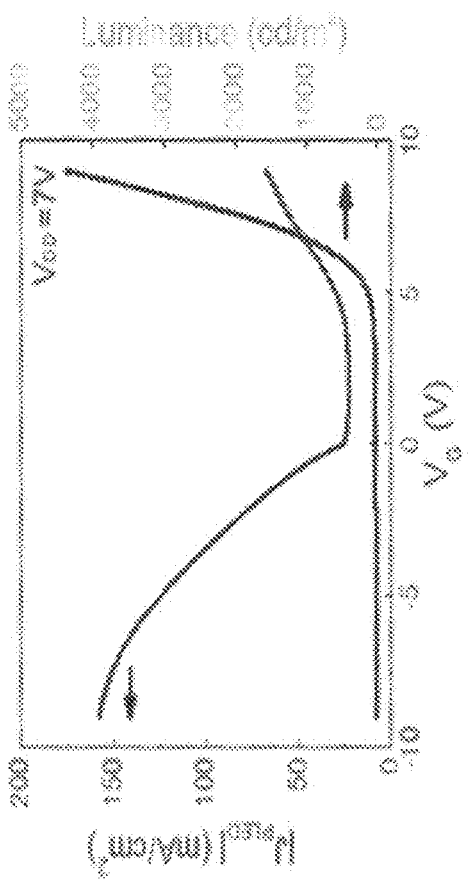
FIGS. 4B and 4D illustrate plots of the external quantum efficiency (EQE) versus the luminance of an exemplary PE gated PLET, according to some embodiments.

The external quantum efficiency (EQE) of the PE gated PLET was estimated based on the transfer data. FIG. 4B shows the curves of EQE as a function of luminance. The EQE can increase exponentially from <0.02% to 1.8% with increasing luminance from 10 cd m$^{-2}$ to >4000 cd m$^{-2}$, without saturating. This indicates that the current efficiency and brightness of the PE gated PLET can be effectively modulated by the applied $V_G$ potential.

Figure 4D:
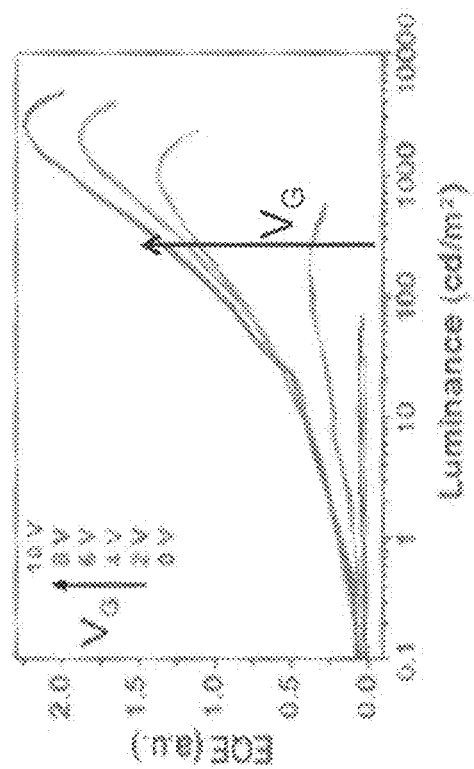
Figure 4C:
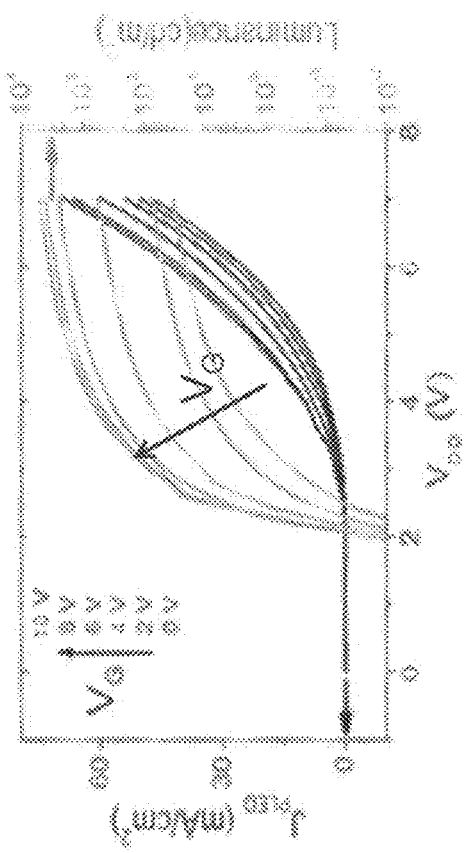

FIG. 4C shows the output characteristic of the PE gated PLET when varying the drain electrode—source electrode voltage, ($V_{DD}$), from 0 V to 7 V, applied at the ITO anode electrode in reference to the Al cathode, at different gate potentials ($V_G$=0, 2, 4, 6, 8, 10 V, increased voltage curves noted by direction of $V_G$ arrow). The $J_{PLED}$-$V_{DD}$ curves were relatively similar with increase in curve response when $V_G$ increased from 0 V to 10 V. In contrast, the L-$V_{DD}$ curves increased from maximum luminance of 40 cd/m$^2$ at $V_O$=0 V to 4400 cd/m$^2$ at $V_G$=10 V. Consequently, the maximum EQE value increased from 0.02% to 2.3% with luminance increased from <40 cd/m$^2$ to 4,000 cd/m$^2$, as shown in FIG. 4D. These results are consistent with the transfer data, further supporting that the increased luminance and conversion efficiency resulted from improved electron and hole injection balance that was effectively modulated by the applied gate potential.

FIG. 5A shows the temporal response of the current density ($J_{PLED}$) and the luminance (L) at $V_{DD}$=7 V by applying a rectangular pulse $V_G$ potential between −9 V and 9 V (pulse sequence shown by overlaid dashed line). FIG. 5A shows the current density ($J_{PLED}$) to continuously increase within the time scale of the pulse (20 seconds) and the luminance (L) to remain at zero under every pulse potential $V_G$=−9 V. When the pulse potential switches from $V_G$=9 V to −9 V or vice versa, the current ($J_{PLED}$) sharply decreases and then gradually increases within the duration of the pulse. These sharp drops can be considered as the discharging of charged capacitor, and the gradual increase as the re-charging of discharged capacitor. When the gate electrode voltage ($V_G$) switches from −9 V to 9 V, the luminance (L) progressively increases up to 4000 cd m$^{-2}$. The luminance (L) abruptly drops to zero when the gate electrode voltage ($V_O$) switches from 9 V back to −9 V.

FIG. 5B shows the temporal response of the current density ($J_{PLED}$) and the luminance (L) at $V_{DD}$=7 V by applying a rectangular pulse $V_G$ potential between −0 V and 9 V (pulse sequence shown by overlaid dashed line). FIG. 5B shows the current density ($J_{PLED}$) and the luminance (L) to continuously increase when the gate electrode voltage is $V_G$=9 V. Both the current density ($J_{PLED}$) and the luminance (L) drop when the gate electrode voltage returns to $V_G$=0 V. These results illustrate that the ion motion from the cathode electrode into the SY layer was slow and incomplete within the time scale (4 seconds) of the pulse.

FIG. 6 shows the temporal response of the current density ($J_{PLED}$) (FIG. 6A) and the luminance (L) (FIG. 6B) at $V_{DD}$=7 V and $V_G$=9 V. Both the current density ($J_{PLED}$) and the luminance (L) take about 40 seconds to saturate, reflective of the ion motion from PE interfacial layer to SY layer. Such time scale is consistent with a slow ion redistribution to balance electrochemical redox in the device.

Figure 7:
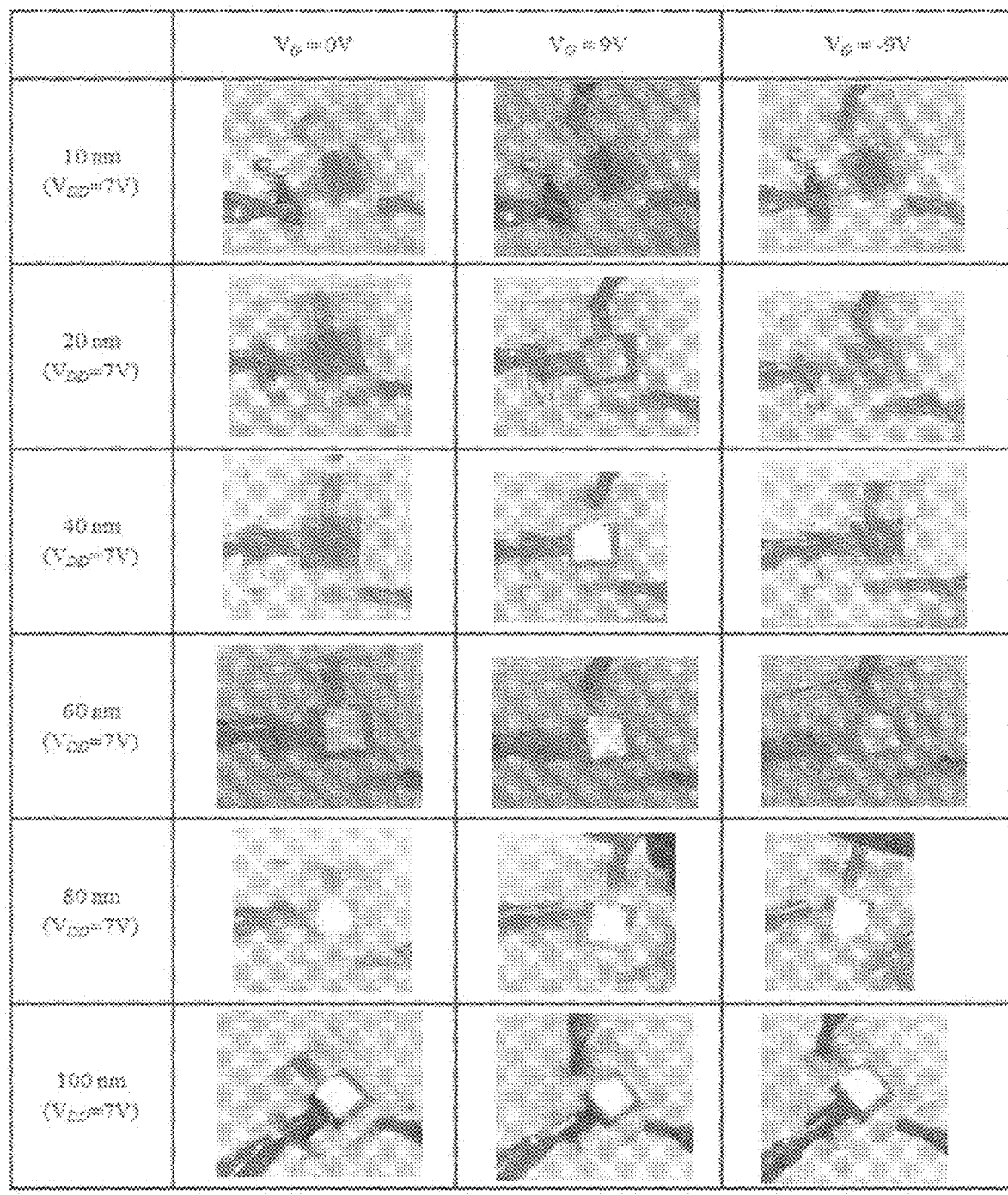
FIG. 7 illustrates a photograph of exemplary PE gated PLETs with various aluminum (Al) cathode thicknesses (10, 20, 40, 60, 80 and 100 nm), at gate voltages of 0V, 9V and −9V, according to some embodiments.

In the disclosed PE gated PLET device, the conductivity of the Al cathode electrode can relate to the brightness of the PLED. For example, under identical voltage bias, the brightness of PLEDs can increase with increasing thickness of the Al cathode electrode, as shown in the table of FIG. 7. FIG. 7 shows photographs of exemplary PE gated PLEDs with various Al cathode electrode thickness ranging from 10 nm to 100 nm under applied $V_{DD}$=7 V with different $V_O$ (0 V, 9V, and −9 V). On the other hand, modulation through PE gating is better achieved with a thin Al cathode that has a discontinuous area for PE to interface with the active light emitting polymer (LEP) layer.

In combination, an Al cathode with thickness of 20-40 nm can produce bright PLEDs with efficient gate modulation. This can be shown in the atomic force atmosphere (AFM) images of 20 nm thick and 40 nm thick Al layers deposited on top of a SY layer, as shown in FIG. 8. The AFM image of the SY layer shows a height roughness of 2.64 nm for the SY layer. The height roughness of the SY layer with a 20 nm thick Al layer and a 40 nm thick Al layer is 2.66 nm and 1.81 nm, respectively. The clusters can occur when aluminum atoms are deposited on oxygen-free polymer surfaces and atomic diffusion bridged the clusters to form quasi-discontinuous aluminum film. The discontinuous areas thus allowed the PE to form an interfacial layer on SY layer.

It is not uncommon for capacitors to exhibit leakage, that is, the gradual loss of energy from a charged capacitor. Without being bound by any particular mode of operation, gate leakage is believed to occur by electronic devices attached to the capacitors to the capacitors, such as transistors or diodes, which conduct a small amount of current even when they are turned off. In one or more embodiments, PMMA is used in the polymer electrolyte to reduce the gate leakage. PE gated PLET devices can degrade if the devices is only using PEO/Li$^+$CF$_3$SO$_3^-$. Even with a one-to-one weight ratio of PMMA/PEO, the heat generated from the gate leakage can melt the polymer electrolyte, as shown in FIG. 9. The PMMA can also provide thermal resistance and mechanic strength to support metal or SiN$_x$/SiO$_2$ via thermal vapor deposition and plasma enhanced chemical vapor deposition. Additionally, the PMMA can assist the solubility of PEO/CF$_3$SO$_3^-$Li$^{+0}$ in organic solvent for orthogonal solution processes on PE gated PLET without damaging the active SY layer.

Figure 10C:
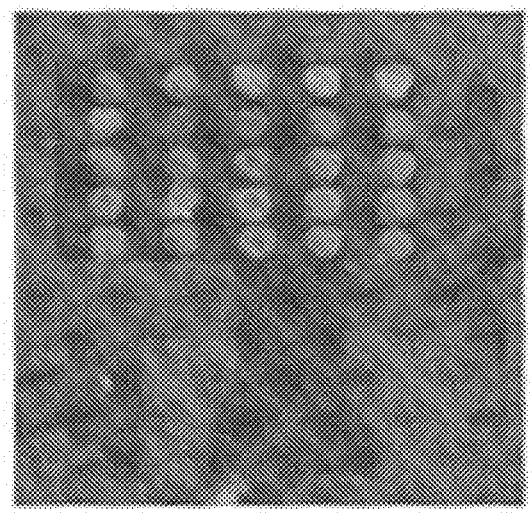
FIG. 10C illustrates a photograph of exemplary PE gated PLETs being turned on a 5×5 matrix, according to some embodiments.
Figure 10B:
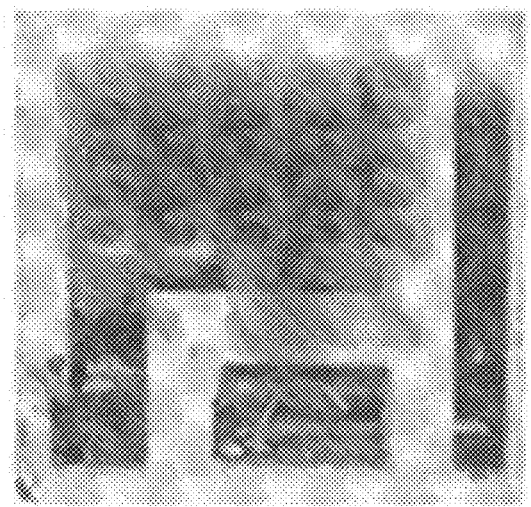
FIG. 10B illustrates a photograph of an exemplary PE gated PLET with patterned 5×5 matrix gate electrodes, according to some embodiments.
Figure 10D:
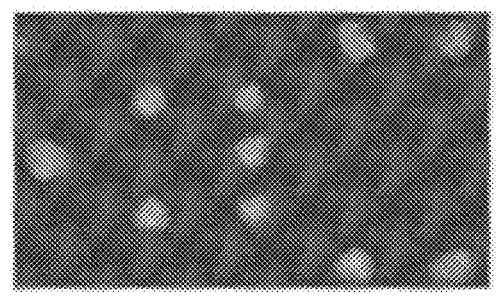
FIGS. 10D-G illustrate a photograph of exemplary PE gated PLETs being selectively turned on a 5×5 matrix to display letters A, T, O, M.
Figure 10E:
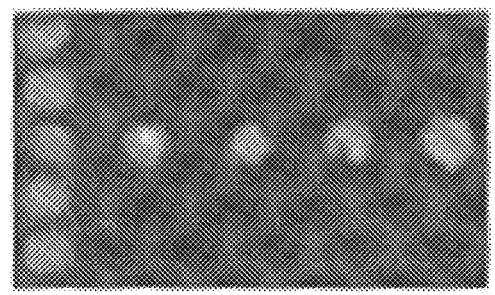
Figure 10F:
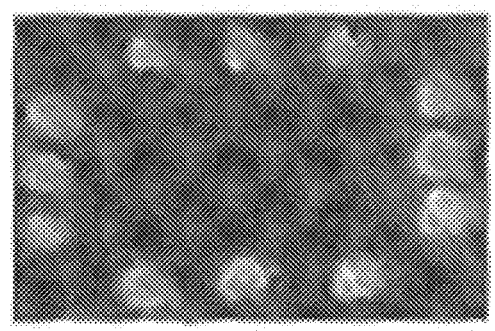
Figure 10G:
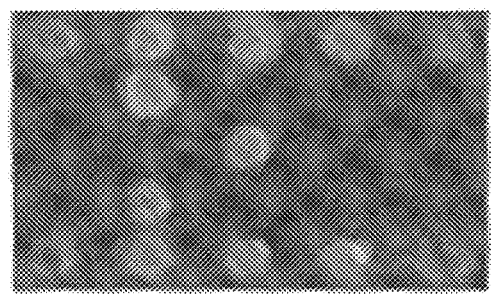
Figure 11:
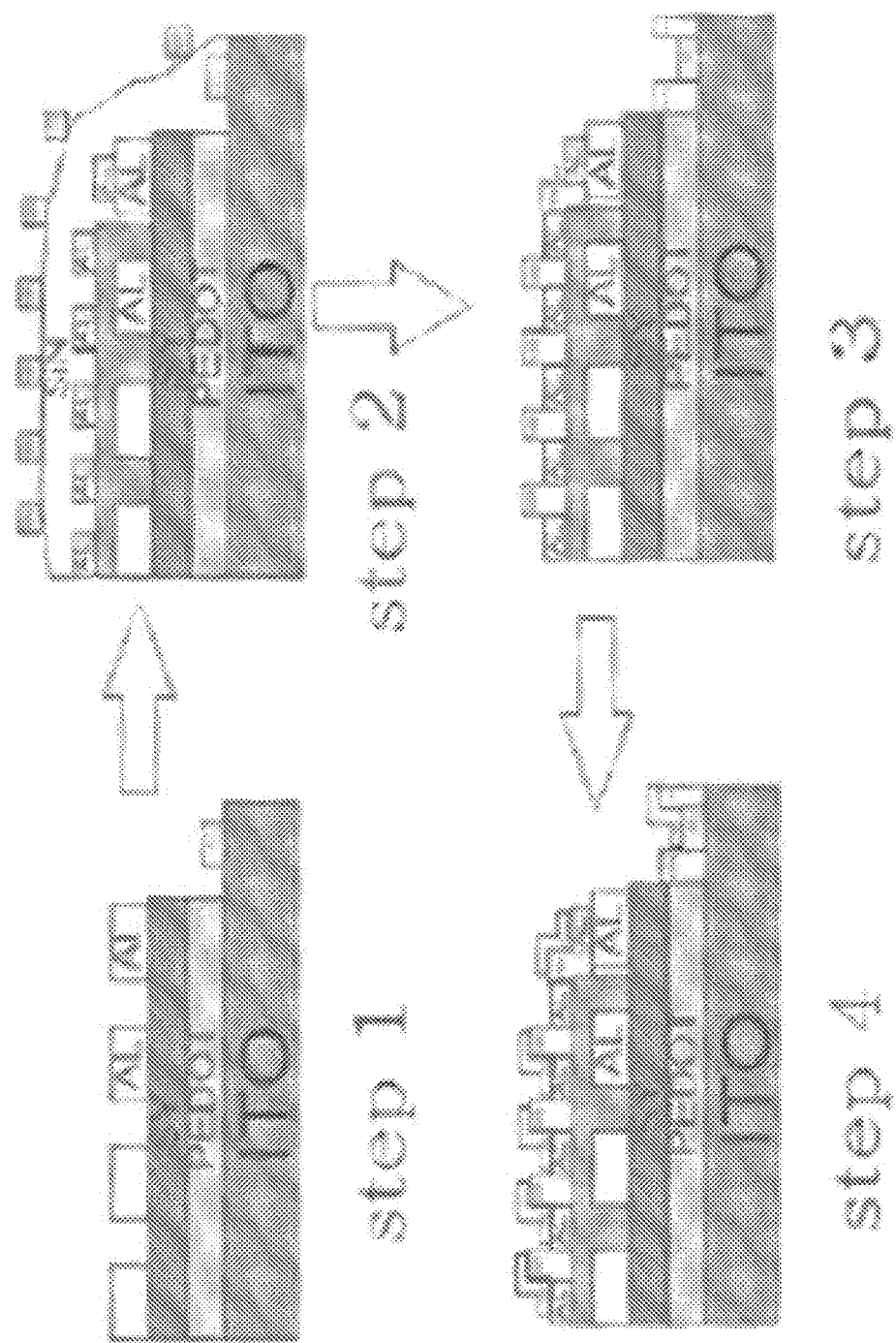
FIG. 11 illustrates fabrication steps for an exemplary PE gated PLET with a patterned 5×5 gate electrode matrix, according to some embodiments.
Figure 12:
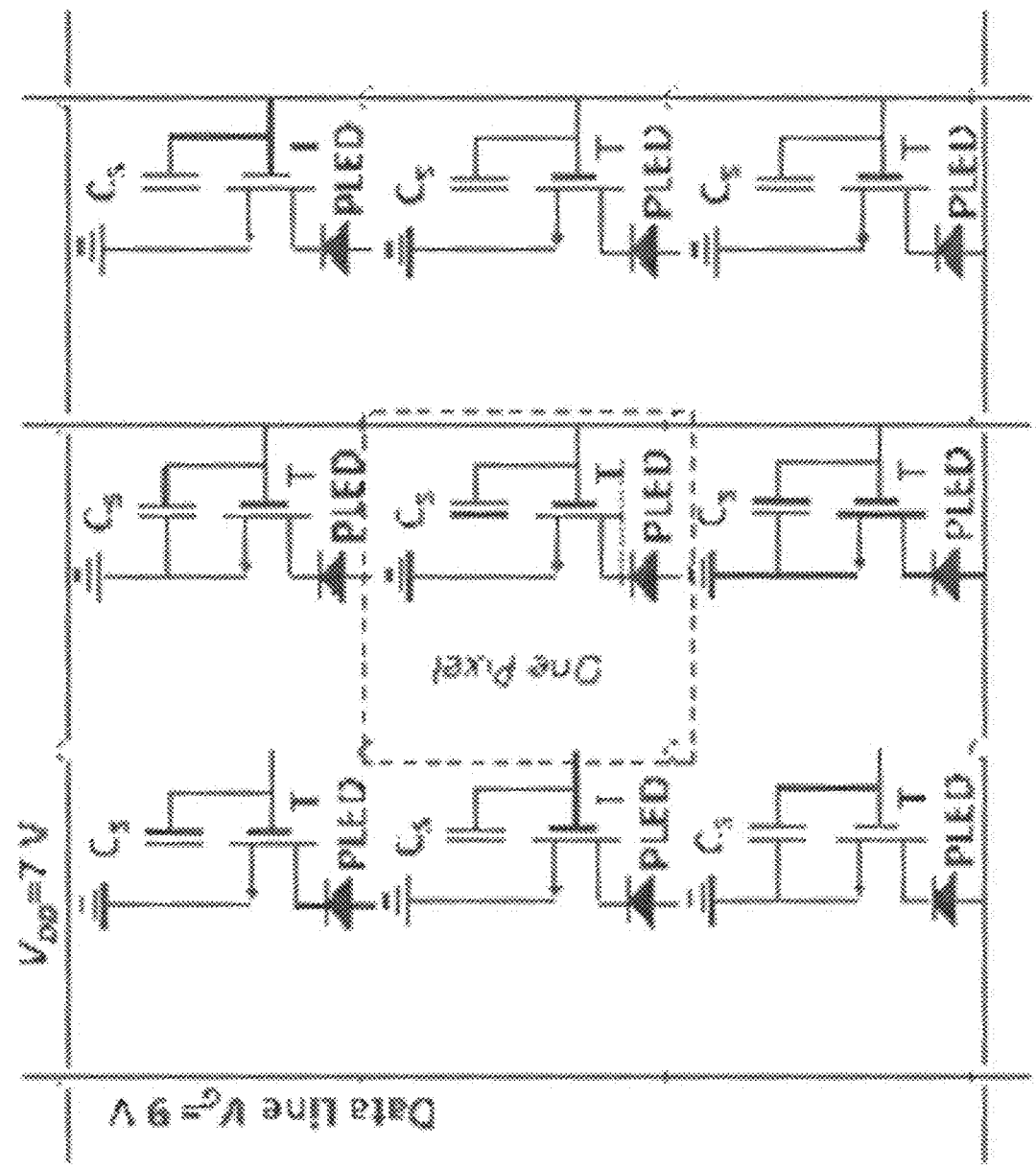
FIG. 12 illustrates an equivalent circuit diagram of a patterned gate electrode matrix, according to some embodiments.

To evaluate the disclosed PE gated PLET devices for active PE-gated PLET, a 5×5 gate matrix was fabricated on a 11 mm×6 mm PE coated PLED devices, as shown in FIGS. 10A and 10B. Each gate electrode was designed as a circle with diameter of 0.7 mm. For the fabrication, a 5×5 aluminum island matrix was deposited on a PE coated PLED via laser-cut shadow mask using thermal evaporation. Then a layer of 150 nm-thick $SiN_x$ was deposited using low temperature (150° C.) plasma enhanced chemical vapor deposition, which served as a spacing layer to accommodate gate electrode interconnections. The $SiN_x$ covered on aluminum islands were removed via dry etching. To complete the device, the interconnected electrodes were deposited on $SiN_x$ to connect Al island array. These steps are illustrated in FIG. 11. Under a cathode-anode bias ($V_{DD}$) of 7V, a 5×5 pixel matrix was completely turned on when potential of 9 V was applied to $V_G$, as shown in FIG. 10C. The equivalent circuit diagram of an active matrix display is shown in FIG. 12. By controlling the gate electrode voltage supplies, the letters A, T, O, M were displayed under the same operation $V_{DD}$ and $V_G$, shown in FIGS. 10D-10G.

Light-Emitting Devices with Composite Material Electrodes to Facilitate Injection of Carriers into the Active Layer According to other embodiments, a light emitting device can include a composite material electrode between an electrolyte layer and an organic semiconductor layer. The composite material can be a mixture of a metal, such as Al, Ag, Au, Mg, Fe, Cu and combinations thereof and an inorganic compound such as an alkali metal compound, e.g., an aluminum lithium fluoride (Al:LiF), CsF, sodium fluoride (NaF), cesium fluoride (CsF), lithium bromide (LiBr), cesium bromide (CsBr), sodium bromide (NaBr), sodium chloride (NaCl), sodium chloride (LiI), cesium iodide (CsI), lithium triflate ($LiC_3FSO_3$), potassium triflate ($KC_3FSO_3$), cesium triflate ($CsC_3FSO_3$), $Li_2CO_3$, $Cs_2CO_3$, potassium carbonate ($K_2CO_3$), sodium carbonate ($Na_2CO_3$), LiF, CsF, $BaTiO_3$, and $SrTiO_3$, one or more a dielectric polymers selected from PMMA, polyethylenimine, polymer electrolytes, and conjugated polyelectrolytes, Teflon, CYTOP, PEO and Nafion, and an ionic gel formed from the combination of a dielectric polymer and an ionic liquid and so on. In some embodiments, the work function of the composite material electrode can be modulated to facilitate electron injection in the organic semiconductor layer, in response to a voltage applied at a gate terminal. In one or more embodiments, the inorganic compound can be selected to lower the work function of the electrode (relative to the metal alone). The composite material can be non-porous. In one or more embodiments, the electrolyte does not make contact with the organic semiconductor, and therefore there is no electrochemical doping in the organic material induced by the electrolyte. The ratio of metal and alkali salt can range between 1:1 and 10:1.

Figure 13A:
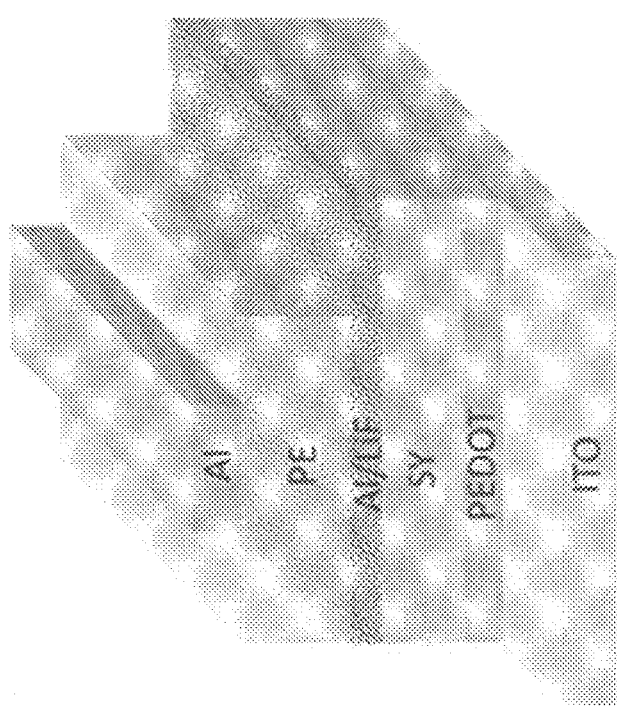
FIG. 13A illustrates a three dimensional schematic illustration of an exemplary polymer electrolyte capacitor (PEC) light-emitting diode (PLED) (PEC|PLED), according to some embodiments.

For example, FIG. 13A shows a three-dimensional schematic illustration of an exemplary polymer electrolyte capacitor PEC|PLED. The PEC|PLED can have different layers of materials, for example, an anode electrode, such as a transparent material, indium thin oxide (ITO), light emitting enhancement layer such as a hole-injecting layer, for example, a polymer, such as, poly(3,4-ethylenedioxythiophene) (PEDOT), an active material, for example, an organic semiconductor, such as super yellow (SY), and a composite material, such as Al:LiF, as a cathode electrode. The PEC|PLED can also have a polymer electrode (PE), and a gate electrode, e.g., a conductive material such as Al. Unless otherwise noted, the anode, light emitting enhancement layer, active material, polymer electrolyte and gate electrode can be substantially as described hereinabove for the PE/PLET light emitting device. Specifically, as shown in FIG. 13A, the active material super yellow (SY, a poly-(p-phenylene vinylene) derivative) can be deposited between a poly(3,4-ethylenedioxythiophene): polystyrene sulfonate (PEDOT:PSS) coated indium tin oxide (ITO) anode electrode and a thermally co-evaporated porous aluminum Al:LiF composite cathode electrode, to form a polymer light-emitting diode (PLED).

The layer of polymer electrolyte (PE) can be deposited on top of the Al:LiF composite cathode electrode, for example, by spin coating 79.5 milligram per mL PE solution in ethyl acetate at a speed of 1000 rpm for 60 second. The PE solution can contains poly(methyl methacrylate) (PMMA): poly(ethylene oxide) (PEO):lithium triflate at the weight ratio of 2:1:0.18 with a total weight of 159 milligrams dispersed in 2 mL of ethyl acetate. On top of the PE coated PLED, an Al gate electrode, e.g., having thickness of 100 nm, can be evaporated to form a polymer electrolyte capacitor (PEC) loading on the SY-PLED forming a PEC|PLED.

In one more embodiments, the PEC/PLED device can include a plurality of gates, each of which are optionally individually addressable. The individually addressable gates can be used in a matrix display application. A matrix display according to one or more embodiments is shown in FIGS. 20A-20D. The light was emitted only at the areas where the gate electrodes overlapped over the cathode electrode. The disclosed PLED display has no pixel patterning requirements for a light emissive layer, a source electrode, and a dielectrics layer, which results in greater simplicity and ease of fabrication.

Figure 13B:
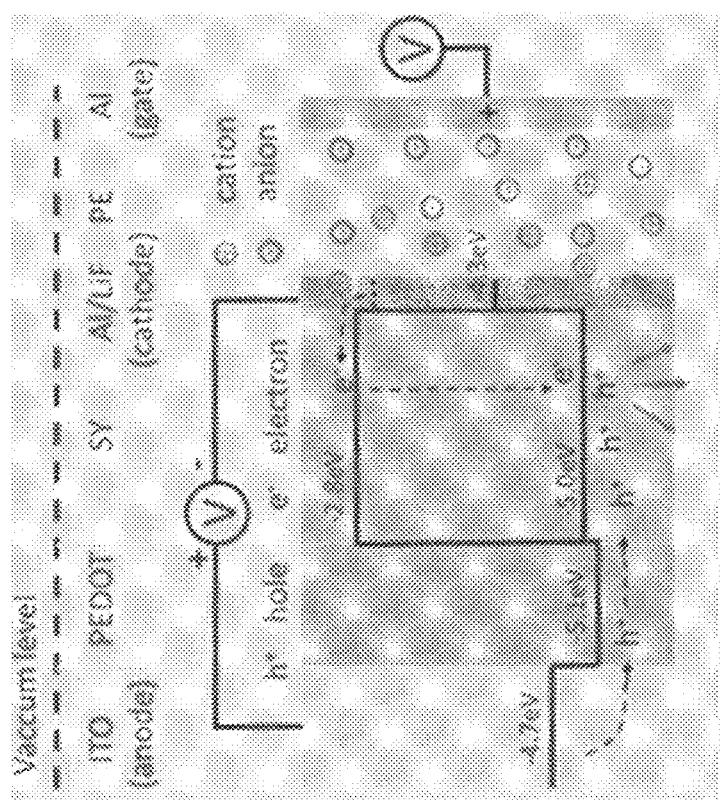
FIG. 13B illustrates an exemplary PEC|PLED with a device energy diagram, according to some embodiments.

FIG. 13B shows the operating mechanism of an exemplary PEC|PLED. According to some embodiments, the performance of the PLED can be reversibly modified by altering the potential of Al:LiF composite electrode. This can lead to varied injection barrier associated with different charge carrier injection. In addition, the ionic space charge or ultrathin double layer of electrolytes at the Al:LiF composite electrodes can affect the potential of the composite electrode. The potential of the Al:LiF composite electrode can be tunable by a gating field through polymer electrolytes. When the PE capacitor (PEC) is charged, $Li^+$ ions move to negative electrode and triflate ions move to positive electrode. The accumulated ions at the Al:LiF composite electrode can interact with the LiF to enhance or lower the electron injection barrier of the SY PLEDs. This results in the tunable electroluminescence and energy conversion efficiency of the SY PLEDs.

Figure 14:
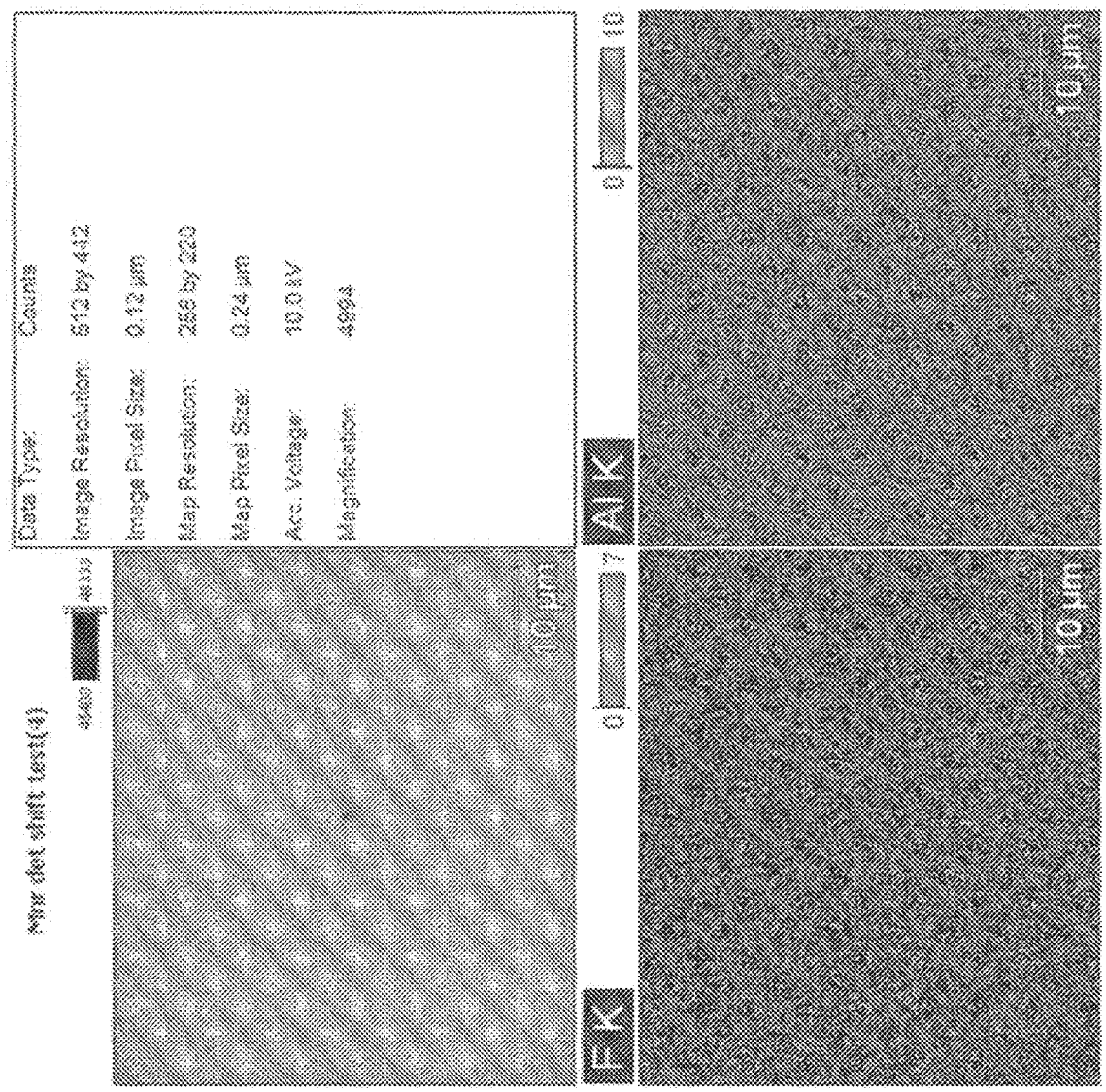
FIG. 14 illustrates energy dispersive spectroscopy (EDS) images showing a homogeneous distribution of LiF and Al across a composite surface, according to some embodiments.

FIG. 13C shows a SEM image of the Al:LiF composite electrode showing the abscission of charging materials. The Al:LiF composite electrode was characterized with scanning electron microscope, in which the randomly distributed dark dots were imaged possibly due to the abscission of charging materials (the white spots). The Al:LiF composite was also characterized with energy dispersive spectroscopy (EDS) images, as shown in FIG. 14. The EDS images show homogenous distribution of LiF and Al across a composite surface with weight ratio of 1/2.23.

FIG. 13D shows an SEM image of a cross section of an exemplary PED|PLED. FIG. 13D shows the PEC|PLED layers and associated exemplary layer thickness, including ITO (200 nm), PEDOT (20 nm), SY (50 nm), Al:LiF composite electrode (30 nm), polymer electrolyte (1.5 µm), and Al (100 nm).

Figure 15:
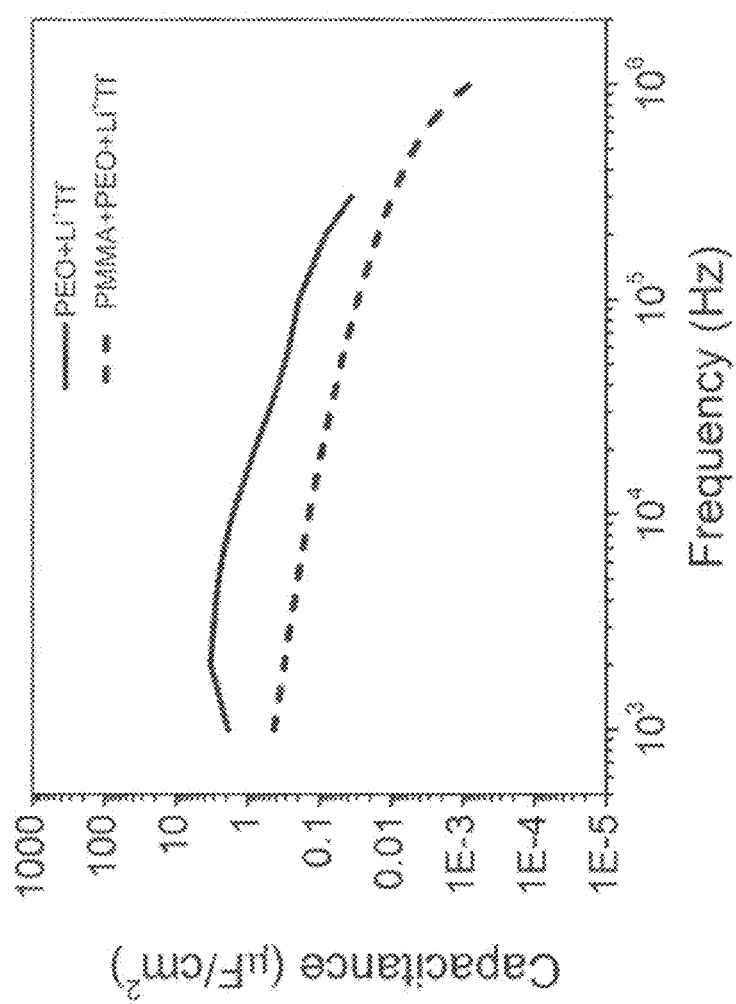
FIG. 15 is a graph of a capacitance for different frequency values, according to some embodiments.
Figure 16:
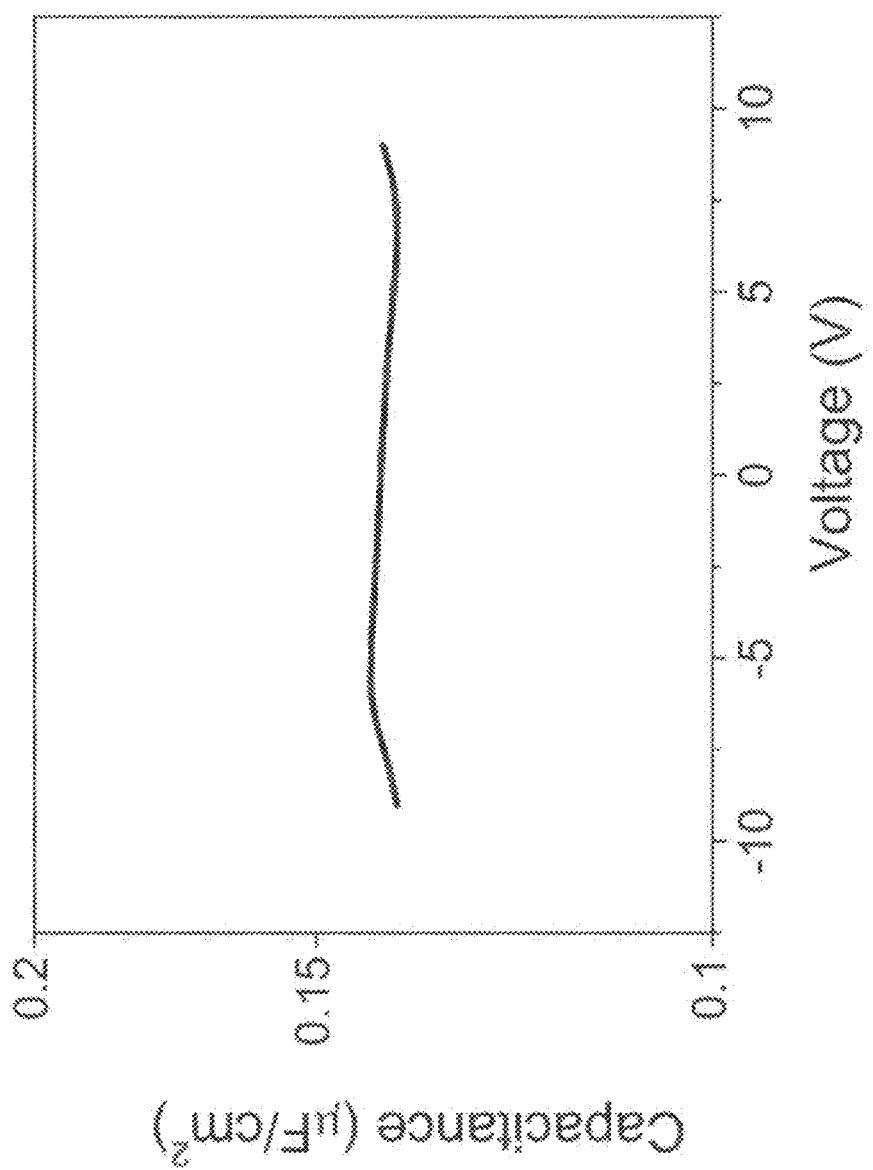
FIG. 16 is a graph of the capacitance for different voltage values, according to some embodiments.
Figure 18:
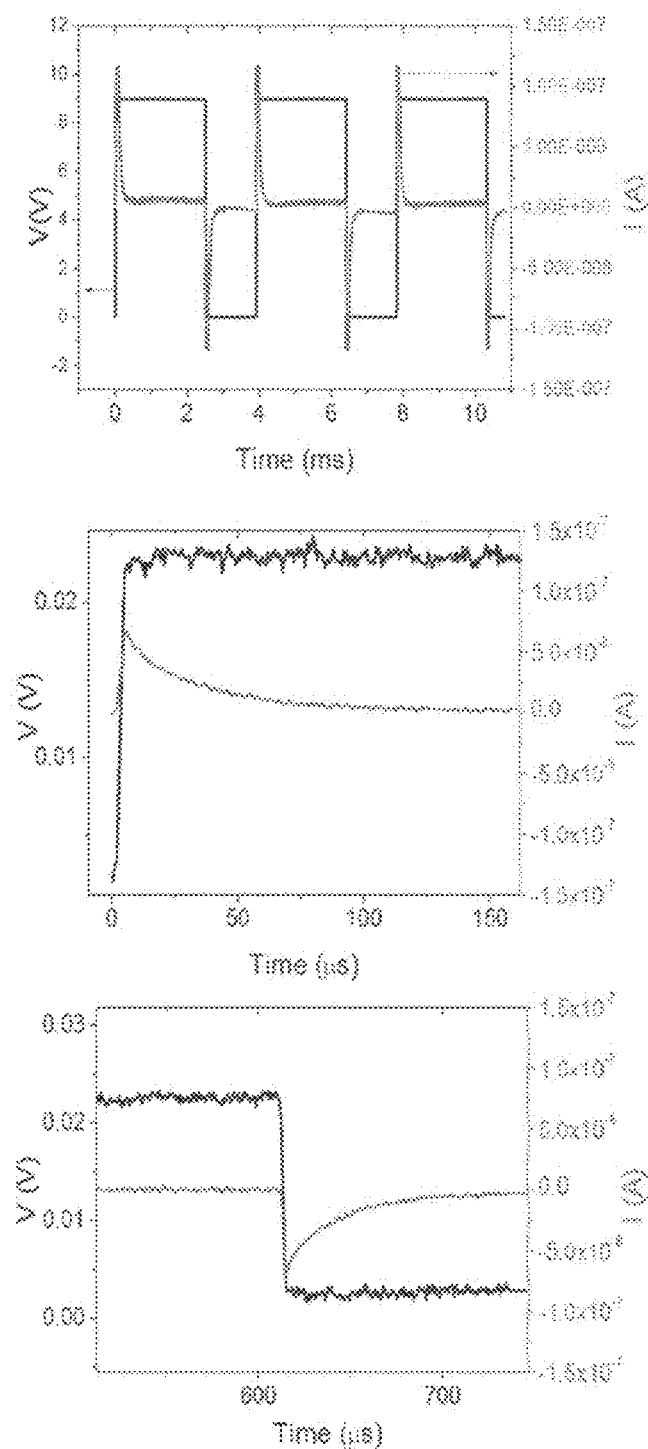
FIG. 18 illustrates charging and discharging rates of a capacitor comprising Al|PE|Al, according to some embodiments.

The exemplary device shown in FIG. 13A was characterized in nitrogen filled glovebox using Keithley 4200 SCS (semiconductor characterization system). The PE layer between the Al gate electrode and the Al:LiF composite cathode can form a capacitor. As shown in the exemplary devices of FIGS. 15 and 16, the capacitance of the PE layer ($C_{PE}$) was measured to be 0.44 µF per cm$^{-2}$ when applying a 1 kHz ac signal. This value is about one order of magnitude lower than that of PEO/Li$^+$ salt (5 µF cm$^{-2}$) and higher than that of 100 nm PMMA (0.02 µF cm$^{-2}$). The charging and discharging rates were measured to about 100 µs and 80 µs, as shown in FIG. 18. The current density ($J_{PLED}$) and luminance (L) transfer characteristics and monolithic PED|PLEDs were measured by setting the Al:LiF composite cathode as the source and applying $V_{DD}$=5V at the PEDOT: PSS coated ITO anode.

Figures 17A, 17B:
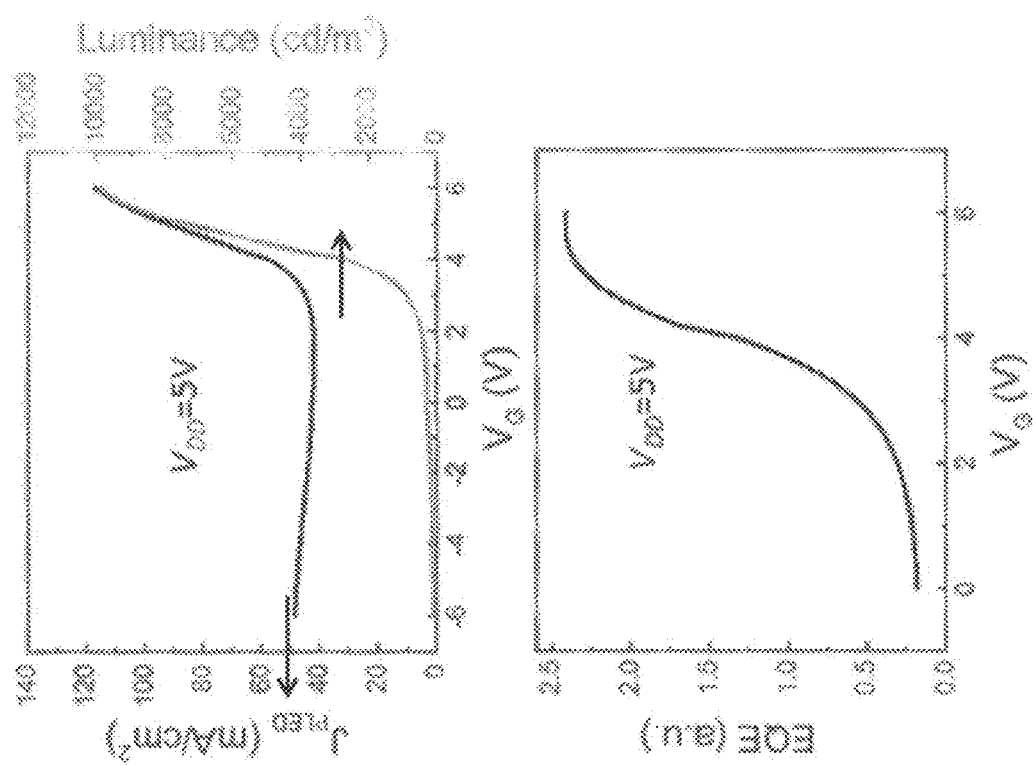
FIG. 17A illustrates the current density and the luminance transfer characteristics of an exemplary PEC|PLED, according to some embodiments.
FIG. 17B illustrates the calculated EQE based on transfer data of an exemplary PEC|PLED, according to some embodiments.

FIG. 17A shows a graph of the current density ($J_{PLED}$) and the luminance (L) versus the gate electron voltage ($V_G$). These graphs show the gate dependence ($V_G$) of the light emission for the PEC|PLED.

Referring back to FIG. 17A, $V_G$ is swept from 0 V to 6 V, the capacitor $C_{PE}$ was charged (Q=$C_{PE}$-$V_G$). The accumulated Li$^+$ at the composite cathode (determined by $V_G$) perturbed the potential of Al:LiF composite cathode by ion space charge or ultrathin electric double layer, which improved the electron injection. The tunable electron injection by charging the PE capacitor can modulate the electron current that can contribute to the increase of $J_{PLED}$ about three times from 40 mA/cm$^2$ at $V_G$=0V to 120 mA/cm$^2$ at $V_G$=6 V. In contrast, the luminance (L) detected from the device exponentially increased from <100 cd m$^{-2}$ to >8000 cd m$^{-2}$ when the gate potential was swept from 0 V to 6 V. The different gate potential dependence of L from $J_{PLED}$ is ascribed to continuously improved electron-hole balance for more efficient emission. Reversely, the anion (CF$_3$SO$_3^-$) was driven towards cathode by sweeping $V_G$ from 0V to -6V. The gathered CF$_3$SO$_3^-$ seems to have negligible perturbation on the potential Al:LiF composite electrode.

Figure 17C:
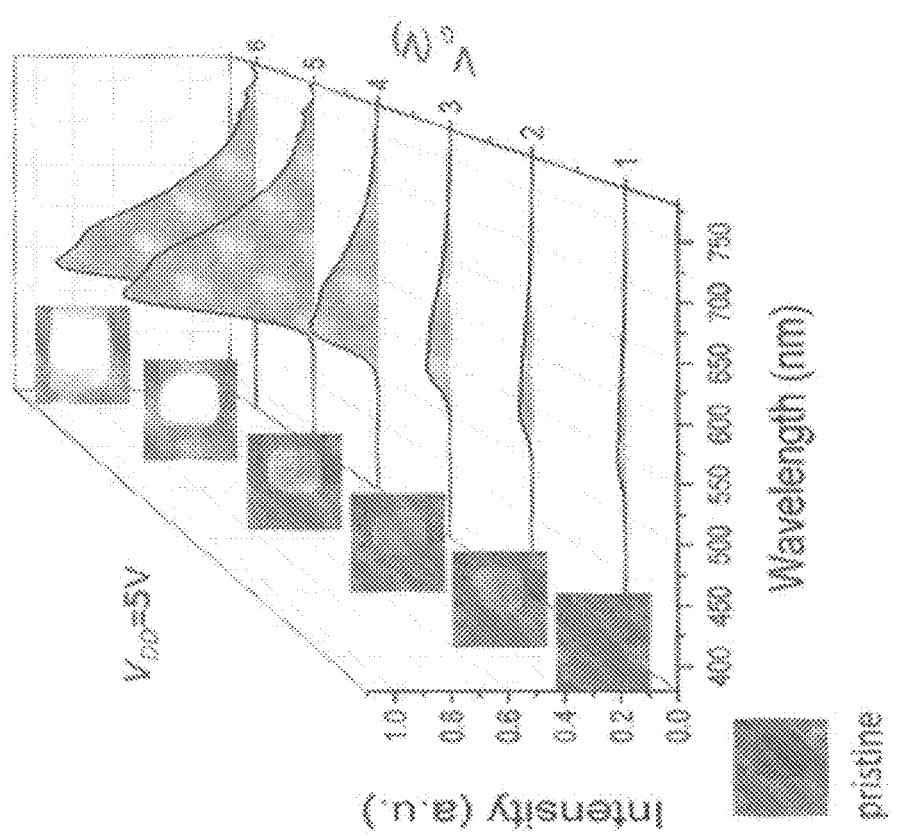
FIG. 17C illustrates the electroluminescence spectra ranged from 500 nm to 775 nm of an exemplary PEC|PLED where the gate voltage is varied from 1V to 6V, according to some embodiments.

FIG. 17A also shows that the current density $J_{PLED}$ value under negative values of the gate electrode voltage $V_G$ was almost same as the value when the gate electrode voltage $V_G$=0V. FIG. 17B shows the curve of EQE as a function of the gate electrode voltage $V_G$. The EQE exponentially increased from 0.025% to 2.4% with when the gate electrode voltage $V_G$ increased from 0 V to 6 V. This indicates the current efficiency and brightness of monolithic integrated PEC|PLEDs can be effectively modulated by charging and discharging the PEC, behaving as a PLET. The electroluminescence spectra ranged from 500 nm to 775 nm were recorded using PR650 photometer at varied $V_G$ from 0 V to 6 V with interval of 1 V, as shown in FIG. 17C.

Figure 19B:
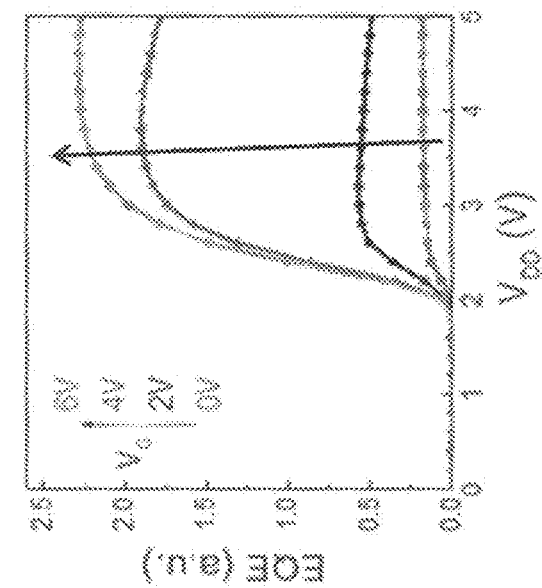
FIG. 19B illustrates the calculated EQE of an exemplary PEC|PLED, according to some embodiments.
Figure 19A:
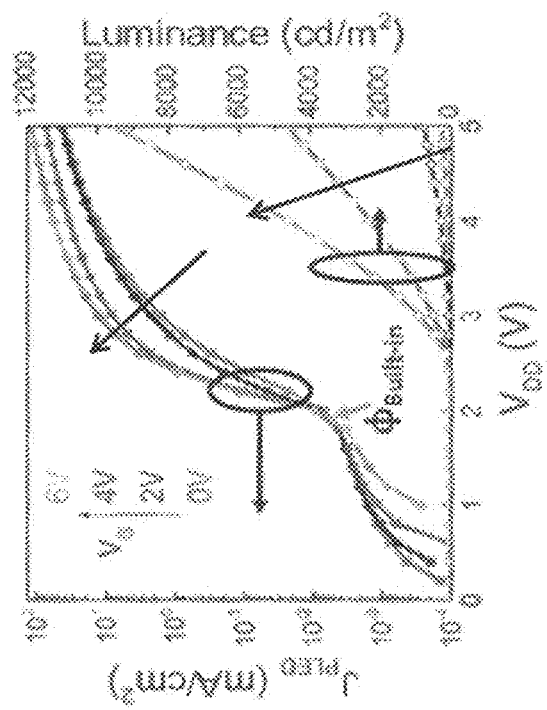
FIG. 19A illustrates the current density ($J_{PLED}$) and the luminance (L) output characteristics of an exemplary PEC|PLED, according to some embodiments.

The current density ($J_{PLED}$) and luminance (L) output characteristic of the monolithic integrated PEC|PLEDs were also characterized by sweeping $V_{DD}$ from 0V to 5V applied at the ITO anode electrode in reference to Al:LiF composite cathode, at different gate potentials ($V_G$=0, 2, 4, 6 V), as shown in FIG. 19A. The $J_{PLED}$-$V_{DD}$ curves were relatively similar with a slight increase in current density with $V_{DD}$ when $V_G$ increased from 0 V to 6 V. In contrast, the L-$V_{DD}$ curves showed a strong dependence on gate voltage, with the luminance increasing from a maximum luminance of 100 cd/m$^2$ at $V_D$=0 V to 9500 cd/m$^2$ at $V_G$=6 V. Consequently, the maximum EQE value increased over two orders of magnitude from 0.025% to 2.4% with $V_O$ increased from 0 V to 6 V, as shown in FIG. 19B. These results are consistent with transfer data, further supporting that the increased luminance and external quantum efficiency resulted from the improved electron and hole injection balance that was effectively modulated by the applied gate potential.

According to some embodiments, FIGS. 19C and 19D show the temporal responses of the current density $J_{PLED}$ and luminance L of an exemplary PEC|PLED. The temporal response were recorded at $V_{DD}$=5 V, by applying a rectangular pulse potential at the gate electrode $V_G$ between -6 V and 6 V, as shown in FIG. 19C, and a rectangular pulse potential at the gate electrode $V_G$ between 0 V and 6 V, as shown in FIG. 19D. FIG. 19C shows that both $J_{PLED}$ and L sharply increase and decrease within the time scale of 1 second, when the pulse potential switches from $V_G$=6 V to -6 V or vice versa. This temporal response is faster than the tens of seconds exhibited by a electrochemical doping device. These results demonstrate the reversibility, the stability and consistency of the disclosed PED|PLEDs. FIG. 19D shows that both $J_{PLED}$ and L sharply increase when the pulse potential $V_G$=6 V is applied and slightly drop after every pulse is released. The migrated ions remain as stored potential (Q=$C_{PE}$-$V_G$) in the capacitor $C_{PE}$ after the pulse potential is dismissed, which is important for driving transistors in a dynamic display. The slight decrease when the gate voltage drops below $V_G$=0 V can be because of the ion redistribution under the stored potential.

To evaluate the disclosed PEC|PLEDs for active matrix display applications, an active matrix PLED display module was formed by patterning seven gate electrodes on a 11 mm×6 mm PED|PLED, as shown in FIG. 20A. FIG. 20B shows the detailed dimension and spacing of the different gate electrodes. FIG. 20C shows a photograph of a prototype driving circuit board. With the control of driving electronics, the PEC|PLED displayed digital numbers from 0 to 9, as shown in FIG. 20D. The light was emitted only at the areas where the gate electrodes overlapped over the cathode electrode. The disclosed PLED display has no pixel patterning requirements for a light emissive layer, a source electrode, and a dielectric layer. This is an advantage over prior art OLED displays because it results in a less complicated fabrication procedures, lower costs, and high pixel density.

The co-evaporated Al:LiF composite cathode electrode introduces benefits to the PEC|PLED. Specifically, it can form a stable and a transparent cathode with low work function that improves the performance of prior art OLEDs. The reproducibility and the fabrication control for Al:LiF are superior to Al/LiF bilayer and Al/Li alloy electrode. In addition, the homogenously mixed Al:LiF composite cathode can interact with PE for surface potential modulation by applied gate potential.

Several trials with ionic liquid, ionic liquid polymer composites showed the device degradation possibly due to the electrochemical reactions between ionic liquid and low work function electrode or light emitting layer. In one or more embodiments, a component in the PE is PMMA. PMMA is used to reduce and/or eliminate gate leakage. PMMA can also provide thermal resistance and mechanic strength to support metal via thermal vapor deposition. Additionally, PMMA assists the solubility of PEO/CF$_3$SO$_3^-$ Li$^+$ in ethyl acetate solvent which provides an orthogonal solution to process PEC on PLED without damaging active SY layer.

Experimental Setup

Materials. Aluminum slug (99.99%, 0.25 in×0.25 in) and PEO (poly(ethylene oxide), average molecular weight, 6,000 g mol$^{-1}$) were purchased from Alfa-Aesar PMMA (poly(methyl methacrylate) average molecular weight. ~120,000 g mol$^{-1}$) and LiCF$_3$SO$_3$ (lithium triflate, 99.995%) were purchased from Aldrich. Chlorobenzene (anhydrous, 99.8%) was purchased from Sigma-Aldrich. Ethyl acetate (residue free, 99.99%) was purchased form Acros. Super yellow (Ph-PPV, poly(para-phenylenevinylene) were purchased from Merck. PEDOT:PSS (poly(3,4-ethylenedioxythiophene):poly(styrene sulfonate), Clevios™ 4083) were purchased from Heraeus: IOT glass substrates (Indium-tin-oxide, sheet resistance, 10 $\Omega sq^{-1}$) were purchases from Foshan Meijm Yuan glass technology CO., LTD. All materials were used as received.

PLED Fabrication. ITO glass substrates were cleaned by using sequential ultra-sonication in detergent water, de-ionized water, acetone, and isopropanol. Each ultrasonic bath lasted for 20 minutes. After drying under a nitrogen flow, the ITO glass substrates were subjected to UV-ozone treatments for 30 minutes in a UVO cleaner (Model No. 42, Jelight Company Inc). To fabricate polymer light emitting diode (PLED), PEDOT:PSS solutions was spin-coated onto ITO glass substrates at 3000 r.p.m. for 60 s and annealed at 120° C. for 30 min in air. Then, a solution of super yellow was prepared in chlorobenzene at a concentration of 4 mg/ml and was spin-coated on PEDOT:PSS-coated substrates at 1200 r.p.m. for 60 s. The super yellow-coated substrates were transferred into a nitrogen-filled glove box with $O_2$ and $H_2O$ levels below 0.5 p.p.m. and annealed at 120° C. for 30 min. The samples were then transferred into the vacuum deposition system (EcoVap, Mbruan, Inc.) for electrode deposition.

Under one embodiment a thin layer of aluminum cathode with various thicknesses from 10 nm to 100 nm was deposited on super yellow-coated substrates via thermally evaporation through a shadow mask under a high vacuum of $-41 \times 10^{-6}$ torr. The device areas was 0.36 $cm^2$ as defined by the overlapping area of ITO and Al cathode electrodes.

Under another embodiment a thin layer of aluminum LiF composite cathodes with thickness of 30 nm were codeposited on super yellow-coated substrates via thermally evaporation through a shadow mask under a high vacuum of $-4 \times 10^{-6}$ torr. The device area was 0.16 $cm^2$ as defined by the overlapping area of ITO and porous Al cathode electrodes.

PE gated PLET Fabrication. Polymer electrolyte comprising of PMMA, PEO, and $LiCF_3SO_3$ with a weight ratio of 4/1/10.18 was dissolved in ethyl acetate with a concentration of 79.5 mg/mL. The solution was sonicated for 30 min and spin-coated on as-fabricated PLED at 1000 r.p.m for 60 s for 3 times, the films were annealed at 120° C. for 10 min in nitrogen atmosphere glovebox. On top of polymer electrolyte, 100 nm-thick aluminum film was deposited by thermal evaporation as gate electrode. The active area was 0.16 $cm^2$ as defined by the overlapping area of Al cathode and gate electrodes. For active matrix display application, the gate electrode composed of a 5×5 aluminum island matrix that patterned laser cutted shadow mask was deposited on polymer electrolyte coated PLED via thermal evaporation. Then a layer of 200 nm-thick $SiN_x$ was deposited to encapsulate the device via low temperature (150° C.) plasma enhanced chemical vapor deposition. The $SiN_x$ covered on patterned 5×5 gate electrode matrix were removed via dry etching. Finally, the interconnecting aluminum were deposited on $SiN_x$ to connect selected aluminum islands for demonstrating company logo (ATOM).

PEC|PLED Fabrication. Polymer electrolyte comprising of PMMA, PEO, and $LiCF_3SO_3$ with a weight ratio of 2/1/0.18 was dissolved in ethyl acetate with a concentration of 79.5 mg/mL. The solution was sonicated for 30 min and spin-coated on as-fabricated PLED at 1000 r.p.m. for 60 s, the films were annealed at 120° C. for 10 min in nitrogen atmosphere glovebox. On top of polymer electrolyte, 100 nm-thick aluminum film was deposited by thermal evaporation as gate electrode. The active area was 0.16 cm2 as defined by the overlapping area of Al:LiF composite cathode and gate electrodes. For active matrix display application, the seven gate electrodes that patterned by laser cut shadow mask was deposited on polymer electrolyte coated PLED via thermal evaporation.

Device Characterization of first embodiment. Atomic force microscopy (AFM, FastScan, Bruker) measurements were done on supper yellow and aluminum cathode layer in a 500 nm×500 nm area. The PLED/PE gated PLET devices were electrically contacted using a clamp (3M) with spring loaded Au-coated probes for anode, cathode, and gate contact, which were located in a dark box. All measurements took place inside a nitrogen atmosphere glovebox. A Si photodiode was used to measure the light output. The photocurrent and current density—voltage characterizations, temporal responses were measured with a Keithley 4200 SCS (semiconductor characterization system), which is controlled by a LabVIEW program. In all measurements, the cathode of PLED/PE gated PLET were held at ground potential. The anode ($V_{DD}$) and gate voltage ($V_G$) were applied to the ITO and gate Al electrode, respectively.

Device Characterization. The cross-sectional morphology of monolithic integrated PED|PLEDs was characterized using a FEI Nova 230 high resolution scanning electron microscope (SEM) at an accelerating voltage of 10 kV. The PLED/PE gated PLED devices were electrically contacted using a clamp (3M) with spring loaded Au-coated probes for anode, cathode, and gate contact, which were located in a dark box. All measurements took place inside a nitrogen atmosphere glovebox. A Si photodiode was used to measure the light output. The photocurrent and current density-voltage characterizations, temporal responses were measured with a Keithley 4200 SCS (semiconductor characterization system), which is controlled by a LabVIEW program. In all measurements, the cathode of monolithic integrated PEC|PLEDs were held at ground potential. The anode voltage ($V_{DD}$) and gate voltage ($V_G$) were applied to the ITO layer and gate Al electrode, respectively. A digital camera was used to record the photograph and video of light emission. The capacitance was measured with 4225 RPM amplifier via co-axial probes. Electroluminescence spectra were recorded using PR650 photometer.

Active Matrix Display Demonstration. The prototyping circuit was built on a 175 mm×145 mm breadboard. The drain-source power was fed by eight batteries (AA) connected in series in a battery holder. The positive and negative gate voltages were supplied by a +12 V and −12 V off-board DC power through two DC-barrel jacks. Each power supplier was controlled by a rotary potentiometer. Each of the seven gate electrodes were connected to power supplier through a two-way switcher, so that the gate electrodes could be selectively connected to a positive or negative power supplier.

Electrolytes are used in organic electronics due to the synergy between electrolytes and organic molecules. In electrolyte-gated-thin-film transistors, electrolytes can provide ultra-high capacitance upon polarization, which enable low voltage operation. And, in OLEDs and organic solar cells, electrolytes can improve the charge injection from electrodes to organic semiconductors. Moreover, in electrochemical transistors and light-emitting electrochemical cells, electrolytes can dope the organic molecular though electrochemical doping and modify the conductivity of organic thin film. According to some embodiments, a porous cathode comprising a mixture of conductive metal and alkali salts is proposed to form a channel. The channel allows electrolyte in capacitor cell to contact with organic layer in light emitting cell and makes low voltage operation for capacitor and electrochemical doping for organic layer come true regardless of polymer electrolyte thickness.

Figure 21:
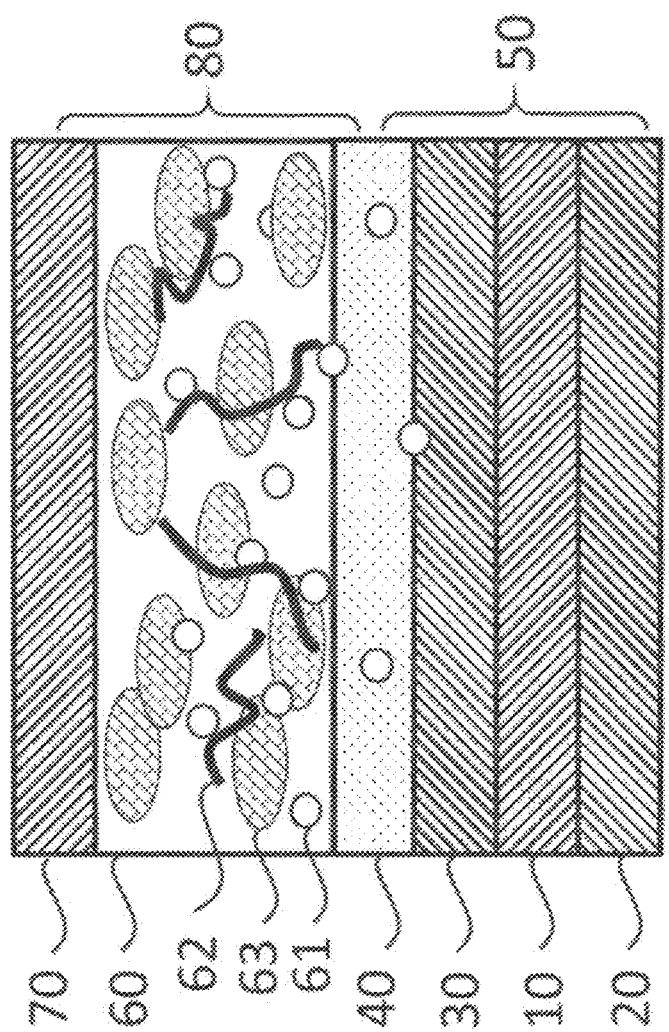
FIGS. 21-24 illustrate cross-sectional views of exemplary vertical electrolyte-gated organic light-emitting transistors, according to some embodiments.

Referring to FIG. 21, a disclosed electrolyte-gated organic light-emitting transistor can comprise an anode electrode 10 disposed on a substrate 20. The substrate can comprise a glass. In other embodiments, the substrate can comprise a single crystal semiconductor, plastic foil, ceramic, and other materials, such as silicon, germanium, and gallium arsenide. An organic layer 30 can be disposed on the anode electrode 10. In other embodiments, there can be multiple organic layers disposed on the anode 10. A cathode electrode 40 can be disposed on the organic layer 30. The cathode electrode 40 can inject electrons into the organic layer 30. The cathode 40 is porous and can allow cations/anions 61 pass through and contact with organic layer 30. Similarly, holes can be injected into the organic layer 30 by the anode 10. An electrolyte layer 60 can be disposed on porous cathode electrode 40, and a gate electrode 70 can be disposed on electrolyte layer 60. In operation, a source-drain voltage ($V_{DS}$) is applied across the organic layer 30 via the anode electrode 10 and the cathode electrode 40, and a gate voltage ($V_G$) is applied across the electrolyte layer 60 via the cathode electrode 40 and the gate electrode 70. Basically, the drain/organic layer/source structure can form a light emitting cell 50, and the cathode/polymer electrolyte/gate structure can form a capacitor 80.

The metal in cathode electrode 40 can be, for example, Al, Ag, Au, Mg, Fe, Cu, Ca, and combinations thereof. A thin porous cathode layer 40, for example, in the range between 10 nm and 40 nm, can obtain enough pores with an average size of 0.1-5 nm to permit ion movement. When the porous cathode layer 30 thickness is below 10 nm, the conductivity of cathode is low. When the thickness is above 40 nm, the pores of cathode would be substantially blocked. In one or more embodiments, the electrolyte layer 60 can be is a mixture of alkali salts, ion conductor and materials solidifier. The alkali salts can be lithium triflate ($LiC_3FSO_3$), potassium triflate ($KC_3FSO_3$), cesium triflate ($CsC_3FSO_3$), lithium carbonate ($Li_2CO_3$), potassium carbonate ($K_2CO_3$), sodium carbonate ($Na_2CO_3$), cesium carbonate ($Cs_2CO_3$), and combinations therefore. The ion conductor can be polyethylene oxide (PEO), polystyrene sulfonate (PSS). The materials solidifier can be poly(methyl methacrylate) (PMMA). The solvent can be acetonitrile and ethyl acetate.

The organic layer 30 can emit light when a source-drain voltage ($V_{DS}$) is applied across the anode electrode 10 and cathode electrode 40. The light emission as well as the current flow can be controlled by a gate bias ($V_G$). With positive gate bias $V_G$, the capacitor 80 can be charged with cations 61 moving towards cathode electrode 40 and anions 61 towards gate electrode 70. By passing through porous cathode electrode 40, cations 61 can migrate into organic layer 30 and induce n-doping at the interfacial layer between organic material 30 and cathode electrode 40. This doping process can reduce the electron injection barrier, leading to a significant change of electron-hole recombinations and thus the electroluminescence.

Figure 22:
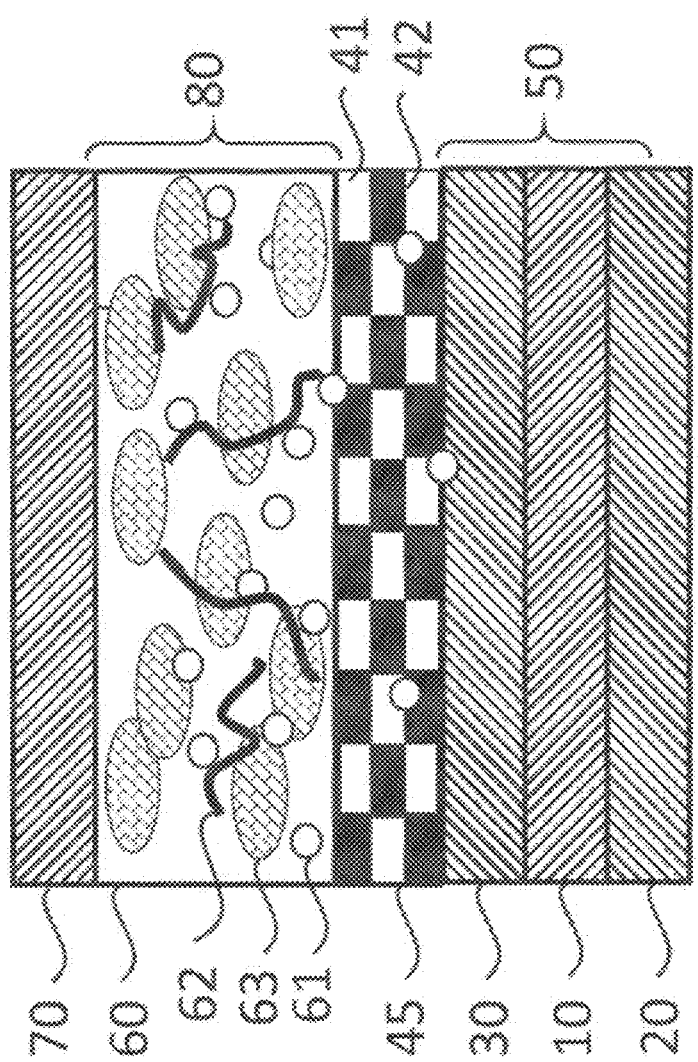

Referring to FIG. 22, a modification of the FIG. 21 embodiment, the porous cathode electrode 45 comprises a layer of mixture containing at least one conductive metal 41 and at least one alkali metal salt 42. The porous cathode electrode 45 can be designed to inject electrons into organic layer 30 and to allow for cations/anions 61 to pass through. The metal in cathode mixture can be, for example, Al, Ag, Au, Mg, Fe, Cu and combinations therefore. The alkali salt can be lithium fluoride (LiF), sodium fluoride (NaF), cesium fluoride (CsF), lithium bromide (LiBr), cesium bromide (CsBr), sodium bromide (NaBr), sodium chloride (NaCl), sodium iodide (LiI), cesium iodide (CsI), and combination therefore.

The porous cathode electrode 45 can have a thickness between 10 nm and 100 nm with average pore size of 0.1-5 nm. The ratio of metal 41 and alkali salt 42 can range between 1:1 to 10:1 by thickness as measured during deposition using a quartz crystal thickness sensor. According to some embodiments, porous cathode electrode 45 can be formed to maintain a sufficient electric conductivity, and to have enough pores that allow the ions 61 to make contact with organic layer 30.

The alkali metal salts 42 within cathode electrode 45 can be partially dissolved by solvent when coating with electrolyte layer 60. The electrolyte layer 60 can be a mixture of alkali salts 61, ion conductor 62 and materials solidifier 63. The alkali salts 61 can be lithium triflate ($LiC_3FSO_3$), potassium triflate ($KC_3FSO_3$), cesium triflate ($CsC_3FSO_3$), lithium carbonate ($Li_2CO_3$), potassium carbonate ($K_2CO_3$), sodium carbonate ($Na_2CO_3$), cesium carbonate ($Cs_2CO_3$), and combinations therefore. The ion conductor 62 can be polyethylene oxide (PEO), polystyrene sulfonate (PSS). The materials solidifier 63 can be poly(methyl methacrylate) (PMMA). The solvent can be acetonitrile and ethyl acetate.

Figure 23:
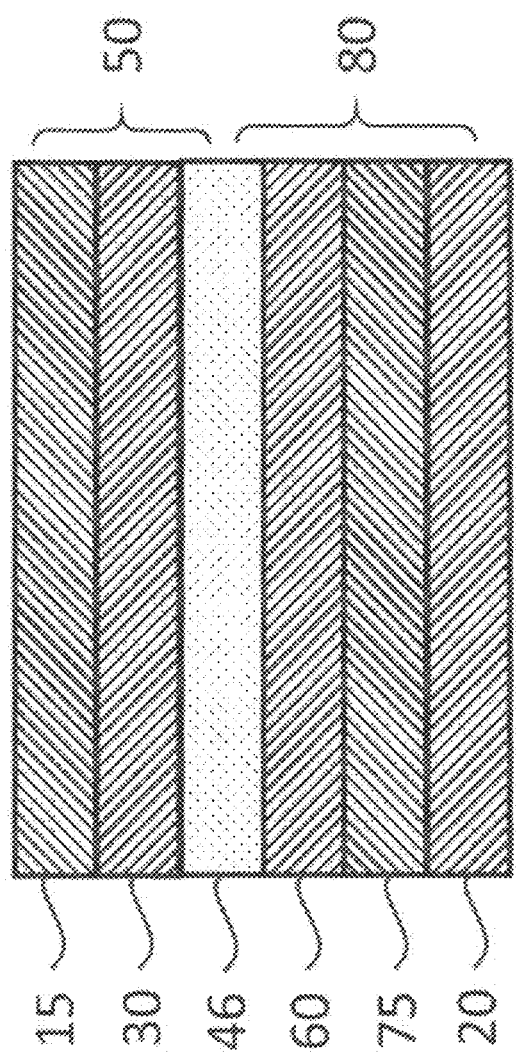

Referring to FIG. 23, the electrolyte-gated organic light-emitting transistor employs a bottom-gated structure. A gate electrode 75 is disposed on a substrate 20. An electrolyte layer 60 is disposed on gate electrode 75. A cathode 46 is disposed on the electrolyte layer 60. The cathode 46 comprises a layer of transparent and conductive metal, for example, Ag, Al, Au, and combination therefore. The cathode layer 46 can be thin enough to ensure light transmission from organic layer 30 and to ensure enough pores for ions 61 within electrolyte 60 to contact with organic layer 30. The thin porous cathode layer 46, can be between 10 nm and 40 nm with an average pore size of 0.1-5 nm. An organic layer 30 is disposed on the cathode electrode 46. An anode electrode 15 is disposed on the organic layer 30. The anode can comprise a metal layer, for example, Al, Ag, Au, Mg, Fe, Cu and combination therefore. In other embodiments, the anode can comprise a bilayer having a metal layer and a hole transport layer.

According to some embodiments, the gate electrode 75 can comprise at least one conductive material, which is transparent. For example, indium tin oxide (ITO) is substantially transparent to light transmission and can allow light emitted from organic layer 30 to propagate through without seriously attenuated. Other materials suitable for gate electrode 75 include tin oxide, indium oxide, zinc oxide, indium zinc oxide, zinc indium tin oxide, and mixtures therefore. The thickness of an anode comprising such an electrically conducting oxide can be between about 10 nm and about 500 nm.

Figure 24:
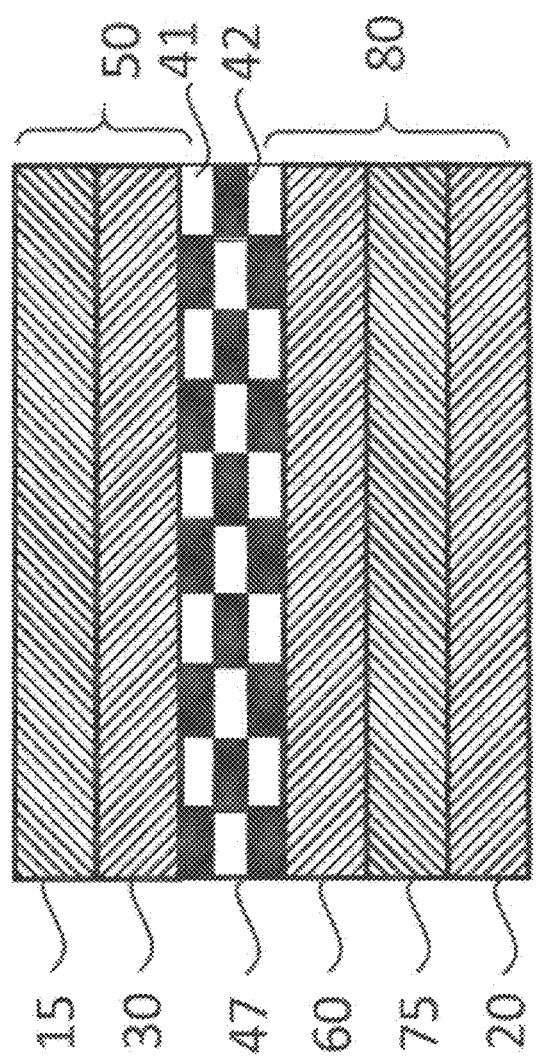

Referring to FIG. 24, a modification to FIG. 23, the porous cathode 47 can comprise a layer of mixture containing at least one conductive metal 41 and one or more alkali metal salts 42. The cathode layer 47 can be transparent with thickness between about 10 nm and 40 nm to ensure light transmission from organic layer 30 and enough pores for ions 61 within electrolyte 60 to contact with organic layer 30. The metal in cathode mixture comprises at least one metal, for example, Ag, Al, Au, and combination therefore. The alkali salt can be lithium fluoride (LiF), sodium fluoride (NaF), cesium fluoride (CsF), lithium bromide (LiBr), cesium bromide (CsBr), sodium bromide (NaBr), sodium chloride (NaCl), sodium chloride (LiI), cesium iodide (CsI), and combination therefore.

Example 1

Figure 25:
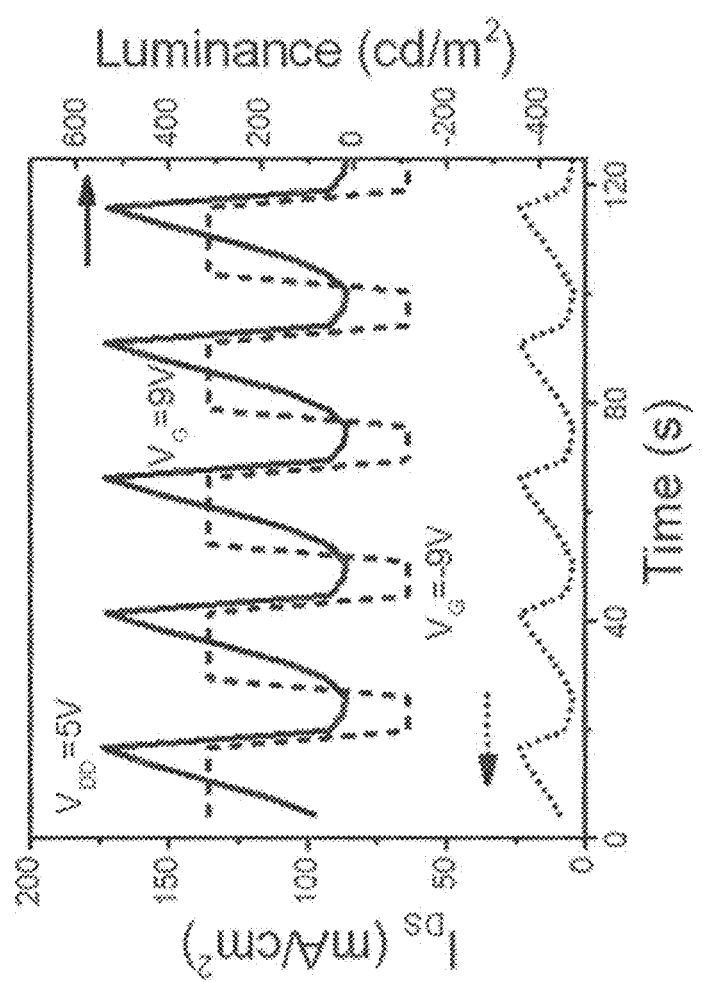
FIG. 25 illustrates a graph of a current flow and luminance of an exemplary vertical electrolyte-gated organic light-emitting transistor under rectangular gate voltage $V_G$ switching between 9V and −9V, according to some embodiments.

An example of a polymer gated organic light emitting transistor embodying the present invention was constructed in the following manner. First, the devices were fabricated on glass substrates pre-coated with indium tin oxide (ITO). The ITO substrates were exposed to ultraviolet-ozone (UVO) treatment for 20 min. A layer of conductive poly(3, 4-ethylenedioxythiophene): polystyrene sulfonate (PEDOT: PSS) was deposited onto ITO substrates via spin coating. The PEDOT:PSS coated ITO substrates were baked for 1 hr at 120° C. in air and transferred into a nitrogen-filled glove box with $O_2$ and $H_2O$ levels below 0.5 p.p.m. Then, a layer of organic light emitting polymer Super yellow (Ph-PPV, poly(para-phenylenevinylene) was spin-coated on PEDOT: PSS-coated substrates. Cathode materials were thermally evaporated at a vacuum of 4×10−6 torr. In one case, the cathode consisted of 30 nm Al to yield a porous film; in another case, the cathode consisted of a mixture of Al and LiF in a ratio of 3:1 to a thickness of 50 nm. A layer of polymer electrolyte comprising of $LiCF_3SO_3$, PEO, and PMMA with a weight ratio of 0.18/1/4 was spin coated on porous cathodes. The film was annealed at 120° C. for 30 min in nitrogen atmosphere glovebox. On top of polymer electrolyte, 100 nm Al was deposited by thermal evaporation as gate electrode. The photocurrent and current density-voltage characterizations were measured with a Keithley 4200 SCS (semiconductor characterization system), which was controlled by a LabVIEW program. A Si photodiode was used to measure the light output. All devices were evaluated with the common cathode held at ground potential. A positive potential ($V_{DS}$) was applied to the anode, and a positive or negative potential (VG) was applied to the gate electrode. The temporal response of light emission under a function of gate potential is plotted as shown in FIG. 25. The results clearly indicate that luminance is switched on and off, by applying a rectangular $V_G$ pulse between 9 V and −9 V, and

Example 2

An example of a polymer gated organic light emitting polymer transistor with bottom gated structure embodying the present invention was constructed in the following manner. First, the devices were fabricated on glass substrates pre-coated with indium tin oxide (ITO). The conductive ITO layer works as a gate electrode. A layer of polymer electrolyte comprising of lithium polystyrene sulfonate (LiPSS) was spin coated on ITO layer. The ITO substrates were annealed at 120° C. for 30 min in air. Cathode materials were thermally evaporated at a vacuum of $4 \times 10^{-6}$ torr. In one case, the cathode consisted of 30 nm Al to yield a porous film; in another case, the cathode consisted of a mixture of Al and LiF in a ratio of 3:1 to a thickness of 50 nm. Then, a layer of organic light emitting polymer Super was spin-coated on porous cathode layer; and the substrates were annealed at 120° C. for 30 min in a nitrogen-filled glove box. On top of Supper Yellow, 100 nm Al was deposited by thermal evaporation as an anode.

Example 3

Figure 26G:
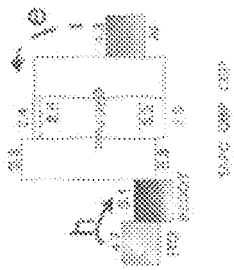
FIGS. 26D-26I illustrate the distributions of ions and band diagrams for an exemplary (VEGLET), according to some embodiments.
Figure 26H:
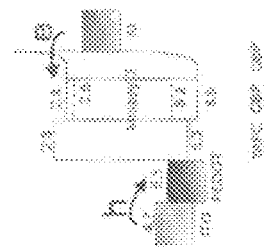
Figure 26I:
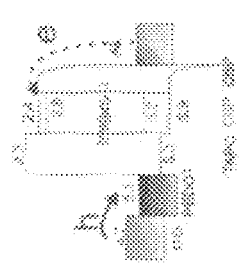
Figure 26D:
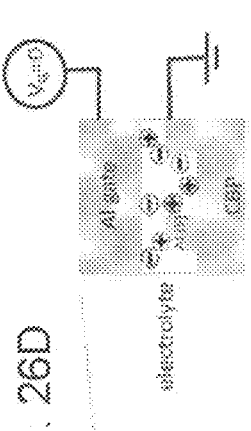
Figure 26E:
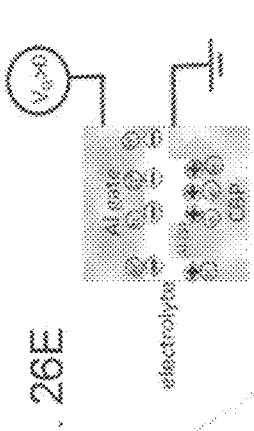
Figure 26A:
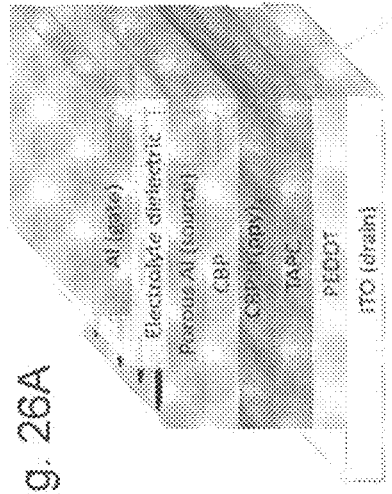
FIG. 26A illustrates a three dimension schematic of an exemplary vertical electrolyte-gated light emitting transistor, according to some embodiments.

According to some embodiments, FIG. 26A shows an exemplary vertical electrolyte-gated light emitting transistor (VEGLET). The VEGLET uses an electrolyte to modify the charge injection through a gate electrode. For example, a change in gate voltage from −6 V to 10 V can increase the device's luminance effectively from 0.1 cd/m$^2$ to around 9,500 cd/m$^2$, with the corresponding current efficiency increasing from around 0.2 cd/A to 24 cd/A.

The VEGLET device of FIG. 26A comprises two parts: an OLED with a porous cathode electrode and a gate configuration. The gate configuration can include a porous electrode, an electrolytic dielectric, and/or a gate electrode on top of the OLED. As shown in FIG. 26A, the OLED includes an ITO anode electrode (drain), a hole injection layer poly(3,4-ethylenedioxythiophene)-poly(styrene sulfonate) (PEDOT:PSS), a hole transport layer 4,4-cyclohexylidenebis[N,N-bis(4-methylphenyl)benzenamine] (TAPC), a light emission layer having a fluorescent host 4,4-bis(N-carbazolyl)-1,1-biphenyl (CBP) and a green phosphorescent guest tris[2-(p-tolyl)pyridine]iridium(III) (Ir(mppy)$^3$), an electron transport layer CBP, and a porous Al cathode electrode (source).

According to some embodiments an electrolyte solution can be spun onto an ITO substrate at 1000 rpm, and can be annealed on a hotplate at 120° C. in a nitrogen-filled glovebox for 30 min. The top Al electrode, for example, of thickness 100 nm can then be thermally evaporated.

The substrate can be an ITO (anode) coated glass, which was cleaned sequentially with a detergent, deionized water, acetone and 1-propanol, in ultrasonic bath. Then the substrate can be treated with an oxygen plasma for 30 min, before a PEDOT:PSS solution can be spun-coated at 3000 rpm, and heated in a hotplate for 20 min at 120° C. The PEDOT coated substrate can then be transported to a vacuum chamber in a nitrogen-filled glovebox. The following fabrications and characterizations can be carried in this inert atmosphere. The TAPC (60 nm) layer can be evaporated at 3 Å/s as a hole transport layer onto the PETDOT:PSS coated substrate. The CBP and Ir(mppy)3 (7%) can be co-evaporated for a total thickness of 15 nm, after another layer of CBP of 20 nm can be evaporated as an electron transport layer. After that, the Al layer (cathode) can be deposited at 5 Å/s for 25 nm.

The electrolyte solution can be spun coated onto the OLED stack at 1000 rpm. The device can then be left in vacuum for drying for 12 hours. Finally, a 100 nm Al layer can be evaporated onto the electrolyte as the gate electrode.

Figure 26F:
Figure 26B:
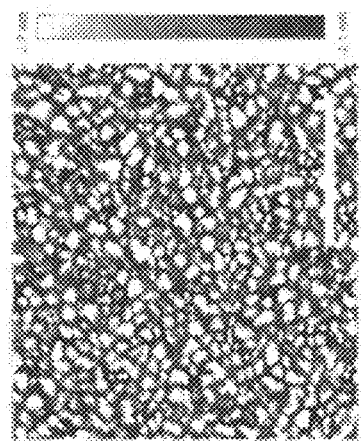
FIG. 26B illustrates an AFM image of the porous Al cathode electrode, according to some embodiments.
Figure 26C:
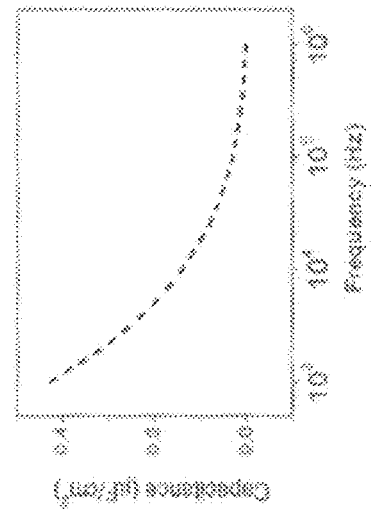
FIG. 26C illustrates the capacitance characteristics of the capacitor formed in an exemplary vertical electrolyte-gated light emitting transistor (VEGLET), according to some embodiments.

FIG. 26B shows an AFM image of the porous aluminum (Al) cathode. The electrolyte layer can be a mixture of a salt $CF_3SO_3Li$, an ion conductor poly(ethylene oxide) (PEO) and a solidifier Poly(methyl methacrylate) (PMMA) in a weight ration of 1:5:20. The capacitance value of this ionic dielectric is 0.4 μF/cm$^2$ at 1000 Hz, as shown in FIG. 26C. The top gate electrode can be an aluminum layer, for example, having thickness of a 100 nm Al.

When a voltage ($V_G$) is applied between the gate electrode and the source electrode, the electrolyte is polarized. As a result, two Helmholtz electrical double layers (EDL) with nanoscale thickness can be formed. A first EDL can be formed at the interface between the electrolyte and the Al gate layer and a second EDL can be formed at the interface between the electrolyte and the CBP layer. The second EDL would interact with the CBP layer in different ways according to the polarity of the voltage between the gate electrode and the source electrode.

When there is no voltage applied at the gate electrode ($V_G$=0), the VEGLET works as a conventional OLED with holes injecting from the ITO anode and electrodes from the Al cathode, as seen in FIGS. 26D and 26G. The hole injection barrier is negligible, as the work function of the ITO/PEDOT anode is well aligned with the highest occupied molecular orbital (HOMO) level of CBP. While the injected electrons from the unmodified Al cathode to the CBP layer sees a large energy barrier of 1.9 eV. This unbalanced hole and electron injection can result in a low luminance.

When a positive voltage is applied at the gate electrode ($V_G>0$), with regard to the source electrode, anions within the electrolyte can move towards the gate electrode and cations can migrate to the interface formed between the electrolyte and the source electrode, forming an EDL at the interface between the gate electrode and the electrolyte. Since the Al source electrode is porous, cations can go through the pores and contact the CBP layer. The high density of the ions can create a large electric field at the CBP/Al interface, facilitating the injection of electrons, as sheen in FIGS. 26E and 26H. The high density of the ions can also induce electrochemical n-doping of CBP, which can also improve the electron transport. A positive gate voltage $V_G$ can increase the luminance of the device.

When a negative voltage is applied at the gate electrode ($V_G<0$), with regard to the source electrode, anions within the electrolyte can move towards the CBP layer through the porous Al source. The accumulated holes at the CBP/Al interface can build up an electric field that impedes the electron injection, as shown in FIGS. 26F and 26I. The anions can also induce electrochemical p-doping at the CBP layer, which further helps the transport of holes. Because the electron population is so under in this case, a negative gate voltage $V_G$ can decrease or quench the luminance of the device.

Figure 27A:
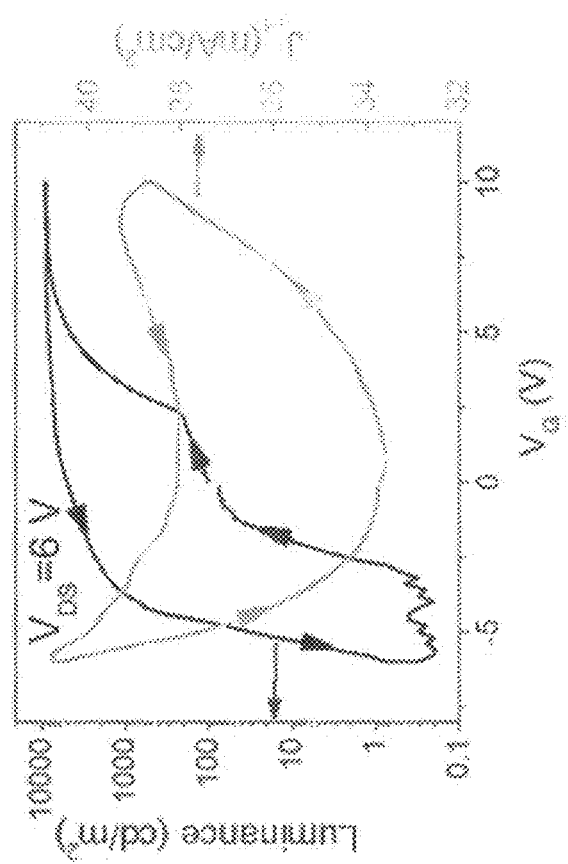
FIG. 27A illustrates a graph with the transfer and optical characteristics of an exemplary VEGLET, according to embodiments.

FIG. 27A shows the optical and electrical transfer characteristics of an exemplary VEGLET. In the measurements shown in FIG. 27A, the drain electrode to source electrode voltage was $V_{DS}=6V$ and the gate electrode to source electrode voltage ($V_{GS}$) was varied from –6V to 10V. The light emission at zero gate bias was about 100 cd/m². This low emission is due to an unbalanced charge injection, where the hole population is much higher than the electron population. When the gate bias increases from 0 V to 10 V, the light emission (luminance) can increase to around 9500 cd/m². When the gate bias decreases to –6 V the light emission decreases to 0.1 cd/m², with corresponds to a decrease of five orders of magnitude. Although the luminance changes about five orders of magnitude when the gate bias varies from 10 V to –6 V, the electric current density between drain and source only changes from 34 mA/cm² to 41 mA/cm². This can be explained because the gate potential only modulates the injection of the minority charge carriers (electrons), while the number of majority charge carriers (holes) does not change significantly. Therefore, the electric current that is mainly contributed by the majority charge carriers (holes) can remain almost unchanged. The large hysteresis shown in FIG. 27A is an indication of electrochemical doping of CBP. The current density s higher at negative gate voltages than at positive voltages, which indicates that the p-doped CBP is more conductive than a n-doped one.

Figure 27B:
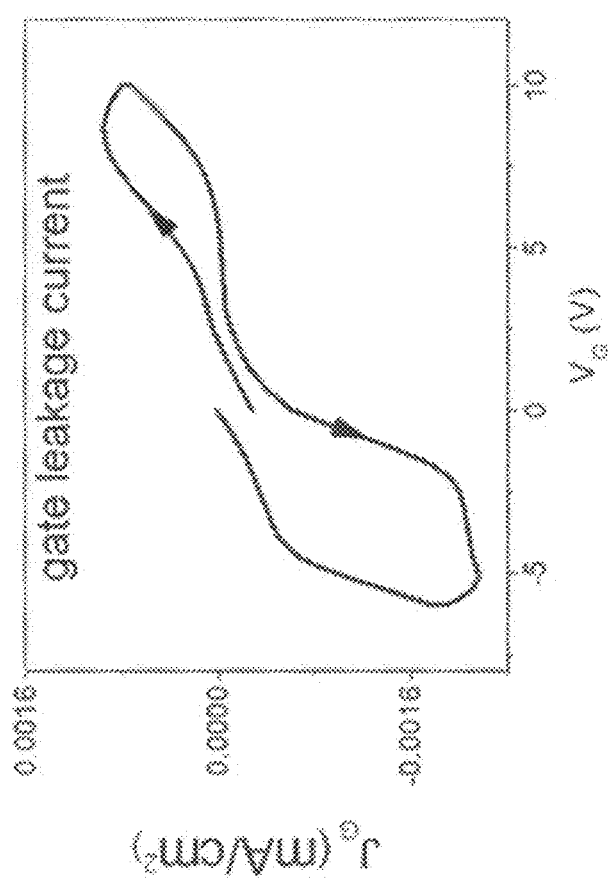
FIG. 27B illustrates a graph with the gate leakage current of an exemplary VEGLET, according to embodiments.
Figure 27C:
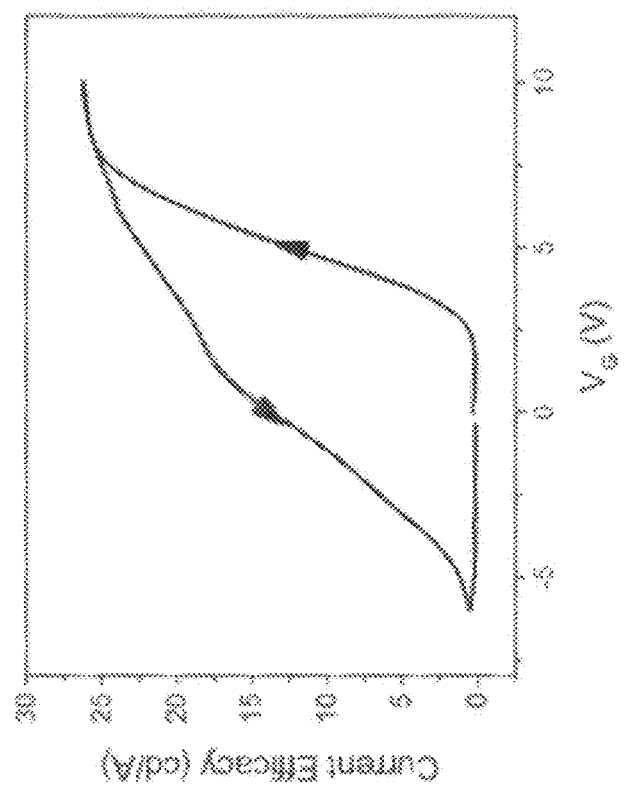
FIG. 27C illustrates a graph of the current efficacy under different gate voltage values for an exemplary VEGLET, according to embodiments.
Figure 27D:
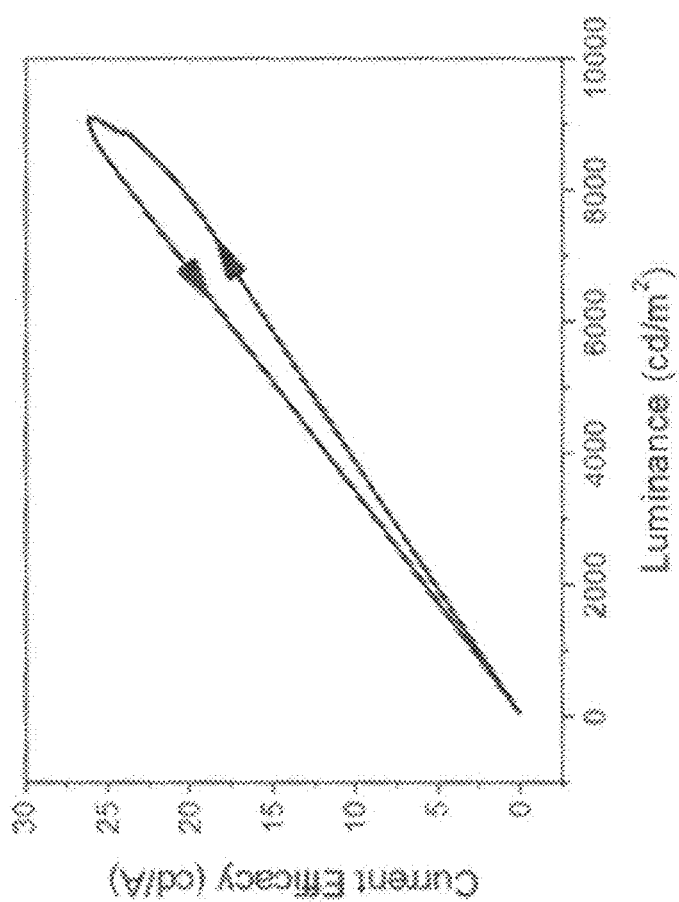
FIG. 27D illustrates a graph of the current efficacy under different luminance values for an exemplary VEGLET, according to embodiments.

FIG. 27B shows the gate leakage current with varying gate voltage. The gate leakage current can be about 1% of the drain-source current. The current efficacy, which is an indicator of the charge injection balance, is calculated and plotted at different gate voltage values at FIG. 26C. At zero gate bias, the efficacy is as low as 0.2 cd/A. This indicates that, due to insufficient electron injection, the hole current is dominating the current, and most of the holes are moving without recombining with electrons. The efficacy can gradually increase as the gate voltage increases, and peaks at around 26 cd/A, as more electrons are injected into the channel for a more balanced electrons and holes population.

In the exemplary VEGLET, the efficacy increases with increasing luminance, as shown in FIG. 26D, because of the balanced charge carrier injection.

The hysteresis in the transfer curve indicates a delay in luminance in response to the electrical current, which can be attributed to the show electrochemical nature of ionic transports. This phenomena is also observed in OLED devices with electrolyte materials. The temporal response of the VEGLET improves at elevated temperature. To improve the temporal response of the VEGLET device, an ion conductor having a glass temperature lower than the ambient temperature can be used.

Figure 28A:
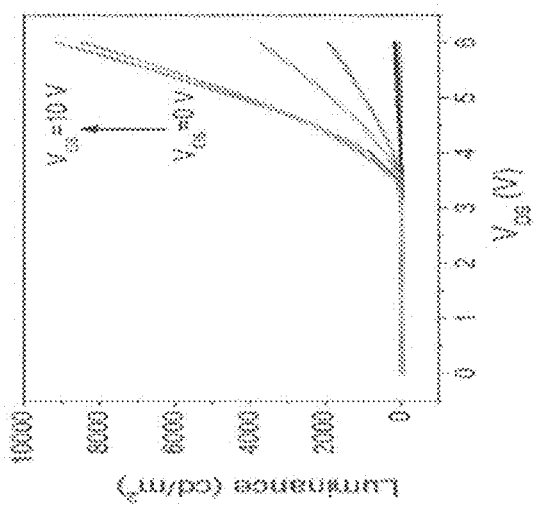
FIG. 28A illustrates a graph of the luminance under varying drain voltage values for different gate bias for an exemplary VEGLET, according to embodiments.
Figure 28B:
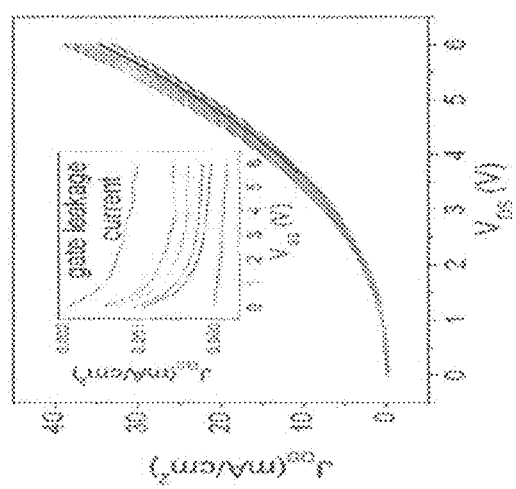
FIG. 28B illustrates a graph of the current density and the leakage current density under varying drain voltage values for different gate bias for an exemplary VEGLET, according to embodiments.

FIG. 28 shows the output characteristics of an exemplary VEGLET device. The output characteristics were measured with a drain-source voltage, $V_{DS}$, increasing from 0V to 6V at different gate voltages, $V_{GS}$, namely 0V, 2V, 4V, 6V, 8V and 10V. The optical and electrical output curves are shown in FIGS. 28A and 28B, respectively.

Figure 28C:
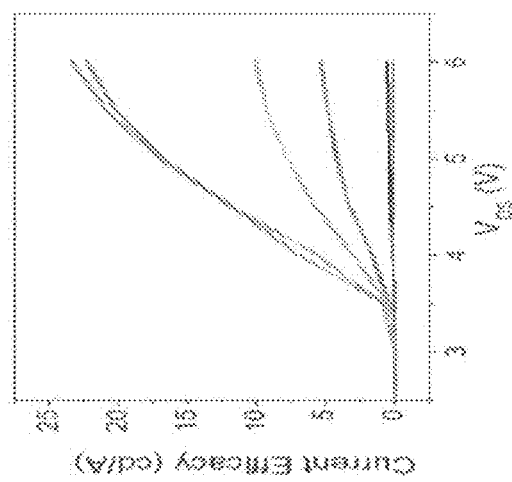
FIG. 28C illustrates a graph of the current efficacy under varying drain voltage values for different gate bias for an exemplary VEGLET, according to embodiments.

For gate voltage values less than 2V, the VEGLET turn-on voltage, e.g., the drain to source voltage when the luminance is 1 cd/m², is 3.35 V. For gate voltage values greater than 2V, the turn-on voltage drops to 3.1V. The drop in the turn-on voltage further indicates that the gate voltage modulates the injection barrier of electrons. The current density curves shown in FIG. 28B are consistent with a diode behavior. According with the transfer curve, the current level does not change much at different gate voltages. FIG. 28C shows the current efficacy of the VEGLET device at different voltage conditions. The current efficacy increases with increasing $V_{GS}$.

Figure 29A:
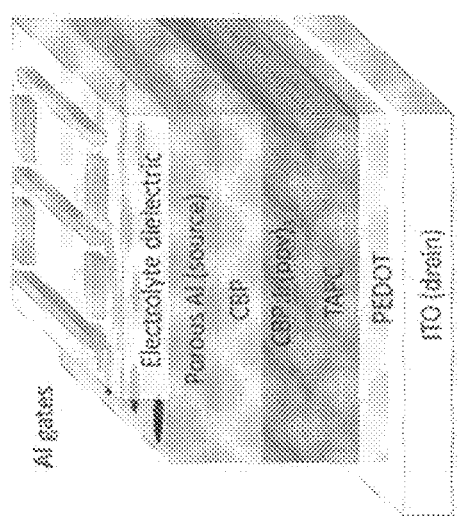
FIG. 29A illustrates a three dimension schematic of seven segment display using an exemplary VEGLET, according to some embodiments.
Figure 29B:
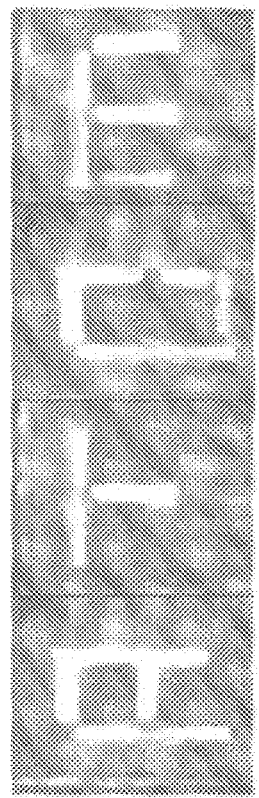
FIG. 29B illustrates a photograph of an exemplary VEGLET being selectively turned on to display the letters A, T, O, M.

FIG. 29A shows a VEGLET configured as a seven-segment display. In the display of FIG. 29A, a common source and drain are stacked, and seven gate electrodes are patterned over the stack and controlled separately. FIG. 29B shows an example of the display illuminating the show the letters "A," "T," "O," and "M."

Figure 30A:
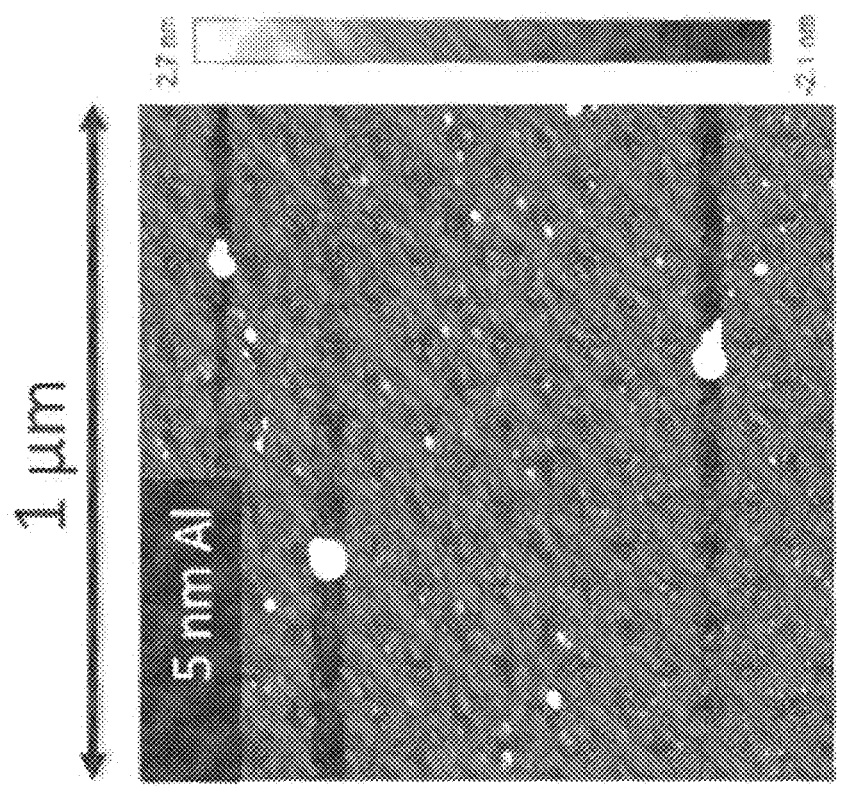
Figure 30C:
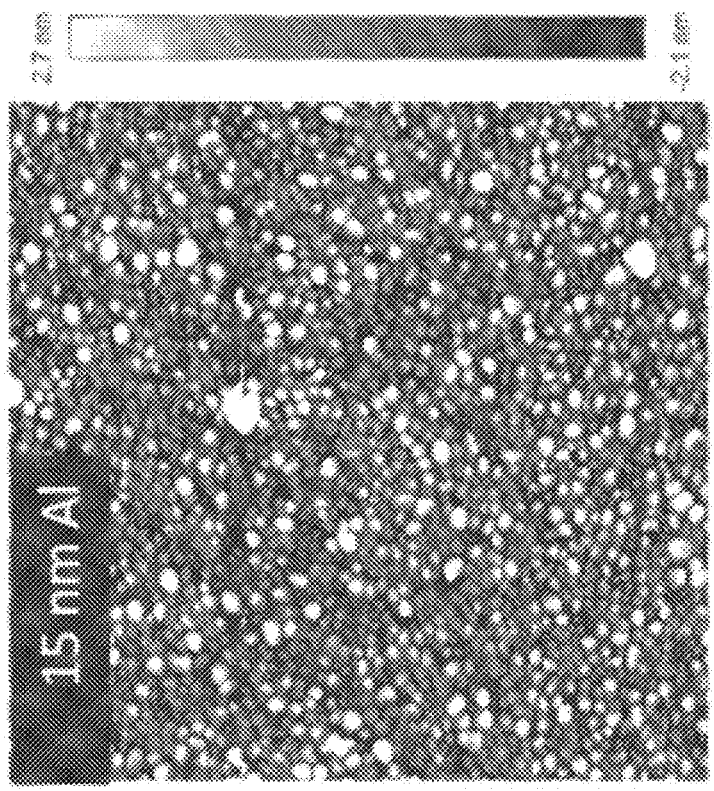
Figure 30D:
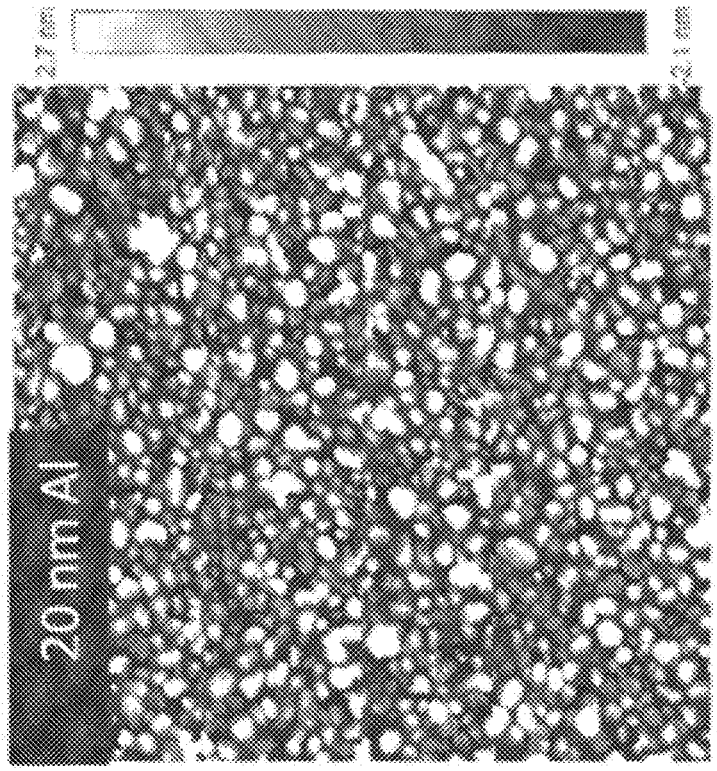
Figure 30E:
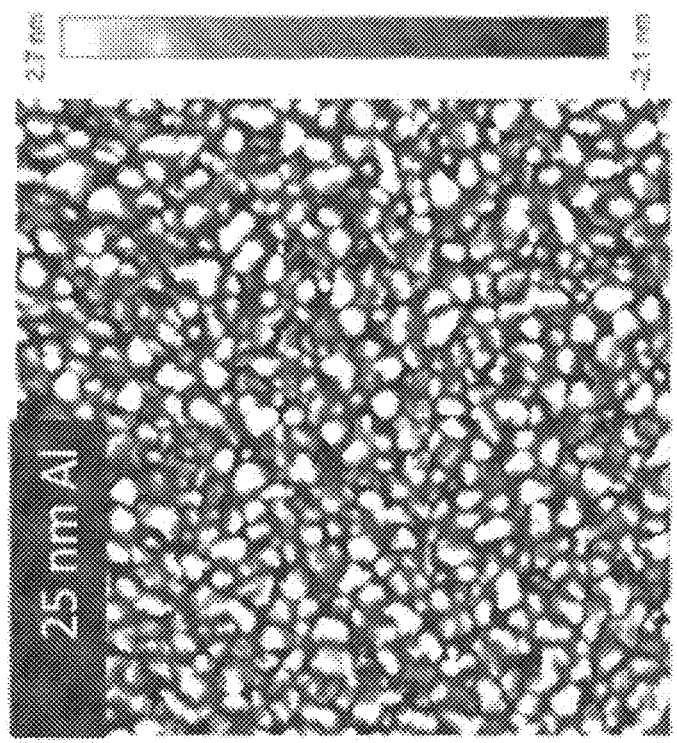
Figure 30F:
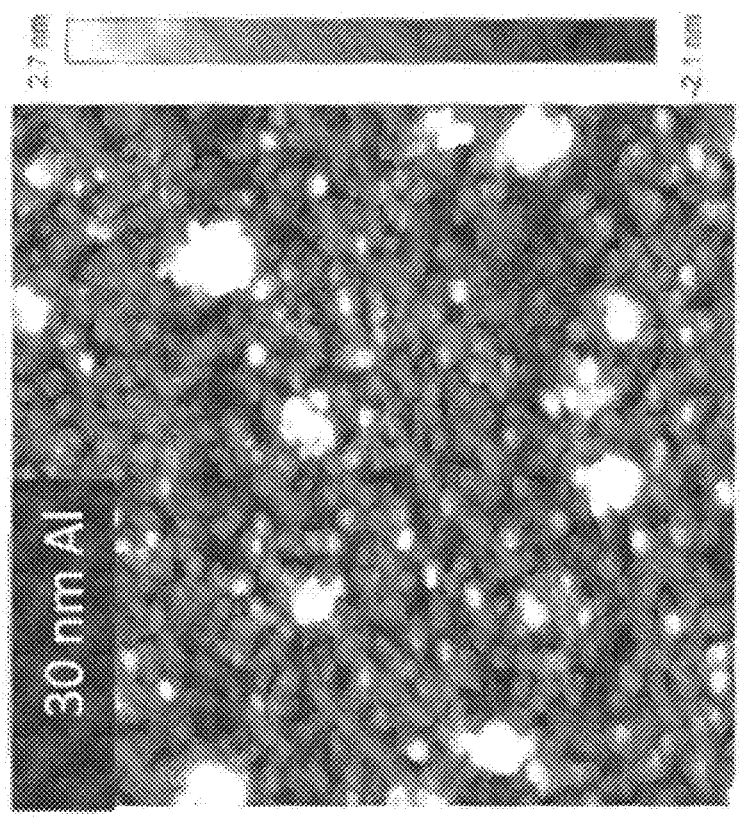

As discussed above, the VEGLET includes a porous Al layer. Formation of these porous Al layer can dependent on deposition parameters, including the deposition method and rate, substrate materials and substrate temperature. By accurately controlling these parameters, desirable properties suitable for LET applications can be obtained. FIGS. 30A-F shown AFM images of the deposited Al layer on a glass substrate with thicknesses of 5, 10, 15, 20, 25, 30 nm, respectively. In the initial states of deposition, the Al atoms begin to nucleate together, forming isolated islands on the substrate, as shown in FIG. 30A. As the film continues to grow, the islands begin to impinge and coalesce, as seen in FIGS. 30A-30D. This phenomenon can be quantified by the increasing heights of the islands in the azimuthal direction with film thicknesses up to 20 nm, in addition to a larger surface roughness. Within this range, the average island heights increases fairly linearly. However, at a thickness of a 25 nm growth Al film, the average island height is observed to decrease drastically, signifying the formation of a underlying continuous film of Al in conjunction with islands on the surface of the film. At a film thickness of 30 nm, a more continuous film begins to grow, illustrated by a ~50% reduction in surface roughness. In the fabricated VEGLET devices, Al films with thicknesses lower than 20 nm exhibit a low luminance due to the low conductivity of Al. Devices with Al thicknesses larger than 30 nm show less luminance modulation by the gate voltage as a result of low porosity of the Al film. At a thickness of approximately 25 nm a good balance exists between good modulation and sufficient electrical conductivity.

The invention claimed is:

1. A vertical light emitting transistor comprising:
an anode electrode;
an active material layer;
a porous material layer on top of the active material layer forming a cathode electrode;
a dielectric layer on top of the porous material layer;
a conductive layer on top of the dielectric layer forming a gate electrode; and
at least one light emitting enhancement layer selected from the group consisting of electron injection dipole layers, transportation dipole layers, conjugate polyelectrolyte layers, and hole injection layers,
wherein dielectric material transferred through the porous material layer causes electrochemical doping within the active material layer.

2. The vertical light emitting transistor of claim 1, wherein the light emitting enhancement layer is disposed between the anode and the active material layer.

3. The vertical light emitting transistor of claim 1, wherein the porous material layer comprises an electrode material selected from graphene sheets, doped Si, ZTO, ITO, Au, Al, Cu, Ni, Mo, Cr, Ag, metal nanowires, metal plate, metal meshes, metal grids, holey copper, holey graphene, conductive polymers, and a low coverage network of a plurality of nanowires.

4. The vertical light emitting transistor of claim 3, wherein the porous cathode has a porosity in the range of 0-80%.

5. The vertical light emitting transistor of claim 1, wherein the porous cathode further comprises an alkali metal- or alkaline earth metal-containing material.

6. The vertical light emitting transitory of claim 1, wherein the light emitting device comprises a graphene electrode disposed between a dielectric layer and an organic semiconductor layer.

7. A vertical light emitting transistor comprising:
an anode electrode;
an active material layer, wherein the active material layer is formed of a light emitting material selected from the group consisting of a crystalline semiconductor, a semiconductor nanowire, a quantum wall, an organometallic complex, a small organic conjugated molecule, porphyrin, pentacene, and a conjugated polymer;
a porous material layer on top of the active material layer forming a cathode electrode;
a dielectric layer on top of the porous material layer; and
a conductive layer on top of the dielectric layer forming a gate electrode,
wherein dielectric material transferred through the porous material layer causes electrochemical doping within the active material layer.

8. The vertical light emitting transistor of claim 7, wherein the light emitting layer is a crystalline semiconductor material selected from Si, GaN, GaP, GaAs, AlGaAs, GaAsP, AlGaInP, ZnSe, InGaN and AlN;
where the active material layer is a semiconductor nanowire the active material is selected from Si and GaAs;
where the active material layer is an organometallic complex the active material comprises an Ir organometallic complex;
where the active material layer is a small organic conjugated molecule the active material is selected from porphyrin and pentacene; and
where the active material layer is a conjugated polymer the active material is selected from PPV, PPK, EH-PPV, PPF, PFO, PPP, poly(9,9-dioctylfluorene), and PPV copolymer Super Yellow.

9. A vertical light emitting transistor comprising:
an anode electrode;
an active material layer;
a porous material layer on top of the active material layer forming a cathode electrode;
a dielectric layer on top of the porous material layer, wherein the dielectric material is selected from the group of oxides selected from $SiO_2$, $Al_2O_3$, $HfO_2$, $ZrO_2$, a nitride, $Si_3N_4$, an inorganic salts selected from LiF, CsF, $BaTiO_3$, and $SrTiO_3$, one or more a dielectric polymers selected from PMMA, Teflon, CYTOP, PEO and Nafion, and an ionic gel formed from the combination of a dielectric polymer and an ionic liquid, and wherein the dielectric layer comprises an electrolyte salt; and
a conductive layer on top of the dielectric layer forming a gate electrode,
wherein dielectric material transferred through the porous material layer causes electrochemical doping within the active material layer.

10. The vertical light emitting transistor of claim 9, wherein the electrolyte salt comprises lithium triflate.

11. A vertical light emitting transistor comprising:
an anode electrode;
an active material layer;
a porous material layer on top of the active material layer forming a cathode electrode;
a dielectric layer on top of the porous material layer, wherein the dielectric layer comprises alkali salts, ion conductor and materials solidifier; and
a conductive layer on top of the dielectric layer forming a gate electrode,
wherein dielectric material transferred through the porous material layer causes electrochemical doping within the active material layer.

12. The vertical light emitting transitory of claim 11, wherein the materials solidifier comprises PMMA.

13. A vertical light emitting device comprising:
an anode electrode;
an active material layer;
a composite material layer on top of the active material layer forming a cathode electrode;
a dielectric layer on top of the composite material layer; and
a conductive layer on top of the dielectric layer forming a gate electrode; and
at least one light emitting enhancement layer selected from the group consisting of electron injection dipole layers, transportation dipole layers, conjugate polyelectrolyte layers, and hole injection layers,
wherein a work function of the composite material is modulated to facilitate injection of electrons from the composite material layer into the active material layer in response to a voltage applied at the gate electrode.

14. The vertical light emitting device of claim 13, wherein the light emitting enhancement layer is disposed between the anode and the active material layer.

15. The vertical light emitting device of claim 13, wherein the cathode is non-porous.

16. The vertical light emitting device of claim 13, wherein the composite material layer comprises an electrode material selected from graphene sheets, doped Si, ZTO, ITO, Au, Al, Cu, Ni, Mo, Cr, Ag, metal nanowires, metal plate, metal meshes, metal grids, holey copper, holey graphene, conductive polymers, and a low coverage network of a plurality of nanowires.

17. The vertical light emitting device of claim 16, wherein the composite material layer comprises an alkali metal- or alkaline earth metal-containing material.

18. A vertical light emitting device comprising:
an anode electrode;
an active material layer wherein the active material layer is formed of a light emitting material selected from the group consisting of a crystalline semiconductor, a semiconductor nanowire, a quantum wall, an organometallic complex, a small organic conjugated molecule, porphyrin, pentacene, and a conjugated polymer; and
a composite material layer on top of the active material layer forming a cathode electrode,
wherein a work function of the composite material is modulated to facilitate injection of electrons from the composite material layer into the active material layer in response to a voltage applied at the gate electrode.

19. The vertical light emitting device of claim 18, wherein:
where the active material layer is a crystalline semiconductor the material is selected from GaN, GaP, GaAs, AlGaAs, GaAsP, AlGaInP, ZnSe, InGaN and AlN;
where the active material layer is a semiconductor nanowire the active material is selected from Si and GaAs;
where the active material layer is an organometallic complex the active material comprises an Ir organometallic complex;
where the active material layer is a small organic conjugated molecule the active material is selected from porphyrin and pentacene; and
where the active material layer is a conjugated polymer the active material is selected from PPV, PPK, EH-PPV, PPF, PFO, PPP, and PPV copolymer Super Yellow.

20. A vertical light emitting device comprising:
an anode electrode;
an active material layer;
a composite material layer on top of the active material layer forming a cathode electrode;
a dielectric layer on top of the composite material layer, wherein the dielectric material is selected from the group of oxides selected from $SiO_2$, $Al_2O_3$, $HfO_2$, $ZrO_2$, a nitride, $Si_3N_4$, an inorganic salts selected from LiF, CsF, $BaTiO_3$, and $SrTiO_3$, one or more a dielectric polymers selected from PMMA, Teflon, CYTOP, PEO and Nafion, and an ionic gel formed from the combination of a dielectric polymer and an ionic liquid, and wherein the dielectric layer further comprises an electrolyte salt; and
a conductive layer on top of the dielectric layer forming a gate electrode,
wherein a work function of the composite material is modulated to facilitate injection of electrons from the composite material layer into the active material layer in response to a voltage applied at the gate electrode.

21. The vertical light emitting device of claim 20, wherein the electrolyte salt comprises lithium triflate.

22. A vertical light emitting device comprising:
an anode electrode;
an active material layer;
a composite material layer on top of the active material layer forming a cathode electrode;
a dielectric layer on top of the composite material layer, wherein the dielectric layer comprises alkali salts, ion conductor and materials solidifier; and
a conductive layer on top of the dielectric layer forming a gate electrode,
wherein a work function of the composite material is modulated to facilitate injection of electrons from the composite material layer into the active material layer in response to a voltage applied at the gate electrode.

23. The vertical light emitting device of claim 22, wherein the materials solidifier comprises PMMA.

24. A vertical light emitting transistor, comprising:
a light emitting cell comprised of a light emitting layer formed of at least one light emitting material, the light emitting layer having first and second sides in conductive relation to a conductive drain electrode and a conductive source electrode;
at least one capacitor comprised of a dielectric layer formed of at least one dielectric material, the al least one dielectric layer having first and second sides in conductive relation to one of either the conductive source or drain electrodes, and a conductive gate electrode;
at least one substrate in supportive relation with each of said drain and gate electrodes; and
at least one light emitting enhancement layer selected from the group consisting of electron injection dipole layers, transportation dipole layers, conjugate polyelectrolyte layers, and hole injection layers,
wherein the drain and source electrodes are the cathode and anode of the light emitting cell; and wherein at least one of the following:
wherein at least the electrode disposed between the light emitting layer and the dielectric layer is a conductive porous electrode has sufficient open portions to exhibit a surface coverage of no greater than 50%, such that the dielectric layer makes direct contact with the light emitting layer through the open portions of the conductive porous electrode, and wherein the light emitting cell and the capacitor are positioned and arranged to provide an electrochemical transistor; and
wherein at least the electrode disposed between the light emitting layer and the dielectric layer is a conductive composite material.

25. A light emitting display comprising:
a plurality of light emitting transistors, each transistor comprising:
an anode electrode;
an active material layer;
a dielectric layer;
a conductive layer on top of the dielectric layer forming a gate electrode; and
at least one light emitting enhancement layer selected from the group consisting of electron injection dipole layers, transportation dipole layers, conjugate polyelectrolyte layers, and hole injection layers,
wherein at least one of the active material layer and the gate electrode of the light emitting transistors is patterned to form the light emitting transistors, and
wherein a work function of the composite material is modulated to facilitate injection of electrons from the composite material layer into the active material layer in response to a voltage applied at the gate electrode; and
further comprising one of the following
a porous material layer on top of the active material layer forming a cathode electrode, wherein the dielectric material is disposed on top of the porous material layer and wherein the dielectric material transferred through the porous material layer causes electrochemical doping within the active material layer; and a hole-injecting layer on top of the anode electrode, wherein the active layer is disposed atop the hole-injecting layer, and a composite material layer disposed on top of the active material layer forming a cathode electrode, wherein the dielectric layer is disposed on top of the composite material layer.

* * * * *